(12) United States Patent
Tsuchi et al.

(10) Patent No.: US 7,750,900 B2
(45) Date of Patent: Jul. 6, 2010

(54) DIGITAL-TO-ANALOG CONVERTING CIRCUIT AND DISPLAY DEVICE USING SAME

(75) Inventors: Hiroshi Tsuchi, Tokyo (JP); Junichirou Ishii, Tokyo (JP)

(73) Assignee: NEC Corporation, Tokyo (JP)

( * ) Notice: Subject to any disclaimer, the term of this patent is extended or adjusted under 35 U.S.C. 154(b) by 1139 days.

(21) Appl. No.: 11/387,917

(22) Filed: Mar. 24, 2006

(65) Prior Publication Data

US 2006/0214900 A1    Sep. 28, 2006

(30) Foreign Application Priority Data

Mar. 25, 2005    (JP)    ............... 2005-089455

(51) Int. Cl.
*G06F 3/038* (2006.01)
(52) U.S. Cl. .................. 345/210; 345/204; 345/690
(58) Field of Classification Search ........... 345/55–100, 345/204–214, 690–697
See application file for complete search history.

(56) References Cited

U.S. PATENT DOCUMENTS

| 6,046,719 | A | * | 4/2000 | Dingwall | ............. | 345/100 |
| 6,160,533 | A | * | 12/2000 | Tamai et al. | ............. | 345/89 |
| 6,246,451 | B1 | | 6/2001 | Matsumura et al. | | |
| 7,006,114 | B2 | * | 2/2006 | Sakaguchi | ............. | 345/690 |
| 7,079,127 | B2 | * | 7/2006 | Morita | ............. | 345/212 |

2002/0126112 A1 *  9/2002  Kato  .................... 345/204

FOREIGN PATENT DOCUMENTS

JP    59-154820 A    9/1984

OTHER PUBLICATIONS

Kindai Kagakusha, "Ultra LSI Introduction Series 5; Foundations of MOS Integrated Circuits," pp. 157-167, Jun. 1992.
Richard I. McCartney, et al. "60.1: Distinguished Paper: A Third Generation Timing Controller and Column Driver Architecture Using Point-To-Point Differential Signaling," SID 04 Digest, 2004, pp. 1556-1559.

* cited by examiner

*Primary Examiner*—David L Lewis
(74) *Attorney, Agent, or Firm*—Sughrue Mion, PLLC

(57) ABSTRACT

A digital-to-analog converter of reduced number of elements and smaller area includes a reference voltage generating circuit for outputting a plurality of reference voltages having voltage values that differ from one another; a first logic circuit for outputting the result of a logical operation on a first bit group comprising even-numbered bits (or odd-numbered bits) of an input digital data signal composed of a plurality of bits; a second logic circuit for outputting the result of a logical operation on a second bit group comprising the odd-numbered bits (or even-numbered bits) of the input digital data signal composed of the plurality of bits; a switch group circuit for supplying first and second terminals with voltages selected, inclusive of voltages that are identical, from among the plurality of reference voltages, which are output from the reference voltage generating circuit, in accordance with respective outputs from the first and second logic circuits; and an amplifier circuit for outputting an output voltage that is the result of applying a predetermined operation to voltages supplied to the first and second terminals.

21 Claims, 41 Drawing Sheets

FIG. 3A

| LEVEL | REFERENCE VOLTAGE | V(T1) | V(T2) | B2 AND B1 |
|---|---|---|---|---|
| 1 | V1 | V1 | V1 | 0,0 |
| 2 |  | V1 | V4 | 0,1 |
| 3 | V4 | V4 | V1 | 1,0 |
| 4 |  | V4 | V4 | 1,1 |

FIG. 3B

| LEVEL | REFERENCE VOLTAGE | V(T1) | V(T2) | B4, B3, B2 AND B1 |
|---|---|---|---|---|
| 1 | V01 | V01 | V01 | 0,0,0,0 |
| 2 |  | V01 | V04 | 0,0,0,1 |
| 3 | V04 | V04 | V01 | 0,0,1,0 |
| 4 |  | V04 | V04 | 0,0,1,1 |
| 5 |  | V01 | V13 | 0,1,0,0 |
| 6 |  | V01 | V16 | 0,1,0,1 |
| 7 |  | V04 | V13 | 0,1,1,0 |
| 8 |  | V04 | V16 | 0,1,1,1 |
| 9 | V13 | V13 | V01 | 1,0,0,0 |
| 10 |  | V13 | V04 | 1,0,0,1 |
| 11 | V16 | V16 | V01 | 1,0,1,0 |
| 12 |  | V16 | V04 | 1,0,1,1 |
| 13 |  | V13 | V13 | 1,1,0,0 |
| 14 |  | V13 | V16 | 1,1,0,1 |
| 15 |  | V16 | V13 | 1,1,1,0 |
| 16 |  | V16 | V16 | 1,1,1,1 |

FIG. 4A

| LEVEL | REFERENCE VOLTAGE | V(T1) | V(T2) | B2 AND B1 |
|---|---|---|---|---|
| 1 |  | V2 | V3 | 0,0 |
| 2 | V2 | V2 | V2 | 0,1 |
| 3 | V3 | V3 | V3 | 1,0 |
| 4 |  | V3 | V2 | 1,1 |

FIG. 4B

| LEVEL | REFERENCE VOLTAGE | V(T1) | V(T2) | B4, B3, B2 AND B1 |
|---|---|---|---|---|
| 1 |  | V06 | V11 | 0,0,0,0 |
| 2 |  | V06 | V10 | 0,0,0,1 |
| 3 |  | V07 | V11 | 0,0,1,0 |
| 4 |  | V07 | V10 | 0,0,1,1 |
| 5 |  | V06 | V7 | 0,1,0,0 |
| 6 | V06 | V06 | V06 | 0,1,0,1 |
| 7 | V07 | V07 | V07 | 0,1,1,0 |
| 8 |  | V07 | V06 | 0,1,1,1 |
| 9 |  | V10 | V11 | 1,0,0,0 |
| 10 | V10 | V10 | V10 | 1,0,0,1 |
| 11 | V11 | V11 | V11 | 1,0,1,0 |
| 12 |  | V11 | V10 | 1,0,1,1 |
| 13 |  | V10 | V07 | 1,1,0,0 |
| 14 |  | V10 | V06 | 1,1,0,1 |
| 15 |  | V11 | V07 | 1,1,1,0 |
| 16 |  | V11 | V06 | 1,1,1,1 |

FIG. 5

| V(T1) | V(T2) | BIT DATA (BX) | | | |
|---|---|---|---|---|---|
| | | 4 | 3 | 2 | 1 |
| V01 | V01 | 0 | 0 | 0 | 1 |
| V04 | V04 | 0 | 0 | 1 | 0 |
| V013 | V013 | 1 | 1 | 0 | 1 |
| V016 | V016 | 1 | 1 | 1 | 0 |
| | V016 | | 1 | 1 | 1 |

FIG. 6

| V(T1) | V(T2) | BIT DATA (BX) | | | |
|---|---|---|---|---|---|
| | | 4 | 3 | 2 | 1 |
| V06 | V06 | 0 | 1 | 0 | 1 |
| V07 | V07 | 0 | 1 | 1 | 1 |
| V10 | V10 | 1 | 0 | 0 | 0 |
| V11 | V11 | 1 | 0 | 1 | 1 |
| | V11 | | 0 | 1 | 0 |

| V(T1) | V(T2) | \multicolumn{8}{c}{BIT DATA (BX)} |
|---|---|---|---|---|---|---|---|---|---|
| | | 8 | 7 | 6 | 5 | 4 | 3 | 2 | 1 |
| V001 | V001 | 0 | 0 | 0 | 0 | 0 | 0 | 0 | 1 |
| V004 | V004 | 0 | 0 | 0 | 0 | 0 | 0 | 1 | 0 |
| V013 | V013 | 0 | 0 | 0 | 0 | 0 | 1 | 0 | 1 |
| V016 | V016 | 0 | 0 | 0 | 0 | 1 | 1 | 0 | 0 |
| V049 | V049 | 0 | 0 | 0 | 1 | 1 | 1 | 0 | 1 |
| V052 | V052 | 0 | 0 | 1 | 1 | 0 | 0 | 1 | 0 |
| V061 | V061 | 0 | 0 | 1 | 1 | 1 | 0 | 0 | 1 |
| V064 | V064 | 0 | 0 | 1 | 1 | 1 | 1 | 1 | 0 |
| V193 | V193 | 1 | 1 | 0 | 0 | 0 | 0 | 0 | 1 |
| V196 | V196 | 1 | 1 | 0 | 0 | 0 | 1 | 0 | 0 |
| V205 | V205 | 1 | 1 | 0 | 0 | 1 | 0 | 1 | 1 |
| V208 | V208 | 1 | 1 | 0 | 0 | 1 | 1 | 0 | 0 |
| V241 | V241 | 1 | 1 | 1 | 1 | 0 | 1 | 0 | 1 |
| V244 | V244 | 1 | 1 | 1 | 1 | 0 | 1 | 1 | 0 |
| V253 | V253 | 1 | 1 | 1 | 1 | 1 | 1 | 0 | 1 |
| V256 | V256 | 1 | 1 | 1 | 1 | 1 | 1 | 1 | 1 |

FIG. 23

| V(T1) | V(T2) | \multicolumn{8}{c}{BIT DATA (BX)} |
|---|---|---|---|---|---|---|---|---|---|
| | | 8 | 7 | 6 | 5 | 4 | 3 | 2 | 1 |
| V086 | V086 | 0 | 1 | 0 | 1 | 0 | 1 | 0 | 1 |
| V087 | V087 | 0 | 1 | 0 | 1 | 0 | 1 | 1 | 0 |
| V090 | V090 | 0 | 1 | 0 | 1 | 1 | 0 | 1 | 0 |
| V091 | V091 | 0 | 1 | 0 | 1 | 1 | 0 | 0 | 1 |
| V102 | V102 | 0 | 1 | 1 | 0 | 1 | 0 | 1 | 0 |
| V103 | V103 | 0 | 1 | 1 | 0 | 1 | 0 | 0 | 1 |
| V106 | V106 | 0 | 1 | 1 | 0 | 0 | 1 | 1 | 0 |
| V107 | V107 | 0 | 1 | 1 | 0 | 0 | 1 | 0 | 1 |
| V150 | V150 | 1 | 0 | 0 | 1 | 0 | 1 | 1 | 0 |
| V151 | V151 | 1 | 0 | 0 | 1 | 0 | 1 | 0 | 1 |
| V154 | V154 | 1 | 0 | 0 | 1 | 1 | 0 | 1 | 0 |
| V155 | V155 | 1 | 0 | 0 | 1 | 1 | 0 | 0 | 1 |
| V166 | V166 | 1 | 0 | 1 | 0 | 0 | 1 | 1 | 0 |
| V167 | V167 | 1 | 0 | 1 | 0 | 0 | 1 | 0 | 1 |
| V170 | V170 | 1 | 0 | 1 | 0 | 1 | 0 | 1 | 0 |
| V171 | V171 | 1 | 0 | 1 | 0 | 1 | 0 | 0 | 1 |

US 7,750,900 B2

DIGITAL-TO-ANALOG CONVERTING CIRCUIT AND DISPLAY DEVICE USING SAME

FIELD OF THE INVENTION

This invention relates to a digital-to-analog converting circuit and to a display device that employs this circuit.

BACKGROUND OF THE INVENTION

Liquid crystal display devices (LCDs) characterized by their thin design, light weight and low power consumption have come into widespread use in recent years and are utilized in the display units of mobile devices such as portable telephones (mobile telephones or cellular telephones), PDAs (Personal Digital Assistants) and laptop personal computers. Recently, however, liquid crystal display devices have come to be provided with large-size screens and techniques for dealing with moving pictures have become more advanced, thus making it possible to realize not only mobile applications but also stay-at-home large-screen display devices and large-screen liquid crystal televisions. Liquid crystal display devices that adopts an active matrix drive system and are capable of presenting a high-definition display are being utilized as these liquid crystal displays devices. The typical structure of an active-matrix liquid crystal display device will be described with reference to FIG. 37. The principal components connected to one pixel of a liquid crystal display unit are illustrated schematically by equivalent circuits in FIG. 37.

In general, a display unit 960 of an active-matrix liquid crystal display device comprises a semiconductor substrate on which transparent pixel electrodes 964 and thin-film transistors (TFTs) 963 are laid out in the form of a matrix (e.g., 1280×3 pixel columns×1024 pixels rows in the case of a color SXGA panel); an opposing substrate on the entire surface of which a single transparent electrode 966 is formed; and a liquid crystal material sealed between these two substrates arranged to oppose each other.

The TFT 963, which has a switching function, is turned on and off under the control of a scanning signal. When the TFT 963 is on, a grayscale signal voltage that corresponds to a video data signal is applied to the pixel electrode 964, and the transmittance of the liquid crystal changes owing to a potential difference between each pixel electrode 964 and opposing-substrate electrode 966. This potential difference is held by capacitance 965 of the liquid crystal even after the TFT 963 is turned off, as a result of which an image is displayed.

A data line 962 that sends a plurality of level voltages (grayscale signal voltages) applied to each pixel electrode 964 and a scan line 961 that sends the scanning signal are wired on the semiconductor substrate in the form of a grid (the data lines are 1280×3 in number and the scan lines are 1024 in number in the case of the above-mentioned color SXGA panel). The scan line 961 and data line 962 constitute a large capacitative load owing to the capacitance produced at the intersection of these lines and capacitance, etc., of the liquid crystal sandwiched between the opposing-substrate electrodes.

It should be noted that the scanning signal is supplied to the scan line 961 by a gate driver 970, and that the supply of grayscale signal voltage to each pixel electrode 964 is performed by a data driver 980 via the data line 962. Further, the gate driver 970 and data driver 980 are controlled by a display controller 950, a required clock CLK, control signals and power-supply voltage, etc., are supplied from the display controller 950, and video data is supplied from the display controller 950 to the data driver 980. At the present time, video is principally digital data.

Rewriting of one screen of data is carried out over one frame (1/60 of a second), data is selected sequentially every pixel row (every line) by each scan line, and a grayscale signal voltage is supplied from each data line within the selection interval.

Although the gate driver 970 need only supply at least a bi-level scanning signal, it is required that the data driver 980 drive the data lines by grayscale signal voltages of multiple levels that conform to the number of gray levels. To this end, the data driver 980 has a digital-to-analog converter (DAC) comprising a decoder for converting video data to a grayscale signal voltage and an operational amplifier for amplifying the grayscale signal voltage and outputting the amplified signal to the data line 962.

With the progress that has been made in raising image quality (increasing the number of colors) in liquid crystal display devices, there is now growing demand for at least 260,000 colors (video data of six bits per each of the colors R, G, B) and preferably 26,800,000 colors (video data of six bits per each of the colors R, G, B) or more. For this reason, a data driver that outputs a grayscale signal voltage corresponding to multiple-bit video data is such that the circuitry of the DAC is of larger scale. This increases the chip area of the data-driver LSI chip and invites an increase in cost. This problem will be elaborated below.

FIGS. 38A and 38B are diagrams illustrating an example of the structure of a conventional DAC used broadly and generally in liquid crystal display devices. FIG. 38A is a diagram illustrating the structure of a resistor-string DAC having an 8-bit input. The DAC includes a grayscale voltage generating circuit 811, a selector 812, a logic circuit 813 and an amplifier 815. The grayscale voltage generating circuit 811 outputs 256 grayscale voltages, which correspond to 8-bit data, from taps at each of the connection nodes of the resistor string across the ends of which a voltage is applied. The selector 812, which has switches, selects one grayscale voltage from among the 256 grayscale voltages. The amplifier 815 amplifies and outputs the grayscale voltage selected by the selector 812. The logic circuit 813 controls the switches of the selector 812 based upon 8-bit digital data input thereto.

FIG. 38B is a diagram illustrating the arrangement of a switch 812A (a switch comprising a P-channel transistor) of the selector 812 in FIG. 38A and a logic circuit 813A that controls the switch 812A. The logic circuit 813A can be implemented simply by an 8-input NAND gate to which the input is 8-bit digital data (B1, B2, B3, B4, B5, B6, B7 and B8) (inclusive of the bit complementary signals).

With the implementation shown in FIGS. 38A and 38B, 256 grayscale voltages produced by the grayscale voltage generating circuit 811 can be designed in conformity with the liquid-crystal gamma characteristic (the characteristic of liquid-crystal transmittance vs. applied voltage). Accordingly, the feature of this arrangement is that a high-quality display is possible.

If the number of gray levels increases, however, a problem that arises is an increase in the scale of the circuitry. Implementations shown in FIGS. 39 and 40 are known as methods of reducing area in an effort to solve this problem.

FIG. 39 illustrates an example of the structure of an 8-bit DAC obtained by combining a resistor-string DAC and a capacitor-array DAC. The side that is the resistor-string DAC comprises a reference voltage generating circuit 821, a selector 824 and a logic circuit 823 and operates based upon higher-order 4-bit data (B8, B7, B6 and B5) of 8-bit data (B8, B7, B6, B5, B4, B3, B2 and B1). The reference voltage generating circuit 821 outputs 17 reference voltages $V_1$ to $V_{17}$, switches Sna and Snb (where n is any number from 1 to 16) are selected by the selector 824, and reference voltages $V_n$ and $V_{n+1}$ of mutually adjacent levels are output to terminals Na and Nb, respectively. The logic circuit 823 controls the switches of the selector 824 based upon the higher-order 4-bit data (B8, B7, B6 and B5).

The side that is the capacitor-array DAC comprises capacitance elements 835 to 839, switches 825 to 829, a logic circuit 822 and an amplifier 830 and operates based upon the lower-order 4-bit data (B4, B3, B2 and B1). Specifically, in terms of operation, first the switch 825 is turned on, changeover switches 826 to 829 are connected to the terminal Na, the voltage Vn at terminal Na is supplied to terminal Nc, and the voltages across the terminals of each of capacitance elements 835 to 839 are reset to zero. If switch 825 is thenceforth turned off and changeover switches 826 to 829 are connected to either one of terminals Na, Nb in accordance with the lower-order 4-bit data (B4, B3, B2 and B1), redistribution of electric charge occurs at terminal Nc, the potential at terminal Nc attains a prescribed voltage level that is the result of dividing voltages Vn and Vn+1 equally by 16, and this voltage is amplified and output by the amplifier 830. Accordingly, the DAC of FIG. 39 is capable of selecting a grayscale voltage of any of 256 gray levels by higher-order 4-bit data and lower-order 4-bit data.

The DAC of FIG. 39 is such that the number of voltages generated by the resistor string is $\frac{1}{16}$ of the number in FIG. 38 and therefore the scale of the circuitry of the switches that select these signals and of the logic circuit 823 is reduced greatly in comparison with the implementation of FIG. 38. Further, the side of the capacitor-array DAC also can be realized with a comparatively diminished area. As a result, a feature of this DAC is that the overall DAC can be reduced greatly in terms of scale of the circuitry in comparison with the implementation of FIG. 38.

The method used in the arrangement of FIG. 39 is such that the reference voltages $V_n$ and $V_{n+1}$ are sampled in parallel by the capacitor-array section in accordance with the digital data, and the grayscale voltages are obtained by the charge redistribution. On the other hand, a method of sampling reference voltages and obtaining grayscale voltages in a time serial is known. FIG. 40 is a diagram illustrating an example of the conventional structure of such a serial DAC.

The DAC shown in FIG. 40 includes two capacitors 844 and 845 each having one end connected to a ground (GND) terminal, the other ends being connected to terminals Nd and Ne, respectively; a changeover switch 841 for switchingly connecting the terminal Nd to either the GND terminal or supply terminal supplying a reference voltage VR; a switch 842 connected between the terminals Nd and Ne; a switch 843 connected between the terminal Ne and the GND terminal; and a voltage-follower circuit 846 comprising a differential amplifier having a non-inverting input terminal (+) connected to the terminal Ne and an inverting terminal (−) connected to an output terminal.

The operation of the circuit of FIG. 40 will now be described. Initially the switch 843 is turned on temporarily and the potential difference (terminal voltage) across the capacitor 845 is reset to zero.

Next, in accordance with the value of least-significant-bit data B1, either the reference voltage VR or ground GND is sampled at the terminal Nd by the changeover switch 841, after which the switch 841 is placed in the disconnected (open) state. The switch 842 is then turned on, charge redistribution occurs between the capacitors 844 and 845, the switch 842 is turned off and the charge is held in the capacitor 845.

Sampling is then performed by the switch 841 in accordance with the next bit of data B2, charge distribution occurs between the capacitors 844 and 845 owing to the switch 842 and the redistributed charge is thenceforth held in the capacitor 845.

Sample-and-hold is repeated in similar fashion in order from lower-order to higher-order bit data.

In case of K-bit data, one cycle of sample-and-hold is performed repeatedly K times. The voltage at terminal Ne at such time is as follows:

$$V_K = (2^{-1} \cdot B_K + 2^{-2} \cdot B_{K-1} + \ldots + 2^{-K} \cdot B_1) \cdot VR$$

where $B_K, B_{K-1}, \ldots, B_1$ is 0 or 1. This voltage is amplified and output by the voltage-follower circuit 846.

As a result, the DAC of FIG. 40 is capable of outputting each of the voltage levels obtained by equally dividing the voltage across the reference voltage VR and ground GND into $2^K$ voltage levels, in accordance with K-bit data.

Since the structure of the DAC shown in FIG. 40 is not dependent upon the number of data bits, a feature of the DAC is that the scale of the circuitry can be made very small irrespective of an increase in number of bits.

However, the output voltages of the DAC shown in FIG. 40 are linear outputs in which there are equal intervals between the voltage levels. With such an arrangement as it stands, grayscale voltages conforming to the gamma characteristic of liquid crystal cannot be produced.

Non-Patent Reference 2 proposes a method of constructing a DAC that makes possible linear outputs the number of which is several times the number of grayscale voltages necessary for output, and allocating grayscale voltages, which conform to the gamma characteristic of liquid crystal, from among these multiple linear output levels.

This method increases by two to three bits the number of bits that correspond to the number of grayscale voltages that are actually output. This means that the DAC of FIG. 40, which is independent of the number of bits, is ideal.

FIG. 41 is a serial DAC the structure of which raises the accuracy of the structure shown in FIG. 40. This DAC has a function that compensates for offset of the voltage-follower circuit.

The DAC shown in FIG. 41 includes a differential amplifier 856 having a non-inverting input terminal (+) to which a reference voltage Vref is applied and an inverting input terminal (−) to which the terminal Nf is connected; two capacitors 854 and 855, each having one end connected to terminal Nf, the other ends being connected to terminals Ng, Nh, respectively; a switch 851 connected to the terminal Ng for selecting either a supply terminal of reference voltage VI or a supply terminal of reference voltage VR; a switch 852 connected between the terminals Ng and Nh; a switch 853 connected between the supply terminal of reference voltage VI and terminal Nh; a switch 857 connected between the output terminal of a differential amplifier 856 and terminal Nf; and a switch 858 connected between the output terminal of the differential amplifier 856 and terminal Nh. Capacitance values Cs and Ch of the capacitors 854 and 855 usually are set to be equal, i.e., Cs=Ch.

The operation of the circuit of FIG. 41 will now be described. Initially the switches 857 and 858 are turned on and off, respectively. If the differential amplifier 856 has an offset Δ, then voltage VNf at terminal Nf is made VNf=Vref+Δ.

Next, the switch 853 is turned on temporarily and the potential at terminal Nh is reset to the reference voltage VI.

In accordance with the value of least-significant-bit data B1, either the reference voltage VR or reference voltage VI is sampled at the terminal Nd by the switch 851, after which the switch 851 is placed in the disconnected state.

The switch 852 is then turned on, charge redistribution occurs between the capacitors 854 and 855, the switch 852 is turned off and the redistributed charge is held in the capacitor 855.

Sample-and-hold is repeated in similar fashion in order from lower-order to higher-order bit data. In case of K-bit data, one cycle of sample-and-hold is performed repeatedly K times. The voltage at terminal Nh at such time is as follows:

$$V_K = (2^{-1} \cdot B_K + 2^{-2} \cdot B_{K-1} + \ldots + 2^{-K} \cdot B_1) \ldots (VR-VI)+VI$$

where $B_K, B_{K-1}, \ldots, B_1$ is 0 or 1. The principle of this operation is similar to that of FIG. 40.

The potential difference (terminal voltage) across the capacitor 855 at this time is $(V_K - VNf)$.

Next, switches 857 and 858 are turned off and on, respectively. The terminal Nh is connected to the output terminal of the differential amplifier 856 and the output voltage Vout becomes $$Vout = VNf + (V_K - VNf) = V_K$$

Thus an output voltage that is not dependent upon the offset Δ can be obtained.

It should be noted that FIGS. 38, 39 and 40 correspond to FIGS. 5-33, 5-38 and 5-42, respectively, of Non-Patent Document 1, and FIG. 41 corresponds to FIGS. 1 and 2 of Patent Document 1. These introduce the respective principles.

[Patent Document 1]

Japanese Patent Kokai Publication No. JP-A-59-154820

[Patent Document 2]

U.S. Pat. No. 6,246,451 (FIG. 2)

[Non-Patent Document 1]

Kindai Kagakusha "Ultra LSI Introduction Series 5; Foundations of MOS Integrated Circuits" pp. 157-167 (FIGS. 5-33)

[Non-Patent Document 2]

SOCIETY FOR INFORMATION DISPLAY 2004; INTERNATIONAL SYMPOSIUM DIGEST OF TECHNICAL PAPERS; VOLUME XXXV pp. 1556-1559

The arrangement shown in FIGS. 38A and 38B is disadvantageous in that an increase in the number of bits leads to an increase in number of elements and invites an increase in area.

The arrangement shown in FIG. 39 is disadvantageous in that it uses a large number of capacitance elements and therefore is susceptible to the effects of a variance in capacitance value from one capacitance element to another, parasitic capacitance in the transistor switches that select the capacitance elements, and switching noise, etc. Output error tends to occur as a result.

The arrangements of FIGS. 40 and 41 employ only two capacitance elements. However, since the number of cycle operations is equivalent to the number of data bits, a very small output error caused by variance in the capacitance values and by parasitic capacitance in the transistor switches, which occur in one cycle, accumulates over a number of cycles and tends to increase.

Further, since real driving time is curtailed by the cycle time, these arrangements are difficult to apply to the data driver of a large-screen, high-definition display device having a high data-line load and a short data driving time for one item of data.

SUMMARY OF THE DISCLOSURE

Accordingly, an object of the present invention is to provide a digital-to-analog converter in which the number of elements is reduced to make possible a smaller area, and a display device having this digital-to-analog converter.

Another object of the present invention is to provide a digital-to-analog converter in which the number of capacitance elements is small and curtailment of real driving time is avoided.

According to one aspect of the present invention, the foregoing objects are attained by providing a digital-to-analog converter (DAC) comprising: a reference voltage generating circuit for outputting a plurality of reference voltages having voltage values that differ from one another; a first logic circuit for outputting result of a logical operation on a first bit group comprising either even-numbered bits or odd-numbered bits of an input digital data signal composed of a plurality of bits; a second logic circuit for outputting result of a logical operation on a second bit group comprising the other of the even-numbered bits or odd-numbered bits of the input digital data signal composed of the plurality of bits; a switch group circuit for supplying first and second terminals with voltages selected, inclusive of voltages that are identical, from among the plurality of reference voltages, which are output from the reference voltage generating circuit, in accordance with respective outputs from the first and second logic circuits; and an amplifier circuit for outputting an output voltage that is the result of applying a predetermined operation to voltages supplied to the first and second terminals.

In the present invention, the amplifier circuit outputs a voltage obtained by internally dividing the voltages, at the first and second terminals, with a predetermined internal division ratio.

Alternatively, in the present invention, the amplifier circuit outputs a voltage obtained by externally dividing the voltages, at the first and second terminals, at a predetermined external ratio.

According to another aspect of the present invention, the foregoing objects are attained by providing a digital-to-analog converter (DAC) comprising: a reference voltage generating circuit for outputting a plurality of reference voltages having voltage values that differ from one another; a logic circuit for sequentially outputting result of a logical operation on a first bit group comprising either even-numbered bits or odd-numbered bits of an input digital data signal composed of a plurality of bits and result of a logical operation on a second bit group comprising the other of the even-numbered bits or odd-numbered bits; a switch group circuit for selecting two voltages, inclusive of overlap, from among the plurality of reference voltages, which are output from the reference voltage generating circuit, in accordance with an output of the logic circuit, and supplying the two selected voltages to one terminal sequentially; and an amplifier circuit, to which the two voltages are input sequentially from the one terminal, for outputting an output voltage that is the result of applying a predetermined operation to the two voltages.

In the present invention, the amplifier circuit outputs a voltage obtained by internally dividing the two voltages, which are supplied sequentially to the single terminal, with a predetermined internal division ratio.

Alternatively, in the present invention, the amplifier circuit outputs a voltage obtained by externally dividing the two voltages, which are supplied sequentially to the single terminal, at a predetermined external ratio.

A data driver according to another aspect of the present invention includes the digital-to-analog converter according to the present invention.

According to another aspect of the present invention, the foregoing objects are attained by providing a display device comprising: a data driver, which includes the digital-to-analog converter according to the present invention; and a display panel; data lines of the display panel being driven based upon an output signal from the data driver.

The meritorious effects of the present invention are summarized as follows.

In accordance with the present invention, a DAC in which the number of elements is small as well as the area thereof can be realized.

Further, in accordance with the present invention, a DAC in which the number of capacitance elements is small and a reduction in real driving time is avoided can be realized.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 3A and 3B are diagrams of input/output level correspondence when an operational amplifier circuit 500 internally divides (interpolates) voltages V(T1) and V(T2) of terminals T1 and T2 with a 1:2 ratio and outputs the result;

FIGS. 4A and 4B are diagrams of input/output level correspondence when the operational amplifier circuit 500 externally divides (extrapolates) voltages V(T1) and V(T2) of terminals T1 and T2 with a 1:2 ratio and outputs the result;

FIG. 5 is a diagram illustrating conditions for selecting bit data when reference voltages corresponding to FIG. 3B are selected and output to terminals T1 and T2;

FIG. 6 is a diagram illustrating conditions for selecting bit data when reference voltages corresponding to FIG. 4B are selected and output to terminals T1 and T2;

FIG. 20 is a diagram of input/output level correspondence of an 8-bit DAC when the operational amplifier circuit 500 internally divides (interpolates) voltages V(T1) and V(T2) at terminals T1 and T2 with a 1:2 ratio and outputs the result;

FIG. 21 is a diagram of input/output level correspondence of an 8-bit DAC when the operational amplifier circuit 500 externally divides (extrapolates) voltages V(T1) and V(T2) at terminals T1 and T2 with a 1:2 ratio and outputs the result;

FIG. 22 is a diagram illustrating conditions for selecting bit data when reference voltages corresponding to FIG. 20 are selected and output to terminals T1 and T2;

FIG. 23 is a diagram illustrating conditions for selecting bit data when reference voltages corresponding to FIG. 21 are selected and output to terminals T1 and T2;

PREFERRED EMBODIMENTS OF THE INVENTION

Embodiments of the present invention will now be described with reference to the drawings.

Figure 1:
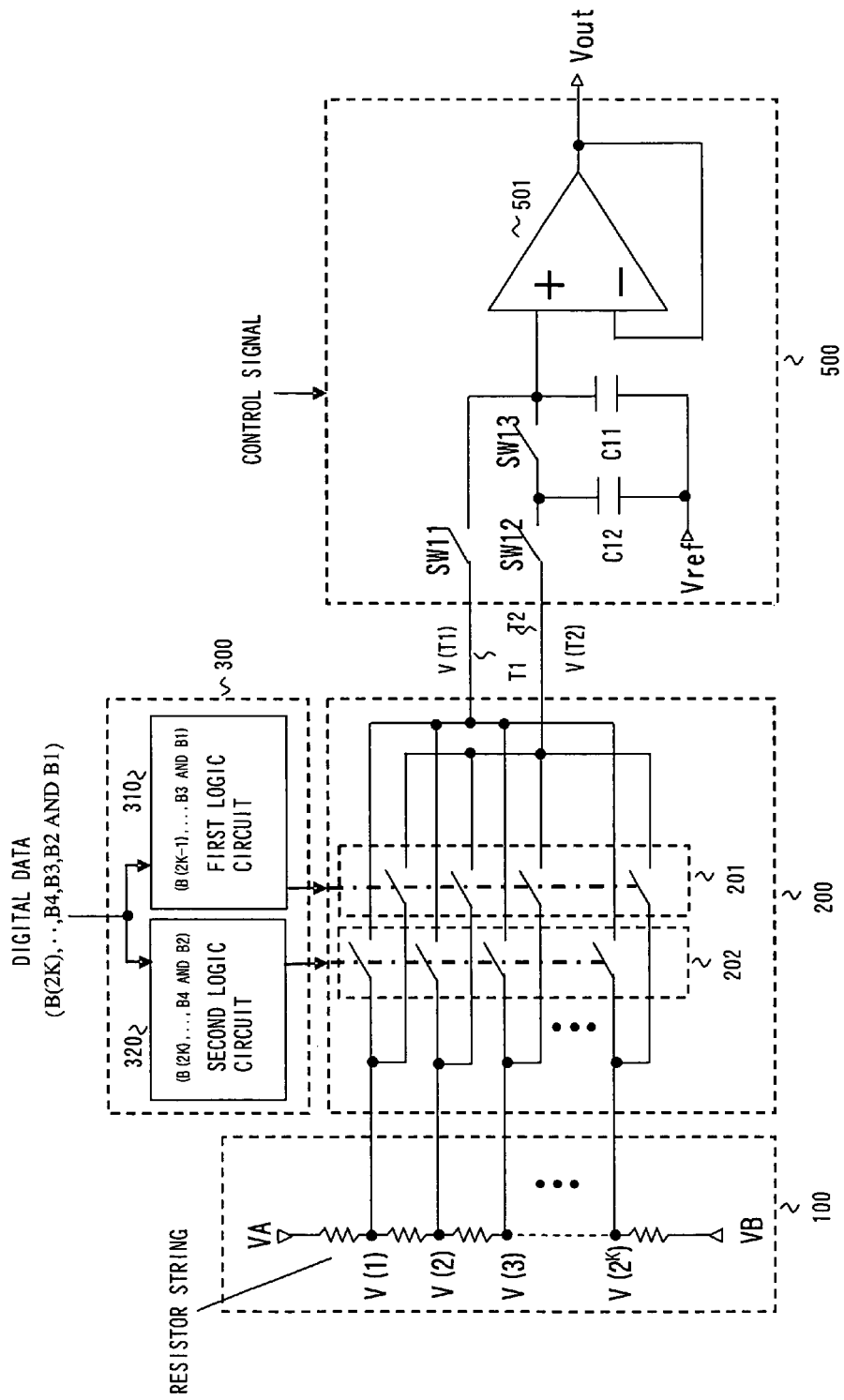
FIG. 1 is a diagram illustrating a digital-to-analog converting circuit (DAC) according to a first embodiment of the present invention.

FIG. 1 is a diagram illustrating the structure of a digital-to-analog converter (DAC) according to a first embodiment of the present invention. As shown in FIG. 1, the DAC according to the first embodiment includes a reference voltage generating circuit 100 for generating $2^K$-number of reference voltages [V(1), V(2), ..., and V($2^K$)]; a logic circuit 300, which receives input of a 2K-bit digital signal [B(2K), B(2K−1), ..., B3, B2 and B1], for outputting logic values; a switch group 200 for selecting two identical or different reference voltages from among the $2^K$-number of reference voltages based upon the logic values, and outputting these voltages to terminals T1 and T2; and an operational amplifier circuit 500 for amplifying and outputting a voltage obtained by internally dividing (interpolating) or externally dividing (extrapolating) the voltages of the terminals T1 and T2 with a 1:2 ratio.

The logic circuit 300 comprises first and second logic circuits 310, 320 for respectively outputting logic values of odd-numbered bits [B(2K−1), ..., B3 and B1] and logic values of even-numbered bits [B(2K), ..., B4 and B2] from the 2K-bit digital data signal in which the bits are ordered from the least significant bit B1 (LSB) to the most significant bit B(2K).

The switch group 200, which forms a selecting circuit, has a first switch group 201 connected between voltage supply terminals for outputting $2^K$-number of reference voltages and the terminal T2 and controlled based upon the output value of the first logic circuit 310; and a second switch group 202 connected between voltage supply terminals for outputting $2^K$-number of reference voltages and the terminal T1 and controlled based upon the output value of the second logic circuit 320.

It will suffice if the reference voltage generating circuit 100 has a structure adapted to output $2^K$ reference voltages. FIG. 1 illustrates an example in which the reference voltage generating circuit 100 is composed of a resistor string connected between supply terminals of voltages VA and VB.

The $2^K$ reference voltages are output by being extracted from taps at the nodes of the resistors in the resistor string.

The operational amplifier circuit 500 exemplified in FIG. 1 amplifies and outputs a voltage obtained by internally dividing the voltages of the terminals T1 and T2 with a 1:2 ratio. Structures suitable for the operational amplifier circuit 500 will be described in detail later with reference to FIGS. 11 to 17.

When the 2K-bit digital signal [B(2K), B(2K−1), ..., B3, B2, B1] is input, the DAC shown in FIG. 1 is capable of selecting and outputting a maximum of $4^K$ voltage levels in accordance with the data signal.

In accordance with this embodiment, the number of reference voltages produced by the reference voltage generating circuit 100 can be made $2^K$ at minimum by using the operational amplifier circuit 500 that is capable of amplifying and outputting a voltage obtained by internally or externally dividing the voltages of the terminals T1 and T2 with a 1:2 ratio. Accordingly, since the number of reference voltages is very small even the number of bits is large, it is possible to suppress an increase in the number of elements that construct the switch group 200, which selects the reference voltages, and the logic circuit 300, which controls the switch group 200, and therefore it is possible to realize a DAC of small area.

With the DAC shown in FIG. 1, the first and second logic circuits 310, 320 perform operations based upon odd- and even-numbered bits, respectively, and therefore each is implemented essentially by a K-bit input logic circuit.

Figure 39:
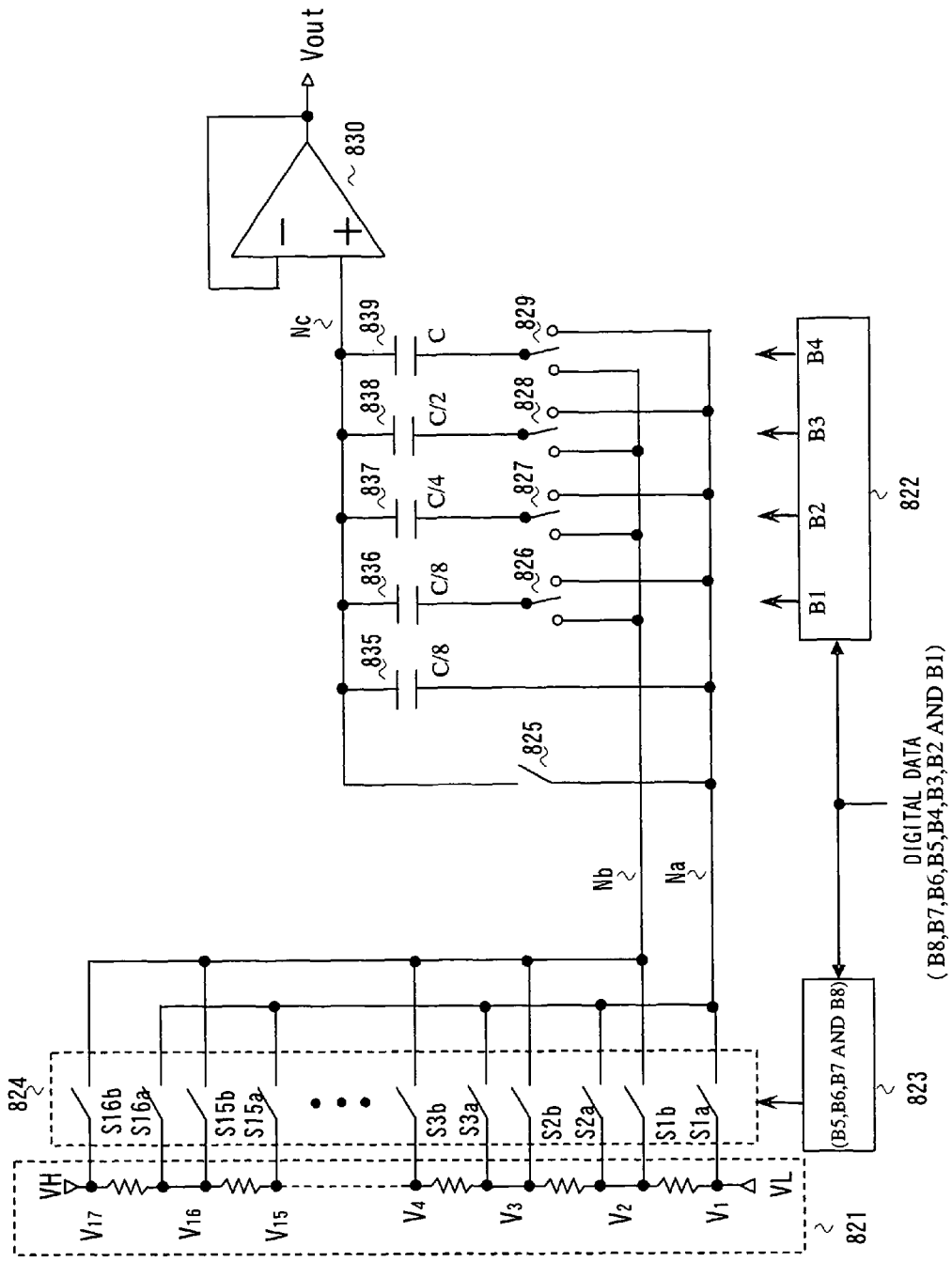
FIG. 39 is a diagram illustrating an example of the structure of an 8-bit DAC obtained by combining a resistor-string DAC and a capacitor-array DAC.

In this embodiment, it will suffice if the operational amplifier circuit 500 has such a structure that operationally amplifies and outputs the voltages V(T1) and V(T2), which have been selected and output to the terminals T1 and T2, at a fixed ratio of 1:2. A large number of capacitance elements and switches are not required, unlike the arrangement shown in FIG. 39.

Figure 40:
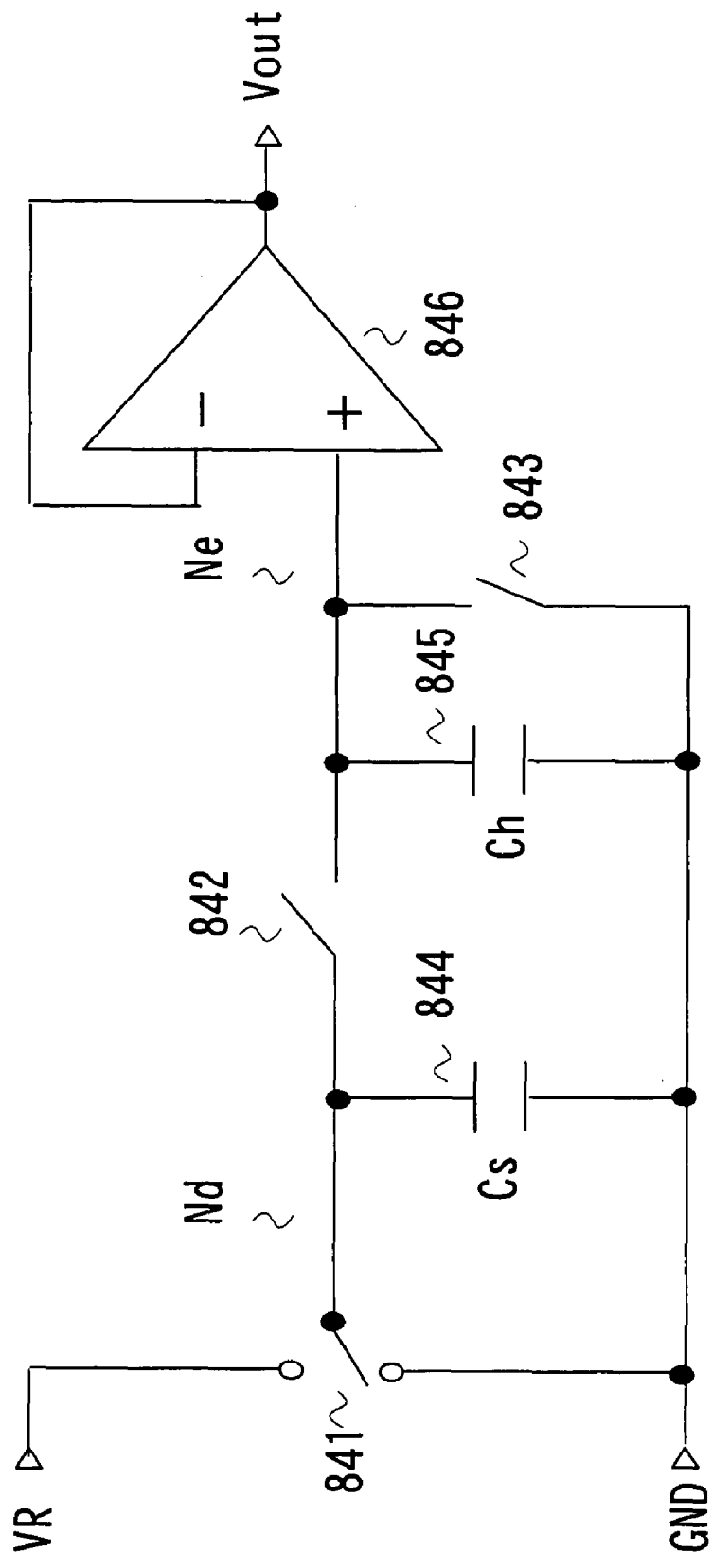
FIG. 40 is a diagram illustrating an example of the structure of a serial DAC.
Figure 41:
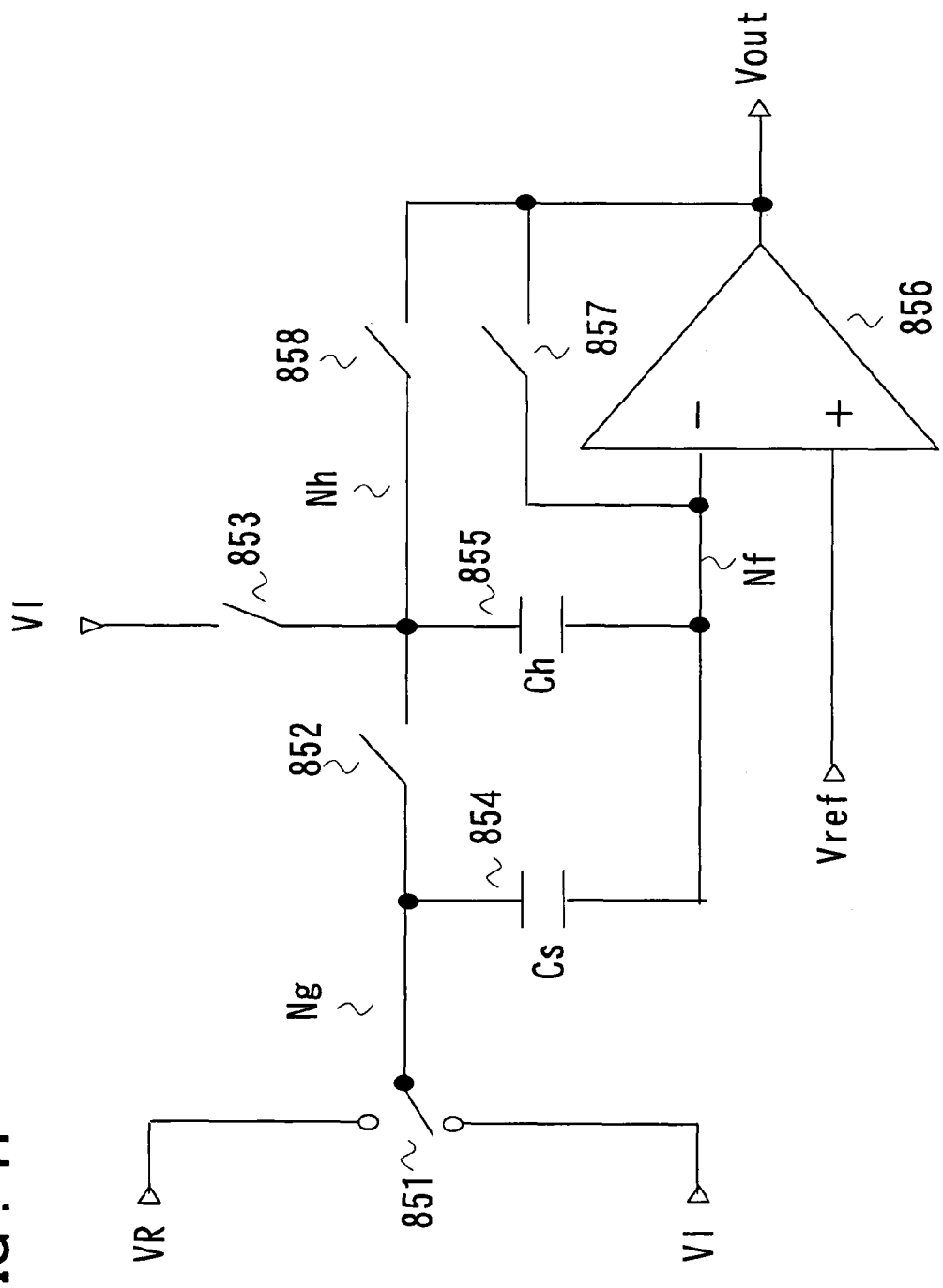
FIG. 41 is a diagram illustrating the structure of a serial DAC having a function that compensates for offset of a voltage-follower circuit.

Further, in this embodiment, the operational amplifier circuit 500 does not necessitate a plurality of cycle operations, unlike the arrangements of FIGS. 40 and 41. Accordingly, it is possible to realize a DAC having a small number of capacitance elements and no reduction in real driving time.

Figure 2:
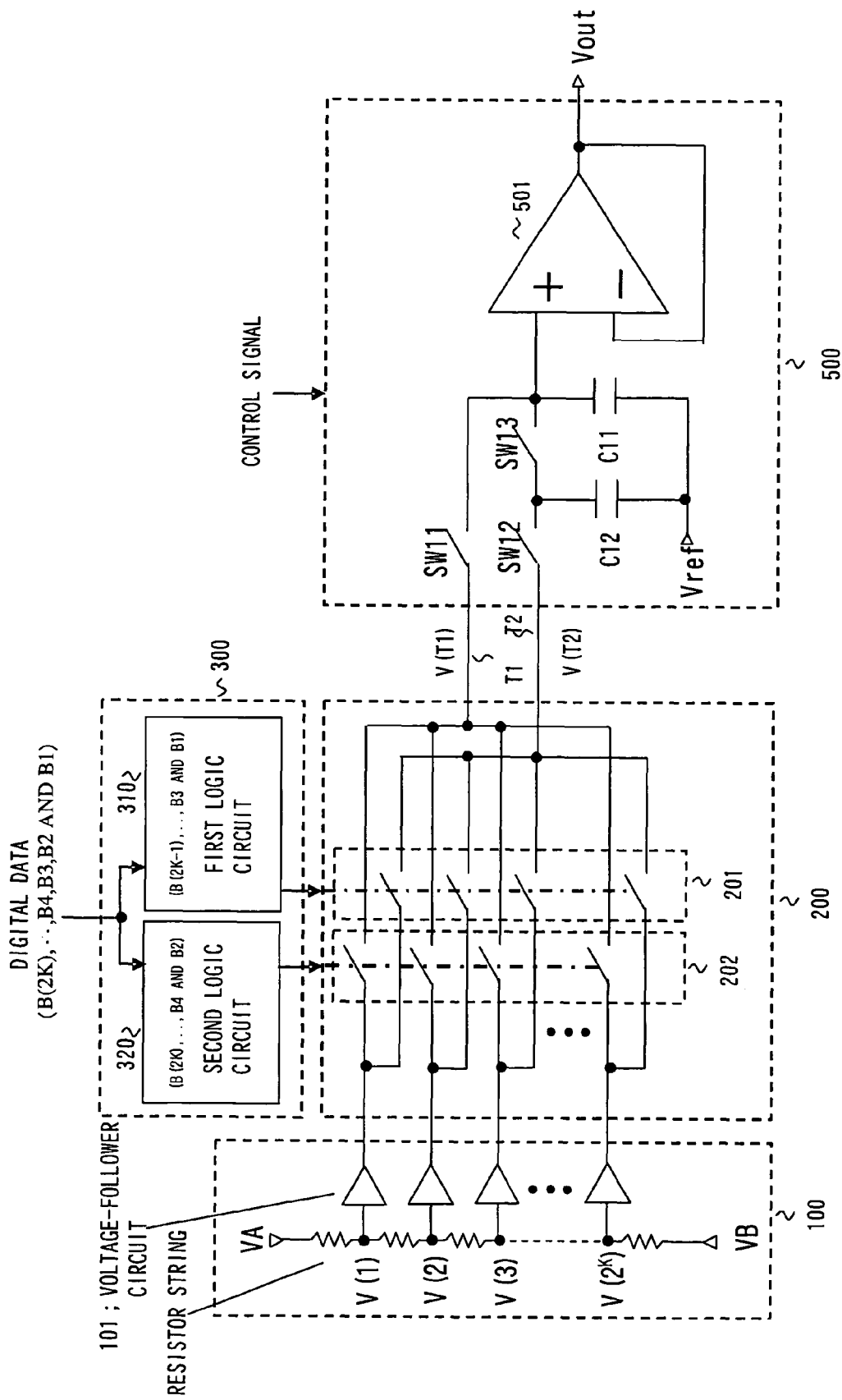
FIG. 2 is a diagram illustrating a modification of the first embodiment.

FIG. 2 is a diagram illustrating the structure of a modification of the first embodiment of the present invention. This modification differs from the implementation of FIG. 1 in the addition of a voltage-follower circuit 101 for amplifying and outputting the $2^K$-number of reference voltages [V(1), V(2), . . . , and V(K)] of the reference voltage generating circuit 100. In a case where the operational amplifier circuit 500 has a structure that includes capacitance and the input capacitance is comparatively large, it is preferred that the reference voltage generating circuit 100 be equipped with the voltage-follower circuit 101 in order to supply the capacitance with enough electric charge. It should be noted that since the number of reference voltages generated by the reference voltage generating circuit 100 is small in the arrangement of the invention shown in FIG. 1, an increase in scale of the circuitry and an increase in power consumption can be kept comparatively small even if the voltage-follower circuit 101 is provided.

The reason why the number of reference voltages can be greatly reduced in this embodiment will be described below with reference to FIGS. 3A and 3B and FIGS. 4A and 4B. FIGS. 3A and 3B are diagrams of input/output level correspondence of the DAC of the present invention when the operational amplifier circuit 500 internally divides (interpolates) voltages V(T1) and V(T2) of the terminals T1 and T2 with a 1:2 ratio and outputs the result. FIG. 3A is a diagram of input/output level correspondence in a case where four voltage levels are selected and output by K=1, i.e., 2-bit data (B2 and B1), in FIGS. 1 and 2.

The number of reference voltages need be only two in this case. If these two reference voltages are set to first and fourth levels V1 and V4, four voltage levels can be output in linear form. Combinations of the reference voltages V1, V4 selected as V(T1) and V(T2) by the 2-bit data (B2 and B1) also are illustrated in FIG. 3A. It should be noted that each voltage level in the diagrams of input/output level correspondence has an assigned level number that follows the "V" symbol.

The following relation holds when the output voltage Vout is a voltage obtained by internally dividing the voltages V(T1) and V(T2) at the 1:2 ratio:

$$V\text{out}=\{2\cdot V(T1)+V(T2)\}/3 \qquad (1)$$

When (V1,V1), (V1,V4), (V4,V1) and (V4,V4) are each selected as [V(T1), V(T2)] by the 2-bit data (B2 and B1), it can be confirmed from Equation (1) that Vout becomes V1, V2, V3 and V4, respectively, and that four linear voltage outputs can be obtained from two reference voltages.

FIG. 3B is a diagram of input/output level correspondence in a case where 16 voltage levels are selected and output by K=2, i.e., 4-bit data (B4, B3, B2 and B1). The number of reference voltages need be only four in this case. If these four reference voltages are set to first, fourth, $13^{th}$ and $16^{th}$ levels V1, V4, V13 and V16, then 16 voltage levels can be output in linear form.

If [V(T1) and V(T2)] selected from these four reference voltages (there are instances where the selected voltages are identical) and shown in FIG. 3B are substituted into Equation (1), it can be confirmed that Vout of V1 to V16 will be obtained and that 16 linear voltage outputs can be obtained from the four reference voltages.

Thus, FIGS. 3A and 3B are obtained in case of K=1 and K=2, respectively. With regard also to K=3 or greater, $4^K$-number of linear voltage outputs are possible with $2^K$-number of reference voltages with respect to the 2K-bit data [B(2K), B(2K−1), . . . , B3, B2 and B1].

The setting of the levels of the $2^K$ reference voltages is given by Equation (2) below. It should be noted that the operational symbol $\Sigma^{K-1}_{X=0}$ in Equation (2) represents the sum total from X=0 to X=K−1.

$$V_{REF1} = 1 + (\varepsilon_0 \cdot 4^0) + (\varepsilon_1 \cdot 4^1) + (\varepsilon_2 \cdot 4^2) + \ldots (\varepsilon_{K-1} \cdot 4^{K-1}) \qquad (2)$$

$$= 1 + \sum_{X=0}^{K-1}(\varepsilon_X \cdot 4^X)$$

where $\varepsilon_X$=0, 3 holds.

FIGS. 4A and 4B are diagrams of input/output level correspondence of the DAC of the present invention when the operational amplifier circuit 500 externally divides (extrapolates) voltages V(T1) and V(T2) of the terminals T1 and T2 with a 1:2 ratio and outputs the result. FIG. 4A is a diagram of input/output level correspondence in a case where four voltage levels are selected and output by K=1, i.e., 2-bit data (B2,B1), in FIGS. 1 and 2. The number of reference voltages need be only two in this case. If these two reference voltages are set to second and third levels V2 and V3, four voltage levels can be output in linear form.

Combinations of the reference voltages V2 and V3 selected as V(T1) and V(T2) by the 2-bit data (B2 and B1) also are illustrated in FIG. 4A.

The following relation holds when the output voltage Vout is a voltage obtained by externally dividing the voltages V(T1) and V(T2) at the 1:2 ratio:

$$V\text{out}=2\cdot V(T1)-V(T2) \qquad (3)$$

When (V2,V3), (V2,V2), (V3,V3) and (V3,V2) are each selected as [V(T1), V(T2)] by the 2-bit data (B2 and B1), it can be confirmed from Equation (3) that Vout becomes V1, V2, V3 and V4, respectively, and that four linear voltage outputs can be obtained from two reference voltages.

FIG. 4B is a diagram of input/output level correspondence in a case where 16 voltage levels are selected and output by K=2, i.e., 4-bit data (B4, B3, B2 and B1). The number of reference voltages need be only four in this case.

If these four reference voltages are set to sixth, seventh, tenth and $11^{th}$ levels V6, V7, V10 and V11, then 16 voltage levels can be output in linear form.

If [V(T1), V(T2)] selected from these four reference voltages (there are instances where the selected voltages are identical) and shown in FIG. 4B are substituted into Equation (3), it can be confirmed that Vout of V1 to V16 will be obtained and that 16 linear voltage outputs can be obtained from the four reference voltages.

Thus, FIGS. 4A and 4B are obtained in case of K=1 and K=2, respectively. With regard also to K=3 or greater, $4^K$-number of linear voltage outputs are possible with $2^K$-number of reference voltages with respect to the 2K-bit data [B(2K), B(2K−1), . . . , B3, B2 and B1].

The setting of the levels of the $2^K$ reference voltages is given by Equation (4) below.

$$V_{REF2} = 1 + (\varepsilon_0 \cdot 4^0) + (\varepsilon_1 \cdot 4^1) + (\varepsilon_2 \cdot 4^2) + \ldots (\varepsilon_{K-1} \cdot 4^{K-1}) \qquad (4)$$

$$= 1 + \sum_{X=0}^{K-1}(\varepsilon_X \cdot 4^X)$$

where $\varepsilon_X$=1, 2 holds.

The difference between Equations (2) and (4) is that the values taken on by $\epsilon_X$ differ.

FIGS. 5 and 6 are diagrams illustrating conditions for selecting bit data when reference voltages corresponding to FIGS. 3B and 4B, respectively, are selected and output to the terminals T1, T2. In the present invention, as illustrated in FIGS. 5 and 6, selection of the reference voltage applied to terminal T1 is performed based upon the even-numbered bit signal, and the selection of the reference voltage applied to terminal T2 is performed based upon the odd-numbered bit signal. The principle of this operation will now be described.

Described first will be a case where the output voltage Vout is obtained by internally dividing the voltages V(T1) and V(T2) at the ratio 1:2. When the digital data is 2K-bit data, 1 to $4^K$ levels of the output voltage Vout can be expressed by Equations (5), (6) below if 2K-digit binary numbers ($b_{K-1}$, $a_{K-1}$, $b_{K-2}$, ..., $b_1$, $a_1$, $b_0$ and $a_0$) are used.

$$Vout = 1 + (a_0 \cdot 2^0) + (b_0 \cdot 1^0) + (a_1 \cdot 2^2) + (b_1 \cdot 2^3) + \ldots + \qquad (5)$$
$$[a_{K-1} \cdot 2^{2(K-1)}] + [b_{K-1} \cdot 2^{2(K-1)+1}]$$
$$= 1 + \sum_{X=0}^{K-1}(a_X \cdot 2^{2X} + b_X \cdot 2^{2X+1})$$

where $\qquad (6)$ $a_X b_X = 0, 1$ holds.

$$= 1 + \sum_{X=0}^{K-1}(a_X + 2 \cdot b_X) \cdot 4^X$$

where $a_X, b_X = 0, 1$ holds.

It should be noted that $a_X$ and $b_X$ respectively are values (0 or 1) of odd- and even-numbered digits of a 2K-digit binary number.

Further, since the 2K-digit binary number represents 0 to ($4^K-1$), 1 is added to the right side of the equation to achieve agreement with the number of levels of 1 to $4^K$ of Vout on the left side.

Further, Equation (6) is quaternary notation of K digits. The relationship of ($a_X+2\cdot b_X$) to $a_X$, $b_X=0, 1$ is the relationship shown in Table 1 below:

TABLE 1

| $b_x$ | $a_x$ | $(a_x + 2 \cdot b_x)$ |
|---|---|---|
| 0 | 0 | 0 |
| 0 | 1 | 1 |
| 1 | 0 | 2 |
| 1 | 1 | 3 |

In a case where the output voltage Vout is a voltage level obtained by internally dividing the reference voltages V(T1) and V(T2) at the 1:2 ratio, Equation (1) holds. Further, the reference voltages V(T1) and V(T2) are represented by Equation (2).

The voltages V(T1) and V(T2) are expressed as follows based upon Equation (2):

$$V(T1)=1+\Sigma^{K-1}_{X=0}(\beta_X \cdot 4^X) \qquad (7)$$

where $\beta_X=0, 3$ holds, and $$V(T2)=1+\Sigma^{K-1}_{X=0}(\alpha_X \cdot 4^X) \qquad (8)$$

where $\alpha_X=0, 3$ holds.

Substituting Equations (7) and (8) into Equation (1) results in the following equation:

$$Vout=1+\Sigma^{K-1}_{X=0}\{(\alpha_X+2\cdot\beta_X)/3\}\cdot 4^X \qquad (9)$$

where $\alpha_X, \beta_X=0, 3$ holds.

The $\Sigma$ term in Equation (9) represents a quaternary number of K digits, and ($\alpha_X+2\cdot\beta_X$)/3 represents the value of each digit. The relationship of ($\alpha_X+2\cdot\beta_X$)/3 to $\alpha_X$, $\beta_X=0, 3$ is the relationship shown in Table 2 below:

TABLE 2

| $\beta_x$ | $\alpha_x$ | $(\alpha_x + 2 \cdot \beta_x)/2$ |
|---|---|---|
| 0 | 0 | 0 |
| 0 | 3 | 1 |
| 3 | 0 | 2 |
| 3 | 3 | 3 |

If Equation (9) and Table 2 are compared with Equation (6) and Table 1, respectively, it will be understood that they are in an equivalent relationship.

In view of the foregoing, when V(T1) and V(T2) are defined by Equation (2) and the relation of Equation (1) is satisfied, Vout can take on 1 to $4^K$ voltage levels and it can be verified that the reference-voltage setting according to Equation (2) is correct.

Further, the following relations are deduced from a comparison of Tables 1 and 2:

$$\beta_X=3\cdot b_X \qquad (10)$$

where $b_X=0, 1$ holds, and $$\alpha_X=3\cdot a_X \qquad (11)$$

where $a_X=0, 1$ holds.

Substituting Equations (10) and (11) into Equations (7) and (8) results in the following equations:

$$V(T1)=1+\Sigma^{K-1}_{X=0}(3\cdot b_X\cdot 4^X) \qquad (12)$$

where $b_X=0, 1$ holds, and $$V(T2)=1+\Sigma^{K-1}_{X=0}(3\cdot a_X\cdot 4^X) \qquad (13)$$

where $a_X=0, 1$ holds

In accordance with Equations (12) and (13), the levels of V(T1) are defined by each of the values ($b_X$) of even-numbered digits in binary notation of Vout, and the levels of V(T2) are defined by each of the values ($a_X$) of odd-numbered digits in binary notation of Vout.

Accordingly, it is indicated that in a case where the output voltage Vout is a voltage level obtained by internally dividing the voltages V(T1) and V(T2) with a 1:2 ratio, the selection of reference voltages applied to the terminals T1 and T2 is performed based upon even- and odd-numbered bit signals, respectively.

If conditions for selecting each of the reference voltages V1, V4, V13 and V16 as V(T1) and V(T2) from the diagram (FIG. 3B) of input/output level correspondence of the 4-bit data (B4, B3, B2 and B1) are extracted, the result is FIG. 5 and it can be confirmed that the selection of reference voltages applied to the terminal T1 is stipulated by the bit signal (B4 and B2) and that the selection of reference voltages applied to the terminal T2 is stipulated by the bit signal (B3 and B1).

The relationship between the binary notation of Vout and the reference voltages V(T1) and V(T2) will now be described. Equation (12) relating to V(T1) is transformed to the following binary notation:

$$V(T1) = 1 + \sum_{X=0}^{K-1}\{(2+1)\cdot b_X \cdot 4^X\} \quad (14)$$
$$= 1 + \sum_{X=0}^{K-1}(b_X \cdot 2^{2X+1} + b_X \cdot 2^{2X})$$

where $b_X = 0, 1$.

It is deduced from a comparison between Equations (5) and (14) that if the output levels of Vout are associated by binary numbers, an even-numbered digit is expressed by $b_X$ and the odd-numbered digit that is one digit lower is expressed by $a_X$, then the voltage level for which the two digits identical with ($b_X$ and $a_X$) are made ($b_X$ and $b_X$) will be V(T1).

Further, Equation (13) relating to V(T2) is transformed to the following binary notation:

$$V(T2) = 1 + \Sigma^{K-1}{}_{X=0}(a_X 2^{2X+1} + a_X 2^{2X}) \quad (15)$$

where $a_X = 0, 1$.

It is deduced from a comparison between Equations (5) and (15) that if the output levels of Vout are associated by binary numbers, an even-numbered digit is expressed by $b_X$ and the odd-numbered digit that is one digit lower is expressed by $a_X$, then the voltage level for which the two digits identical with ($b_X$ and $a_X$) are made ($a_X$ and $a_X$) will be V(T2).

For example, if Vout corresponding to the 4-bit data (B4, B3, B2 and B1) is (0,1,0 and 0), then we have the following:

V(T1) is (0,0,0 and 0) based upon the values of B4 and B2 of the even-numbered digits; and V(T2) is (1,1,0 and 0) based upon the values of B3 and B1 of the odd-numbered digits. This is in agreement with the relationship shown in FIG. 3B.

It should be noted that if reference voltages for which V(T1) and V(T2) are identical are selected, then we have the following from Equation (1):

$$V(T1) = V(T2) = V\text{out}$$

and $b_X = a_X$ is deduced from Equations (14), (15).

Accordingly, if reference voltages for which V(T1) and V(T2) are identical are selected, an equality relationship will exist between each value ($b_X$) of the even-numbered digits in binary notation stipulating V(T1) and each value ($a_X$) of odd-numbered digits stipulating V(T2).

For example, in FIG. 5, even-numbered bit data (B4 and B2) and odd-numbered bit data (B3 and B1) that select reference voltage V01 for output to V(T1) and V(T2) are both in a (0 and 0) equality relationship. The same is true with regard to other reference voltages as well.

Described next will be a case where the output voltage Vout is obtained by externally dividing (extrapolating) the voltages V(T1) and V(T2) at the ratio 1:2. It should be noted that Equations (5) and (6), which relate to Vout, and Table 1 are used as is.

In a case where the output voltage Vout is a voltage level obtained by externally dividing (extrapolating) the reference voltages V(T1) and V(T2) at the ratio 1:2, Equation (3) holds. Further, the reference voltages V(T1) and V(T2) are expressed by Equation (4).

Here V(T1) and V(T2) are expressed as follows based upon Equation (4):

$$V(T1) = 1 + \Sigma^{K-1}{}_{X=0}(\beta_X \cdot 4^X) \quad (16)$$

where $\beta_X = 1, 2$ holds, and $$V(T2) = 1 + \Sigma^{K-1}{}_{X=0}(\alpha_X \cdot 4^X) \quad (17)$$

where $\alpha_X = 1, 2$ holds.

Substituting Equations (16) and (17) into Equation (3) results in the following equation:

$$V\text{out} = 1 + \Sigma^{K-1}{}_{X=0}(-\alpha_X + 2 \cdot \beta_X) \cdot 4^X \quad (18)$$

where $\alpha_X, \beta_X = 1, 2$.

The $\Sigma$ term in Equation (18) represents a quaternary number of K digits, and $(-\alpha_X + 2 \cdot \beta_X)$ represents the value of each digit.

The relationship of $(-\alpha_X + 2 \cdot \beta_X)$ to $\alpha_X, \beta_X = 1, 2$ is the relationship shown in Table 3 below:

TABLE 3

| $\beta_x$ | $\alpha_x$ | $(-\alpha_x + 2 \cdot \beta_x)$ |
|---|---|---|
| 1 | 2 | 0 |
| 1 | 1 | 1 |
| 2 | 2 | 2 |
| 2 | 1 | 3 |

If Equation (18) and Table 3 are compared with Equation (6) and Table 1, respectively, it will be understood that they are in an equivalent relationship.

In view of the foregoing, when V(T1) and V(T2) are defined by Equation (4) and the relation of Equation (1) is satisfied, Vout can take on 1 to $4^K$ voltage levels and it can be verified that the reference-voltage setting according to Equation (4) is correct.

Further, the following relations are deduced from a comparison of Tables 1 and 3:

$$\beta_X = 1 + b_X \quad (19)$$

where $b_X = 0, 1$ holds, and $$\alpha_X = 2 - a_X \quad (20)$$

where $a_X = 0, 1$ holds.

Substituting Equations (19) and (20) into Equations (16) and (17) results in the following equations:

$$V(T1) = 1 + \Sigma^{K-1}{}_{X=0}(1 + b_X) \cdot 4^X \quad (21)$$

where $b_X = 0, 1$ holds, and $$V(T2) = 1 + \Sigma^{K-1}{}_{X=0}(2 - a_X) \cdot 4^X \quad (22)$$

where $a_X = 0, 1$ holds

In accordance with Equations (21) and (22), the levels of V(T1) are defined by each of the values ($b_X$) of even-numbered digits in binary notation of Vout, and the levels of V(T2) are defined by each of the values ($a_X$) of odd-numbered digits in binary notation of Vout.

Accordingly, it is indicated that in a case where the output voltage Vout is a voltage level obtained by externally dividing the voltages V(T1) and V(T2) with a 1:2 ratio, the selection of reference voltages applied to the terminals T1 and T2 is performed based upon even- and odd-numbered bit signals, respectively.

If conditions for selecting each of the reference voltages V6, V7, V10, and V11 as V(T1) and V(T2) from the diagram (FIG. 4B) of input/output level correspondence of the 4-bit data (B4,B3,B2 and B1) are extracted, the result is FIG. 6 and it can be confirmed that the selection of reference voltages applied to the terminal T1 is stipulated by the bit signal (B4 and B2) and that the selection of reference voltages applied to the terminal T2 is stipulated by the bit signal (B3 and B1).

The relationship between the binary notation of Vout and the reference voltages V(T1) and V(T2) will now be described. Equation (21) relating to V(T1) is transformed to the following binary notation:

$$V(T1)=1+\Sigma^{K-1}_{X=0}(1+b_X)\cdot 2^{2X} \quad (23)$$

where $b_X=0, 1$.

From a comparison of Equations (5) and (23), $(1+b_X)$ is the value of an odd-numbered digit of a binary number of 2K bits, and we can write the following:

$(1+b_X)=1$ when $b_X=0$ holds, and
$(1+b_X)=2$ when $b_X=1$ holds.

When $(1+b_X)=2$ holds, however, the figure is raised one digit.

Accordingly, if the output levels of Vout are associated by binary numbers, an even-numbered digit is expressed by $b_X$ and the odd-numbered digit that is one digit lower is expressed by $a_X$, then it is deduced that the voltage level for which the two digits identical with $(b_X, a_X)$ are made (0,1) when $b_X=0$ holds, and for which the two digits identical with $(b_X,a_X)$ are made (1, 0) when $b_X=1$ holds, will be V(T1).

Further, Equation (22) relating to V(T2) is transformed to the following binary notation:

$$V(T2)=1+\Sigma^{K-1}_{X=0}(2-a_X)\cdot 2^{2X} \quad (24)$$

where $a_X=0, 1$.

From a comparison of Equations (5) and (24), $(2-a_X)$ is the value of an even-numbered digit of a binary number of 2K bits, and we can write the following:

$(2-a_X)=2$ when $a_X=0$ holds, and
$(2-a_X)=1$ when $a_X=1$ holds.

When $(2-a_X)=2$ holds, however, the figure is raised one digit.

Accordingly, if the output levels of Vout are associated by binary numbers, an even-numbered digit is expressed by $b_X$ and the odd-numbered digit that is one digit lower is expressed by ax, then it is deduced that the voltage level for which the two digits identical with $(b_X,a_X)$ are made (1,0) when $a_X=0$ holds, and for which the two digits identical with $(b_X,a_X)$ are made (0,1) when $a_X=1$ holds, will be V(T2).

For example, if Vout corresponding to the 4-bit data (B4, B3,B2 and B1) is (0,1,0 and 0), then we have the following:

V(T1) is (0,1,0 and 1) based upon the values of B4 and B2 of the even-numbered digits; and V(T2) is (0,1,1 and 0) based upon the values of B3 and B1 of the odd-numbered digits. This is in agreement with the relationship shown in FIG. 4B.

It should be noted that if reference voltages for which V(T1) and V(T2) are identical are selected, then we have V(T1)=V(T2)=Vout from Equation (3), and $$(1+b_X)=(2-a_X)$$

is deduced from Equations (23) and (24), where $a_X, b_X=0, 1$ holds. The condition for $(b_X,a_X)$ that satisfies this is as follows:

$$(b_X,a_X)=(0,1), (1,0)$$

Accordingly, if reference voltages for which V(T1) and V(T2) are identical are selected, a complementary (opposing) relationship will exist between each value $(b_X)$ of the even-numbered digits in binary notation stipulating V(T1) and each value $(a_X)$ of odd-numbered digits stipulating V(T2).

For example, in FIG. 6, even-numbered bit data (B4,B2) and odd-numbered bit data (B3,B1) that select reference voltage V06 for output to V(T1) and V(T2) are in a (0,0), (1,1) complementary (opposing) relationship. The same is true with regard to other reference voltages as well.

Figure 7:
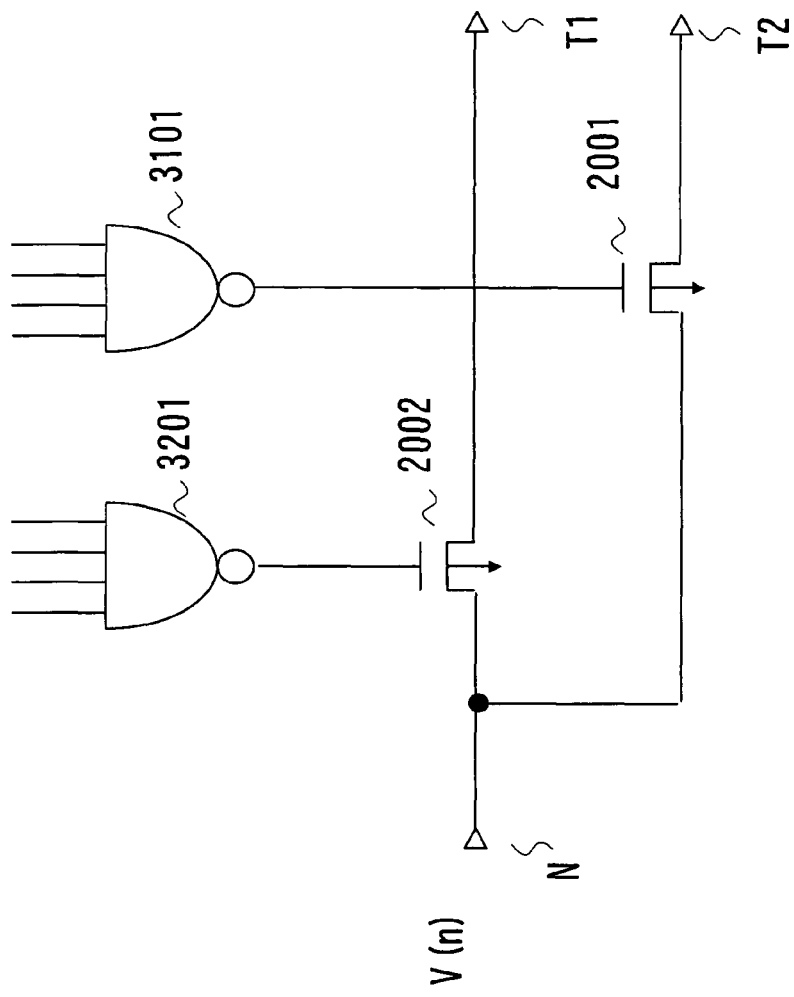
FIG. 7 is a diagram illustrating an example of the arrangement of a logic circuit 300 and switch group 200 in FIGS. 1 and 2.

FIG. 7 is a diagram illustrating an example of the arrangement of the logic circuit 300 and switch group 200 in FIGS. 1 and 2. Specifically, FIG. 7 shows the arrangement of circuitry for selecting reference voltage V(n) and outputting the selected voltage to terminals T1, T2. The arrangement of FIG. 7 includes a transistor switch 2001 connected between a terminal N, which supplies the reference voltage V(n), and terminal T2; a transistor switch 2002 connected between the supply terminal N and terminal T1; a first logic circuit 3101 for outputting a logic value to a control end of switch 2001 based upon the odd-numbered bit signal [B(2K−1), . . . , B3, and B1]; and a second logic circuit 3201 for outputting a logic value to a control end of switch 2002 based upon the even-numbered bit signal [B(2K), . . . , B4, and B2].

More specifically, the switches 2001 and 2002 are formed by P-channel transistor switches and the logic circuits 3101 and 3201 by NAND gates. The bit signals that are input to the NAND gates 3101 and 3201 are either positive signals or complementary signals thereof. The logic value that is output becomes "0" only when all input signals are "1", at which time the P-channel transistor switch is turned on. It should be noted that the complementary signals are not illustrated.

Figure 8:
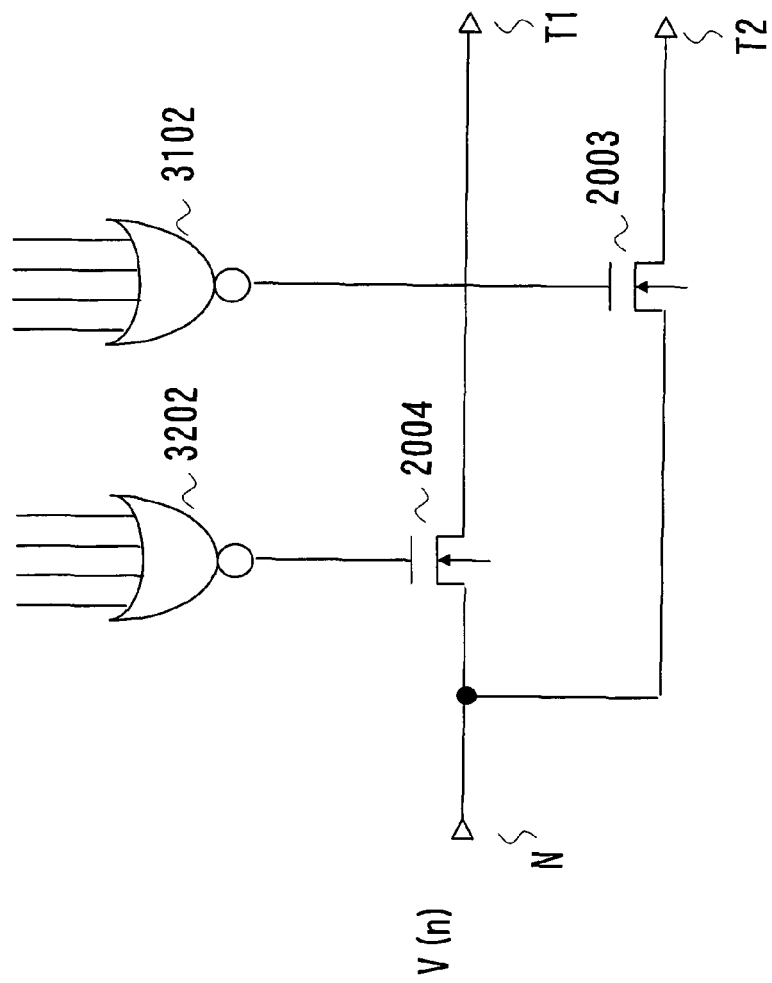
FIG. 8 is a diagram illustrating a modification of FIG. 7.

FIG. 8 is a diagram illustrating a modification of FIG. 7. Here the P-channel transistor switches 2001 and 2002 are replaced by N-channel transistor switches 2003 and 2004, respectively, and the NAND gates 3101 and 3201 are replaced by NOR gates 3102 and 3202, respectively. The bit signals that are input to the NOR gates 3102 and 3202 are either positive signals or complementary signals thereof. The logic value that is output becomes "1" only when all input signals are "0", at which time the N-channel transistor switch is turned on.

Although it is possible to adopt an arrangement in which the outputs of the NAND gates 3101 and 3201 of FIG. 7 are input to the control ends of the N-channel transistor switches 2003 and 2004 via inverters, the number of elements would increase over the number in FIG. 8 by the number of inverters added.

Figure 9:
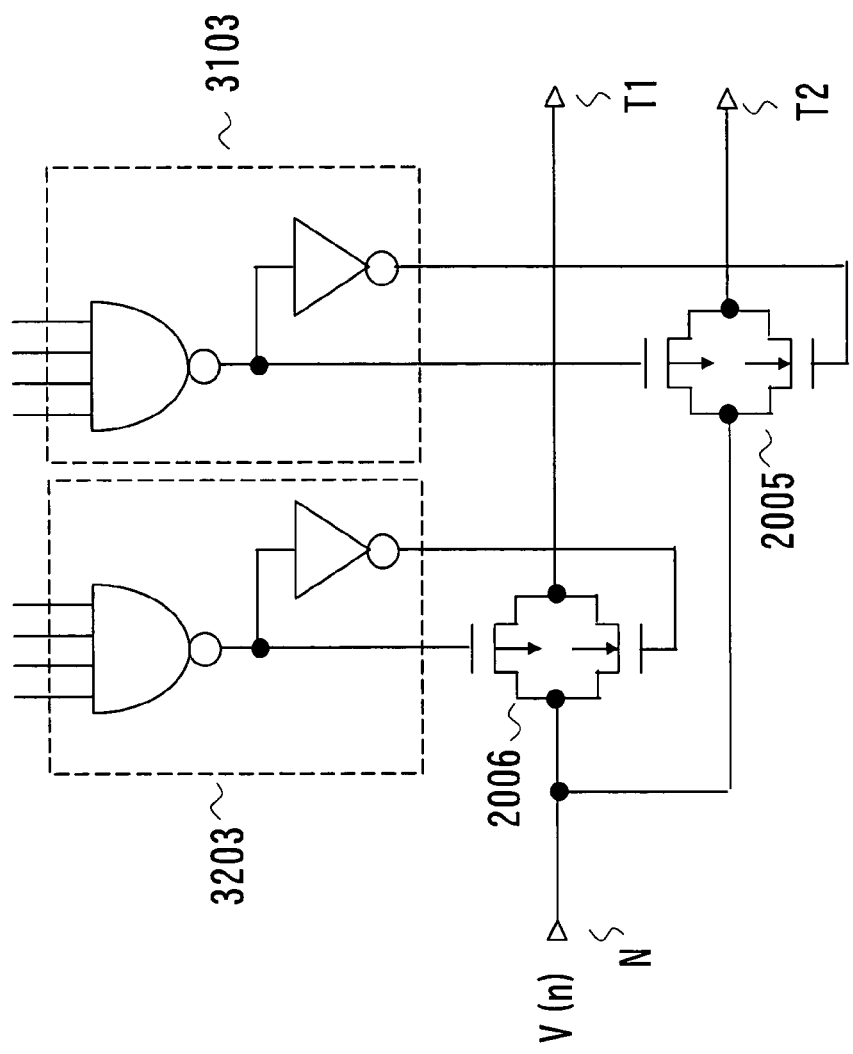
FIG. 9 is a diagram illustrating a modification of FIG. 7.

FIG. 9 also is a diagram illustrating a modification of FIG. 7. Here the P-channel transistor switches 2001 and 2002 are replaced by transfer gate switches 2005 and 2006 comprising P- and N-channel transistors, and the NAND gates 3101 and 3201 are replaced by circuits 3103 and 3203 each comprising a NAND gate and an inverter.

The arrangements of FIGS. 7 and 8 are applicable to a case where reference voltages are equal to or greater than a prescribed voltage or less than a prescribed voltage in the range of power-supply voltage. For example, the arrangements of FIGS. 7 and 8 are ideal for a DAC for dot-inversion drive in a liquid crystal display device. Dot-inversion drive of a liquid crystal display device provides a positive-polarity grayscale signal voltage for which the grayscale signal voltage that is output from the data driver is equal to or greater than the fixed voltage Vcom of the opposing substrate electrode, and a negative-polarity grayscale signal voltage for which the aforesaid grayscale signal voltage is less than the fixed voltage Vcom.

The arrangements of FIGS. 7 and 8 are ideal for positive and negative DACs, respectively. On the other hand, the arrangement of FIG. 9 is suited to a case where reference voltage covers the range of power-supply voltage. For example, it is ideal for use in a DAC for common-inversion drive in a liquid crystal display device.

With common-inversion drive of a liquid crystal display device, the voltage Vcom of the opposing substrate electrode has a potential that varies in accordance with polarity and therefore grayscale signal voltages of positive and negative polarities that are output from the data driver cover substantially identical voltage ranges. The arrangement of FIG. 9 is well suited for use in such a DAC.

Figure 10:
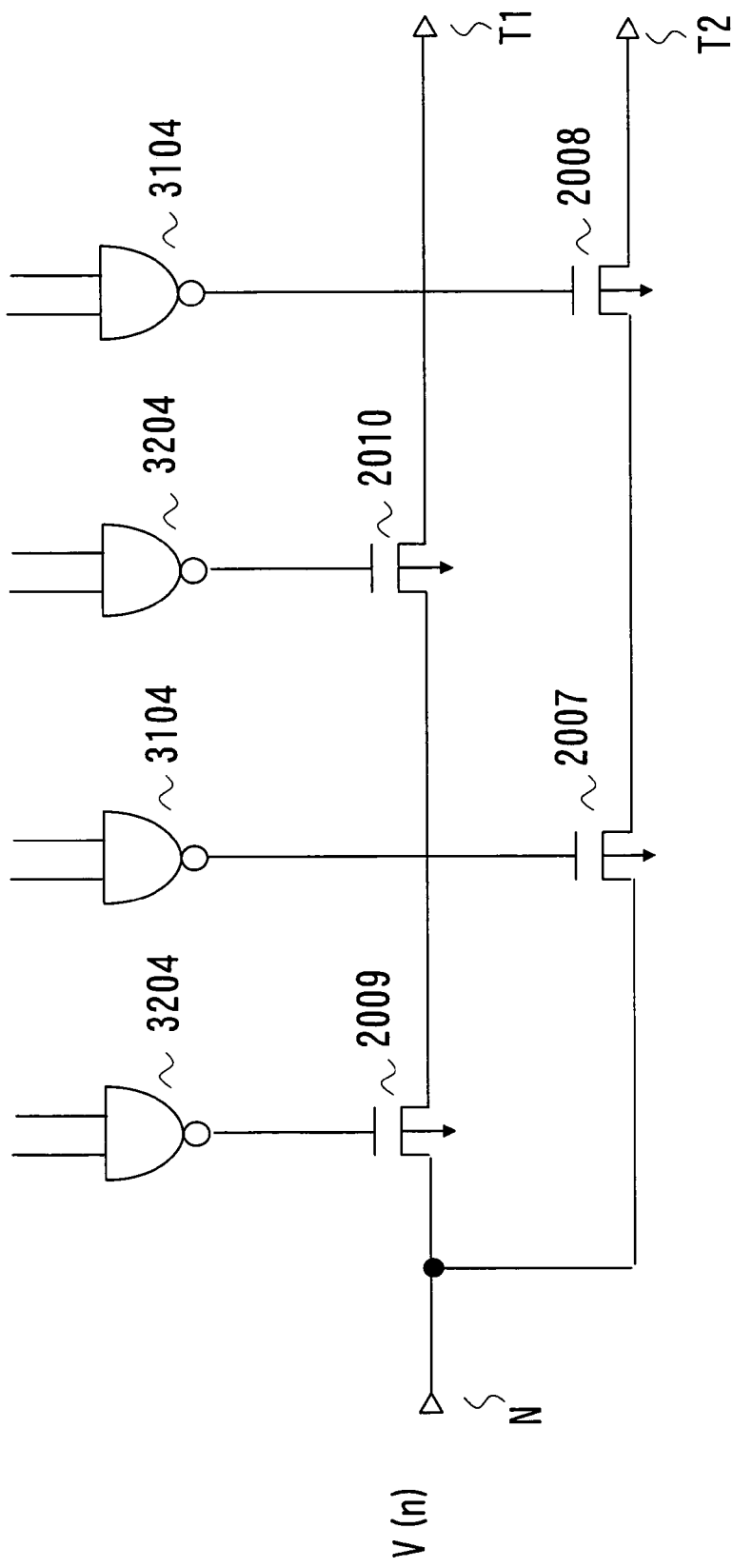
FIG. 10 is a diagram illustrating another example of the arrangement of the logic circuit 300 and switch group 200 in FIGS. 1 and 2.

FIG. 10 is a diagram illustrating another example of the arrangement of the logic circuit 300 and switch group 200 in FIGS. 1 and 2. In FIG. 10, the first and second logic circuits 310 and 320 of FIGS. 1 and 2 are such that the bit signals that are input to each are further divided into higher- and lower-order bit groups and a logic value is output for each higher-order bit group and each lower-order bit group.

As shown in FIG. 10, the circuit that selects the reference voltage V(n) and outputs the selected voltage to the terminals T1 and T2 includes transistor switches 2007 and 2008 connected in series between the terminal N, which supplies the reference voltage V(n), and the terminal T2, and transistor switches 2009 and 2010 connected between the supply terminal N and the terminal T1.

The arrangement further includes element circuits 3104 of the first logic circuit 310 that output logic values to the control ends of switches 2007 and 2008 based upon lower-order bits [B(2L−1), . . . , and B1] and higher-order bits [B(2K−1), . . . , and B(2L+1)], respectively, of the odd-numbered bit signals [B(2K−1), . . . , B3 and B1]; and element circuits 3204 of the second logic circuit 320 that output logic values to the control ends of switches 2009 and 2010 based upon lower-order bits [B(2L), . . . , and B2] and higher-order bits [B(2K), . . . , and B(2L+2)], respectively, of the even-numbered bit signals [B(2K), . . . , B4, and B2].

More specifically, the switches 2007 to 2010 are formed by P-channel transistor switches, and the logic circuits 3104 and 3204 are each formed by two NAND gates.

The bit signals that are input to the two NAND gates 3104 and 3204 are either positive signals or complementary signals thereof. The logic value that is output becomes "0" only when all input signals are "1", at which time the P-channel transistor switch is turned on.

By adopting a plurality of switches connected between the supply terminal N for the reference voltage V(n) and the terminals T1 and T2, the arrangement of FIG. 10 is capable of simplifying the configuration of the switch-controlling logic circuits in comparison with that shown in FIG. 7. Further, by consolidating and sharing logic circuits for which the input bits are common, it is possible to reduce the overall number of elements of the logic circuits.

Figure 11A:
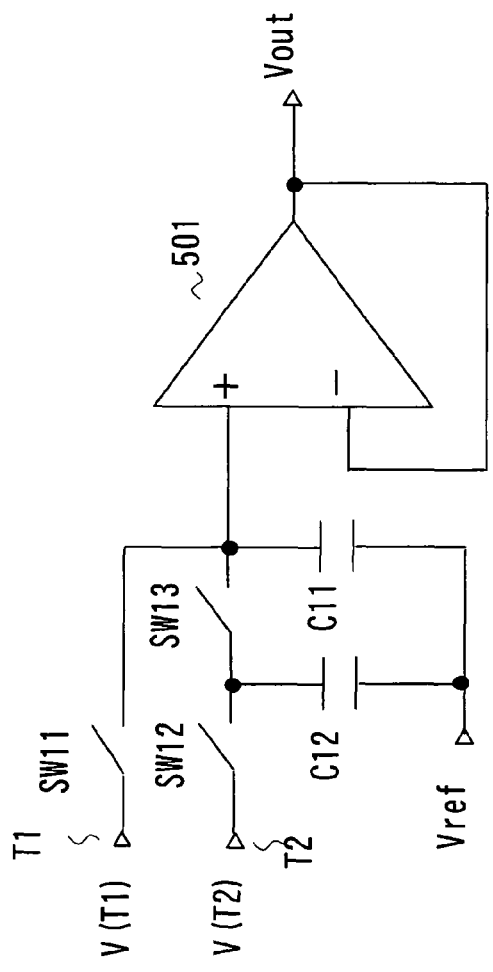
FIGS. 11A and 11B are diagrams illustrating an example of the structure of the operational amplifier circuit 500 of FIGS. 1 and 2, FIG. 11A showing an operational amplifier circuit for amplifying and outputting a voltage obtained by internally dividing (interpolating) voltages at terminals T1 and T2 with a 1:2 ratio.

FIG. 11A is a diagram illustrating an example of the structure of the operational amplifier circuit 500 shown in FIGS. 1 and 2. The operational amplifier circuit amplifies and outputs a voltage obtained by internally dividing (interpolating) voltages of the terminals T1 and T2 with a 1:2 ratio. The operational amplifier circuit 500 includes a switch SW11 having one end connected to the terminal T1; a capacitor C11 connected between the other end of the switch SW11 and the reference voltage Vref; a switch SW12 having one end connected to the terminal T2; a capacitor C12 connected between the other end of the switch SW12 and the reference voltage Vref; and a switch SW13 connected between the other end of the switch SW12 and the other end of switch SW11. The node at which the switches SW11, SW13 and capacitor C11 are connected is connected to the non-inverting input terminal (+) of a differential amplifier 501. The latter constructs a voltage follower the output terminal of which is connected to the inverting input terminal (−) of the amplifier.

Figure 11B:
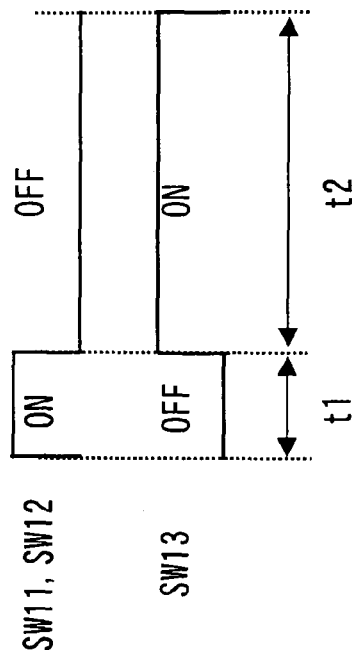

FIG. 11B is a diagram illustrating ON/OFF control of the switches SW11, SW12 and SW13.

When the switches SW11 and SW12 are ON and SW13 is OFF over time period t1, the voltages V(T1) and V(T2) are applied upon the capacitors C11 and C12, respectively, at one end thereof. When the switches SW11 and SW12 are OFF and the switch SW13 is ON over time period t2, the voltage at the non-inverting input terminal of the differential amplifier 501 is decided by charge redistribution. This voltage is amplified and output as the voltage Vout from the output terminal of the differential amplifier 501. The following equation holds in view of the charge storage rule of capacitors C11 and C12 over time periods t1 and t2:

$$C11 \cdot V(T1) + C12 \cdot V(T2) = (C11 + C12) \cdot Vout$$

If the capacitors C11 and C12 are set to capacitance values having a 2:1 ratio, the following equation is derived from the above equation and is identical with Equation (1):

$$Vout = \{C11 \cdot V(T1) + C12 \cdot V(T2)\} / (C11 + C12)$$
$$= \{2 \cdot V(T1) + V(T2)\}/3$$

The arrangement of FIG. 11A does not require a large number of capacitors and a large number of switches and can be implemented by the two capacitors C11 and C12 and just a small number of switches. Repetitive operation is unnecessary and driving time is curtailed by time period t1 only. As a consequence, this arrangement is well suited for use in the DAC of a data driver in a high-definition, rapidly driven large-screen display device.

FIGS. 12A and 12B and FIGS. 13A and 13B are diagrams illustrating examples of the operational amplifier circuit 500 of FIGS. 1 and 2. Each of these operational amplifier circuits amplifies and outputs a voltage obtained by externally dividing (extrapolating) the voltages V(T1) and V(T2) at the terminals T1 and T2 with a 1:2 ratio.

Each of these operational amplifier circuits has a capacitor and a differential amplifier and means for exercising control so as to apply a difference voltage between reference voltages, which are supplied to the terminals T1 and T2, as voltage across the terminals of the capacitor, and add or subtract the voltage across the terminals of the capacitor to or from one reference voltage of the reference voltages at terminals T1 and T2, thereby outputting a voltage that is the result of externally dividing the reference voltages applied to the terminals T1 and T2.

Figure 12A:
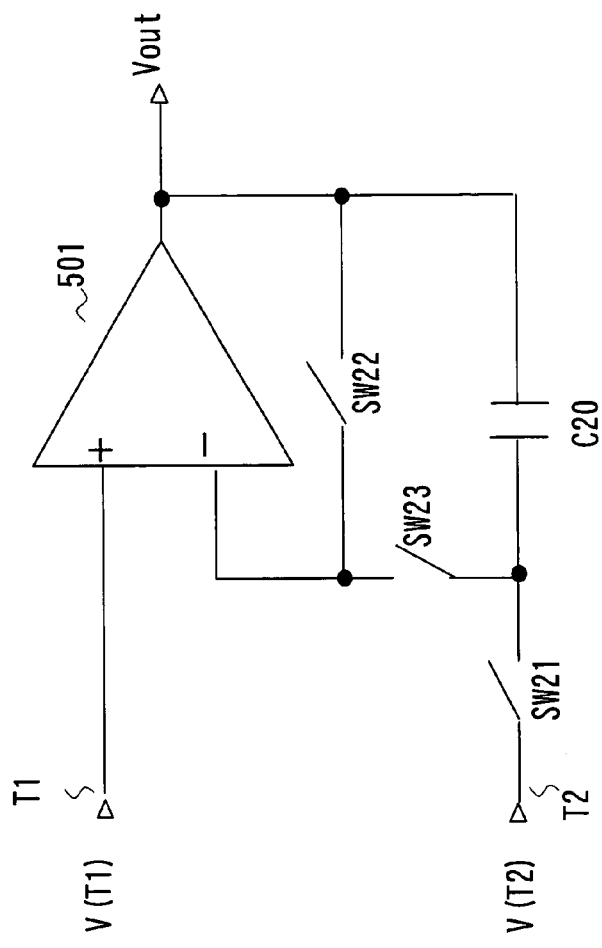
FIG. 12A is a diagram illustrating an example of the structure of the operational amplifier circuit 500 of FIGS. 1 and 2, FIG. 12A showing the structure of an operational amplifier circuit for amplifying and outputting a voltage obtained by externally dividing (extrapolating) voltages V(T1) and V(T2) at terminals T1 and T2 with a 1:2 ratio.
Figure 12B:
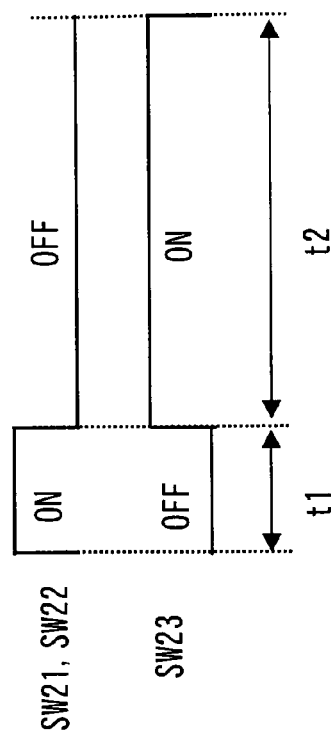
FIG. 12B is a diagram illustrating ON/OFF control of a switch.

FIG. 12A is a diagram illustrating an example of the structure of the operational amplifier circuit 500. FIG. 12B illustrates the ON/OFF control state in one output interval of first to third switches SW21, SW22 and SW23. The first terminal T1 is connected to the non-inverting input terminal (+) of the differential amplifier 501, which is an operational amplifier or the like. The operational amplifier circuit of FIG. 12A includes the switch SW22 having one end connected to the inverting input terminal (−) of the differential amplifier 501 and having its other end connected to the output terminal Vout; the switch SW23 having one end connected to the inverting input terminal of the differential amplifier 501 and having its other end connected to one end of a capacitor C20; and the switch SW21 having one end connected to the second terminal T2 and having its other end connected to the node of capacitor C20 and switch SW23. The capacitor C20 is connected between the node of switches SW21 and SW23 and the output terminal Vout.

If switch SW23 is turned OFF and switches SW21 and SW22 are turned ON over time period t1 in FIG. 12B, then the output terminal voltage Vout of the differential amplifier 501 constituting the voltage follower is made the terminal voltage V(T1) at the non-inverting input terminal (+) and the voltage V(T1) is applied upon the end of the capacitor C20 connected to the output terminal. Further, the voltage V(T2) at the second terminal T2 is applied upon the other end of capacitor C20 (namely the node at which the switches SW21 and SW23 are connected). As a result, the voltage across the terminals of capacitor C20 for which the side of the output terminal is the reference is as follows:

$$\Delta V = V(T2) - V(T1) \tag{25}$$

Next, if switches SW21 and SW22 are turned OFF and switch SW23 is turned ON over time period t2, the circuit becomes one in which the capacitor C20 is connected between the output terminal of the differential amplifier 501 and the inverting input terminal (−), and a voltage (Vout+ΔV) is applied across the inverting input terminal (−). Further, since the differential amplifier 501 composing the voltage follower attains a stable state when the voltages applied upon the non-inverting input terminal (+) and inverting input terminal (−) become equal, the relation indicated by Equation (26) below holds.

$$V(T1) = (Vout + \Delta V) \tag{26}$$

Solving for Vout using the relations of Eqs. (25) and (26) involving ΔV gives the following:

$$Vout = 2 \cdot V(T1) - V(T2) \tag{27}$$

The output voltage Vout is the result of externally dividing the first terminal voltage V(T1) and second terminal voltage V(T2) at the 1:2 ratio.

In a case where the first terminal voltage is lower than the second terminal voltage [V(T1)<V(T2)], the output terminal voltage Vout is externally divided (extrapolated) to a potential side lower than the first terminal voltage V(T1). In a case where the first terminal voltage is higher than the second terminal voltage [V(T1)>V(T2)], the output terminal voltage Vout is externally divided (extrapolated) to a potential side higher than the first terminal voltage V(T1).

Figure 13A:
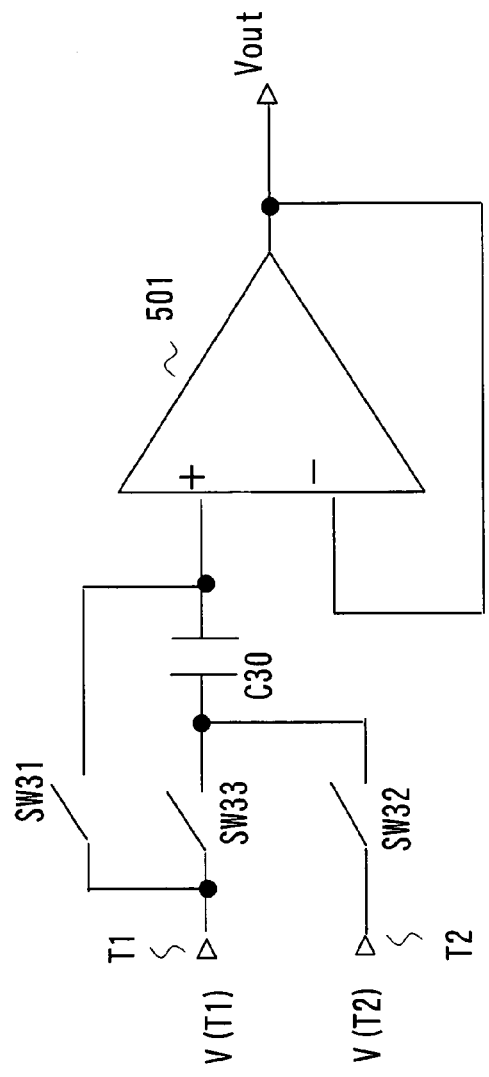
FIG. 13A is a diagram illustrating an example of the structure of the operational amplifier circuit 500 of FIGS. 1 and 2, FIG. 13A showing the structure of an operational amplifier circuit for amplifying and outputting a voltage obtained by externally dividing (extrapolating) voltages V(T1) and V(T2) at terminals T1 and T2 with a 1:2 ratio.
Figure 13B:
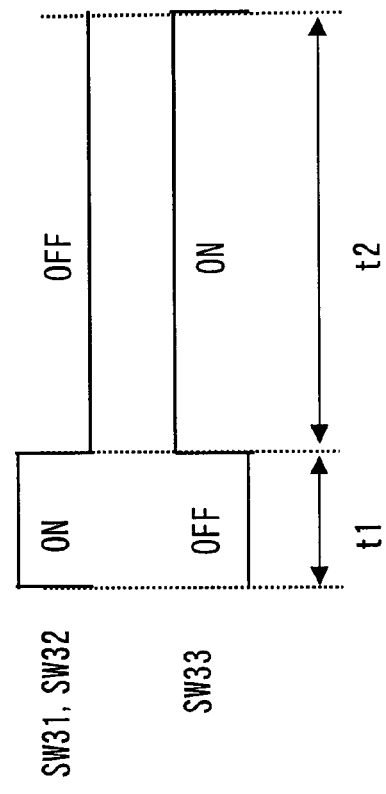
FIG. 13B is a diagram illustrating ON/OFF control of a switch.

FIG. 13A is a diagram illustrating an example of the structure of the operational amplifier circuit 500. FIG. 13B illustrates the ON/OFF control state in one output interval of switches SW31, SW32 and SW33 in FIG. 13A. As shown in FIG. 13A, the operational amplifier circuit includes the switch SW13 having one end connected to the terminal T1 and having its other end connected to the non-inverting input terminal (+) of the differential amplifier 501 such as operational amplifier; the switch SW33 having one end connected to the terminal T1 and having its other end connected to one end of the capacitor C30; and the switch SW32 having one end connected to the terminal T2 and its other end connected to one end of the capacitor C30. The other end of the capacitor C30 is connected to the non-inverting input terminal (+), and the output terminal is connected to the inverting input terminal (−).

If switch SW33 is turned OFF and switches SW31 and SW32 are turned ON over time period t1, as shown in FIG. 13B, the voltage V(T1) of the first terminal T1 is applied upon the non-inverting input terminal (+), the voltage V(T2) of the second terminal T2 is applied upon one end of the capacitor C30 (namely the node at which the switches SW32 and SW33 are connected), and the voltage across the terminals of capacitor C30 for which the side of the non-inverting input terminal (+) is the reference is as follows:

$$\Delta V = V(T2) - V(T1) \tag{28}$$

Next, if switches SW31 and SW32 are turned OFF and switch SW33 is turned ON over time period t2, the circuit becomes one in which the capacitor C30 is connected between the terminal T1 and the non-inverting input terminal (+), and a voltage {V(T1)−ΔV} is applied across the non-inverting input terminal (+). Accordingly, the voltage at the non-inverting input terminal (+) is output as the output terminal voltage Vout of the differential amplifier 501 constituting the voltage follower and the relation indicated by Equation (29) below holds.

$$Vout = V(T1) - \Delta V \tag{29}$$

Solving for Vout using the relations of Eqs. (28) and (29) involving ΔV gives the following:

$$Vout = 2 \cdot V(T1) - V(T2) \tag{30}$$

The output voltage Vout is the result of externally dividing the first terminal voltage V(T1) and second terminal voltage V(T2) at the 1:2 ratio.

In a case where the first terminal voltage is lower than the second terminal voltage [V(T1)<V(T2)], the output terminal voltage Vout is externally divided (extrapolated) to a potential side lower than the first terminal voltage V(T1). In a case where the first terminal voltage is higher than the second terminal voltage [V(T1)>V(T2)], the output terminal voltage Vout is externally divided (extrapolated) to a potential side higher than the first terminal voltage V(T1).

FIGS. 11A to 13A illustrate typical examples of arrangements of the operational amplifier circuit 500 of FIGS. 1 and 2 that include capacitors and switches. Recently, however, higher tonality for improved display quality in demand and this has been accompanied by demand for output that exhibits higher definition. To accomplish this, various functions for raising definition can be added to the arrangements of FIGS. 11A to 13A.

Figure 14A:
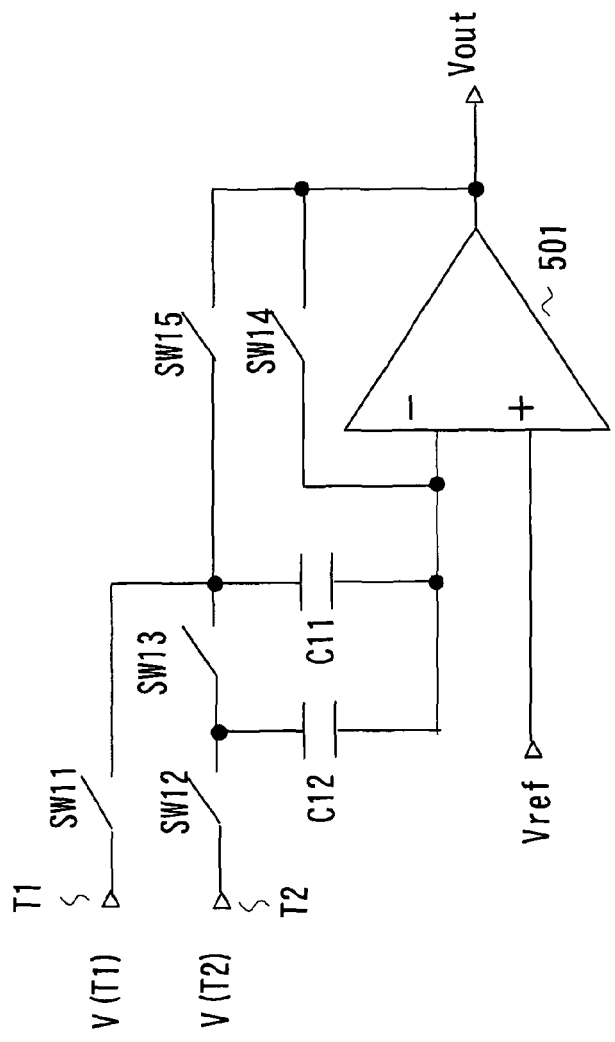
FIGS. 14A and 14B are diagrams illustrating an example of the operational amplifier circuit 500 having a function for compensating for output offset of a differential amplifier in FIGS. 11A and 11B, this circuit being obtained by raising the accuracy of the operational amplifier circuit of FIGS. 11A and 11B.

FIG. 14A illustrates an example of the operational amplifier circuit 500 having a function for compensating for output offset of the differential amplifier in FIGS. 11A and 11B, this circuit being obtained by raising the accuracy of the operational amplifier circuit of FIGS. 11A and 11B. As shown in FIG. 14A, this operational amplifier circuit includes the differential amplifier 501 having the reference voltage Vref applied to its non-inverting input terminal (+) and one ends of capacitors C11 and C12 connected to its inverting input terminal (−); the switch SW11 connected between the terminal T1 and the other end of the capacitor C11; the switch SW12 connected between the terminal T2 and the other end of the capacitor C12; the switch SW13 connected between the node of switch SW11 and capacitor C11 and the node of switch SW12 and capacitor C12; a switch SW14 connected between the output terminal of the differential amplifier 501 and the inverting input terminal (−); and a switch SW15 connected between the output terminal of the differential amplifier 501 and the node of switch SW11 and capacitor C11. It should be noted that the capacitance ratio between capacitors C11 and C12 is 2:1.

Figure 14B:
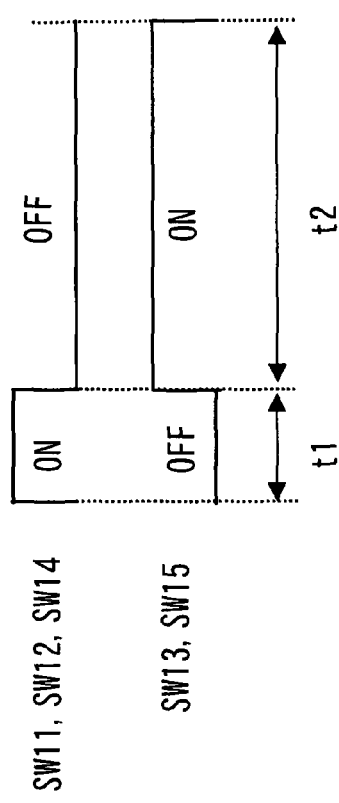

FIG. 14B is a diagram illustrating ON/OFF control of the switches SW11, SW12, SW13, SW14 and SW15. If the switches SW11, SW12, SW14 are turned ON and the switches SW13 and SW15 are turned OFF over the time period t1, then the voltage at the ends of the capacitors C11 and C12 connected to the inverting input terminal (−) of the differential amplifier 501 becomes a voltage (Vref+Δ) that includes an offset with respect to the reference voltage Vref, and the voltage at the other end of the capacitors C11 and C12 becomes the voltages V(T1) and V(T2), respectively, applied thereto. If switches SW11, SW12, SW13 and SW14 are turned OFF and switches SW13 and SW15 are turned ON over time period t2, then the voltage difference between the output terminal and inverting input terminal (−) of the differential amplifier 501 is decided by charge redistribution between capacitors C11 and C12. The following equation holds in view of the charge storage rule of capacitors C11 and C12 over time periods t1 and t2:

$$C11 \cdot \{V(T1) - (Vref+\Delta)\} + C12 \cdot \{V(T2) - (Vref+\Delta)\} = (C11+C12) \cdot \{Vout - (Vref+\Delta)\}$$

If the (Vref+Δ) terms are cancelled out and the capacitance ratio between capacitors C11 and C12 is 2:1, then, in view of the equation cited above, Vout is given by the following equation, which is identical with Equation (1).

$$Vout = \{C11 \cdot V(T1) + C12 \cdot V(T2)\}/(C11 + C12)$$
$$= \{2 \cdot V(T1) + V(T2)\}/3$$

Thus, the operational amplifier circuit of FIG. 14A is independent of output offset of the differential amplifier 501, and a voltage that is the result of internally dividing (interpolating) the voltages at the terminals T1 and T2 at a ratio of 1:2.

Figure 15:
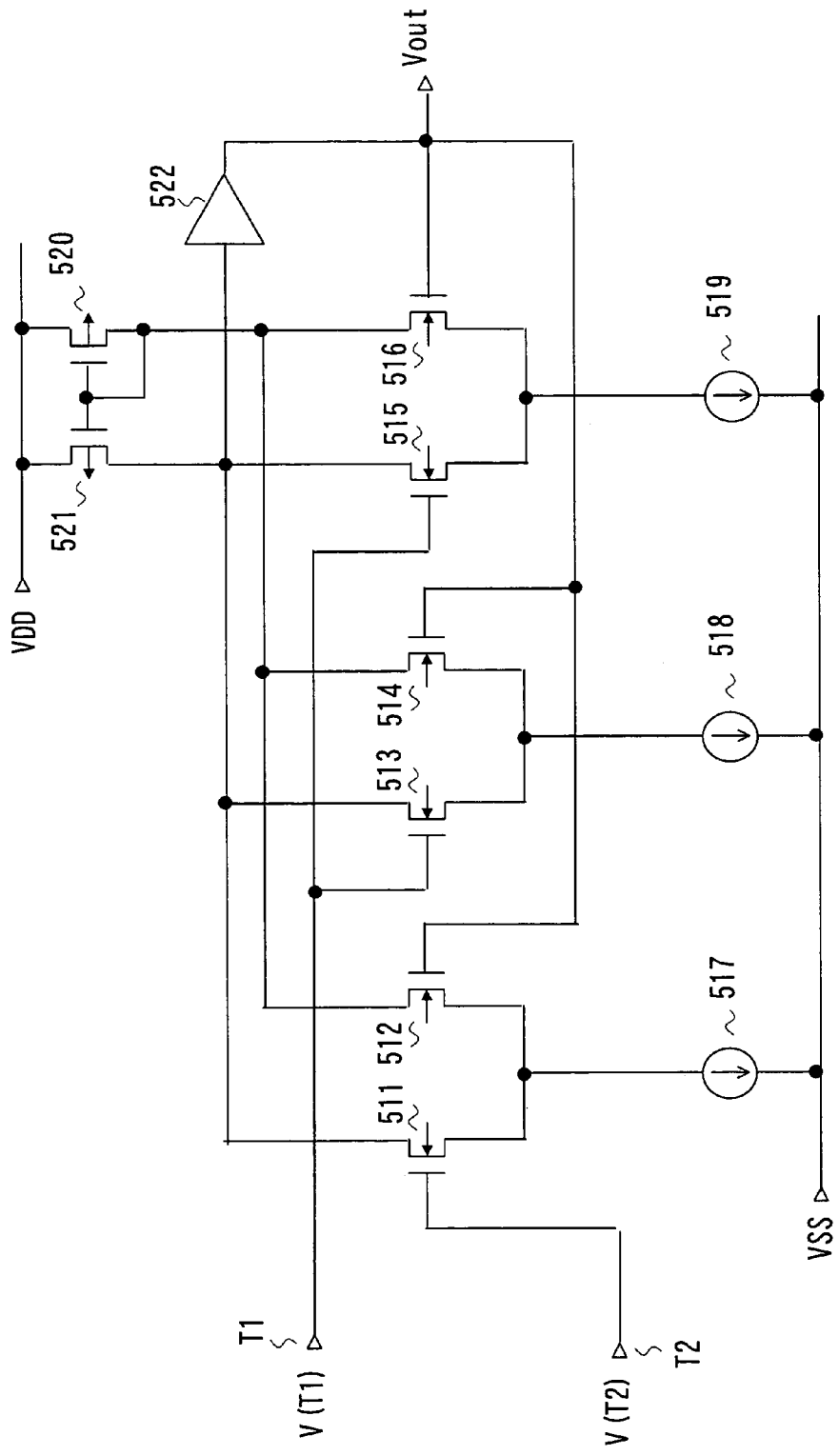
FIG. 15 is a diagram illustrating another example of the structure of the operational amplifier circuit 500 of FIGS. 1 and 2, FIG. 15 showing an operational amplifier circuit for amplifying and outputting a voltage obtained by internally dividing (interpolating) voltages V(T1), V(T2) at terminals T1 and T2 with a 1:2 ratio.

FIG. 15 is a diagram illustrating another example of the structure of the operational amplifier circuit 500 of FIGS. 1 and 2, FIG. 15 showing an operational amplifier circuit for amplifying and outputting a voltage obtained by internally dividing (interpolating) the voltages V(T1) and V(T2) at the terminals T1 and T2 with a 1:2 ratio. FIG. 15 illustrates an arrangement in which the amplifier section of Patent Document 2 (FIG. 2 of the specification of U.S. Pat. No. 6,246,451) is applied. The amplifier section of Patent Document 2 has a plurality of differential pairs in which one member of the input pair is connected to the output end. By selectively inputting two voltages to the other member of the input pair of each of the differential pairs, it is possible to output a plurality of voltage levels that are the result of equally dividing the two voltages.

With the arrangement of FIG. 15 of the present invention, on the other hand, the voltages at terminals T1 and T2 need only be internally divided (interpolated) at the 1:2 ratio. This arrangement has three differential pairs in which one member of each of the input pairs is connected to the output end. The terminal T1 is fixedly connected to the other member of the input pair of each of two differential pairs, and the terminal T2 is fixedly connected to the other member of the input pair of one differential pair.

As shown in FIG. 15, this arrangement includes three differential pairs (differential transistor pair 511, 512 and current-source transistor 517; differential transistor pair 513, 514 and current-source transistor 518; differential transistor pair 515, 516 and current-source transistor 519) in which the output pairs are connected in common with a current mirror (comprising transistors 520 and 521) that forms a load circuit. The gates of transistors 511 and 512 that form the non-inverting input terminal and inverting input terminal of differential pair 511, 512 are connected to the terminal T2 and output terminal, respectively; the non-inverting input and inverting input (the gates of transistors 513 and 514) of differential pair 513, 514 are connected to the terminal T1 and output terminal, respectively; and the non-inverting input and inverting input (the gates of transistors 515 and 516) of differential pair 515, 516 are connected to the terminal T1 and output terminal, respectively. The voltage at the output end (the node at which the transistors 515 and 521 are connected) of the current mirror (transistors 520 and 521) is input to an amplifier 522 the output end whereof is connected to the output terminal.

In a case where the transistors of the three differential transistor pairs in FIG. 15 are transistors of the same size and the current sources (transistors 517, 518 and 519) that drive respective ones of the differential pairs are also set to be equal, a voltage obtained by interpolating the voltages V(T1) and V(T2) can be output as the output voltage Vout. It should be noted that the differential transistor pair 513 and 514 and current-source transistor 518 and the differential transistor pair 515 and 516 and current-source transistor 519 can be replaced by one differential transistor pair each transistor of which has double the channel width, and a current-source transistor having twice the amount of current.

Figure 16:
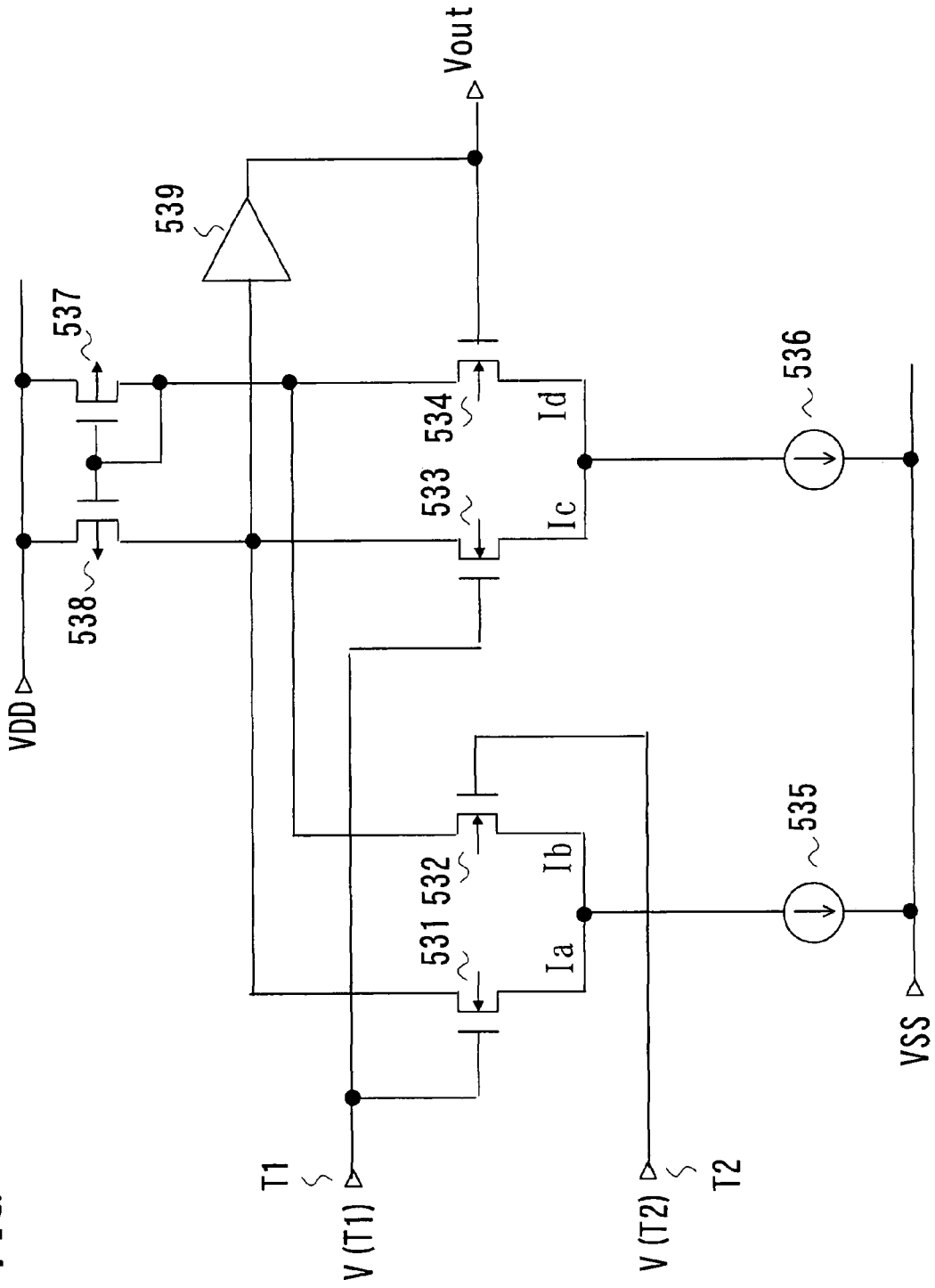
FIG. 16 is a diagram illustrating another example of the structure of the operational amplifier circuit 500 of FIGS. 1 and 2, FIG. 16 showing an operational amplifier circuit for amplifying and outputting a voltage obtained by externally dividing (extrapolating) voltages V(T1) and V(T2) of terminals T1, T2 with a 1:2 ratio.

FIG. 16 is a diagram illustrating a further example of the structure of the operational amplifier circuit 500 of FIGS. 1 and 2, FIG. 15 showing an operational amplifier circuit for amplifying and outputting a voltage obtained by externally dividing (extrapolating) the voltages V(T1) and V(T2) at terminals T1 and T2 with a 1:2 ratio. More specifically, the arrangement includes two differential pairs (a differential pair comprising a differential transistor pair 531 and 532 and a current-source transistor 535, and a differential pair comprising a differential transistor pair 533 and 534 and a current-source transistor 536) in which the output pairs are connected in common with a current mirror (comprising transistors 537 and 538) that forms a load circuit. The gates of transistors 531 and 532 that form the non-inverting input terminal and inverting input terminal of differential pair 531 and 532 are connected to the terminals T1 and T2, respectively, and the non-inverting input and inverting input (the gates of transistors 533 and 534) of differential pair 533, 534 are connected to the terminal T1 and output terminal, respectively. The voltage at the output end (the node at which the transistors 531, 533 and 538 are connected) of the current mirror (537, 538) is input to an amplifier 539 the output end whereof is connected to the output terminal.

In a case where the transistors of the two differential transistor pairs in FIG. 16 are transistors of the same size and the current sources (transistors 535 and 536) that drive respective ones of the differential pairs are also set to be equal, a voltage obtained by extrapolating the voltages V(T1) and V(T2) can be output as the output voltage Vout.

Figure 17:
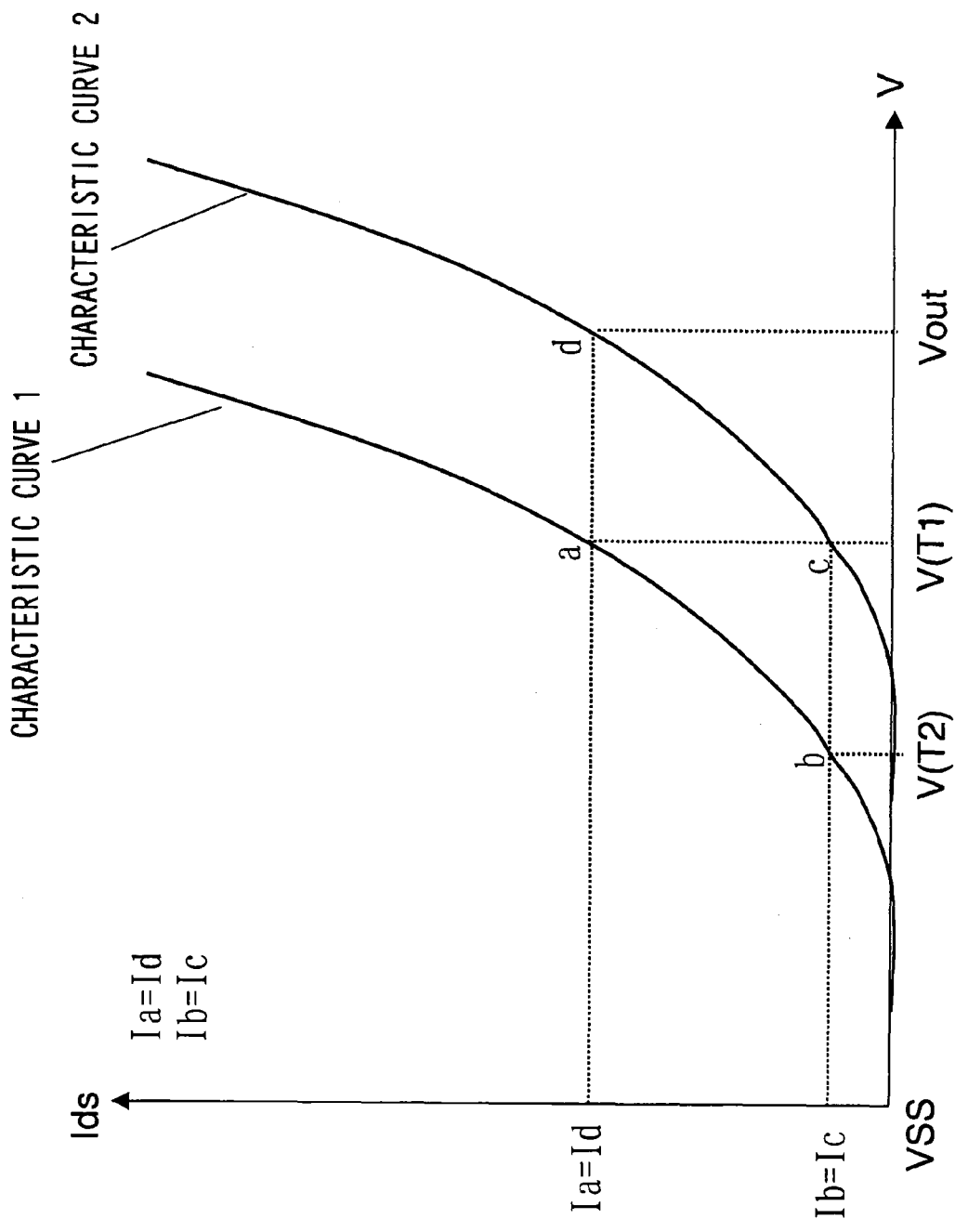
FIG. 17 is a diagram illustrating the relationship between a drain-source current IDs and voltage V.

Reference will be had to FIG. 17 to describe the principle whereby the arrangement of FIG. 16 externally divides (extrapolates) the voltages V(T1) and V(T2) at terminals T1 and T2 at the 1:2 ratio.

FIG. 17, which is a diagram useful in describing operation in a case where V(T1)>V(T2) holds, illustrates the relationship between a drain-source current Ids and voltage V. A characteristic curve 1 of the transistors 531 and 532 and a characteristic curve 2 of the transistors 533 and 534 are indicated. The operating points of the respective transistors reside on respective ones of the characteristic curves. It should be noted that the two characteristic curves are merely displaced from each other along the horizontal axis owing to the fact that the source potentials of respective ones of the two differential pairs vary individually.

If we let Ia, Ib, Ic and Id represent the currents (drain-source currents) that correspond to operating points a, b, c, and d of the transistors 531, 532, 533 and 534, respectively, Equations (31) and (32) below hold as the relationships among the currents of the transistors in FIG. 17.

$$Ia+Ib=Ic+Id \quad (31)$$

$$Ia+Ic=Ib+Id \quad (32)$$

Equation (31) is an equation derived owing to the fact that the currents that flow into the current sources 535 and 536 are equal, and Equation (32) is an equation derived owing to the fact that the input/output currents of the current mirrors (537, 538) are equal.

If the relations cited above are solved, Equation (33) below is derived.

$$Ia=Id, Ib=Ic \quad (33)$$

In view of Equation (33), the four operating points a, b, c and d are decided as indicated in FIG. 17. The operating points a and c of transistors 531 and 533 are such that V=V (T1) is common with respect to the horizontal axis V in FIG. 17. Accordingly, the figure connecting the four operating points is a parallelogram and sides ad and bc are equal. The output voltage Vout, therefore, becomes a voltage obtained by externally dividing (extrapolating) the voltages V(T1) and V(T2) at a ratio of 1:2.

Although FIG. 17 is a diagram illustrating operation in a case where V(T1)≧V(T2) holds, the output voltage Vout becomes a voltage obtained by externally dividing (extrapolating) the voltages V(T1) and V(T2) at a ratio of 1:2 similarly also in a case where V(T1)≦V(T2) holds.

Figure 18:
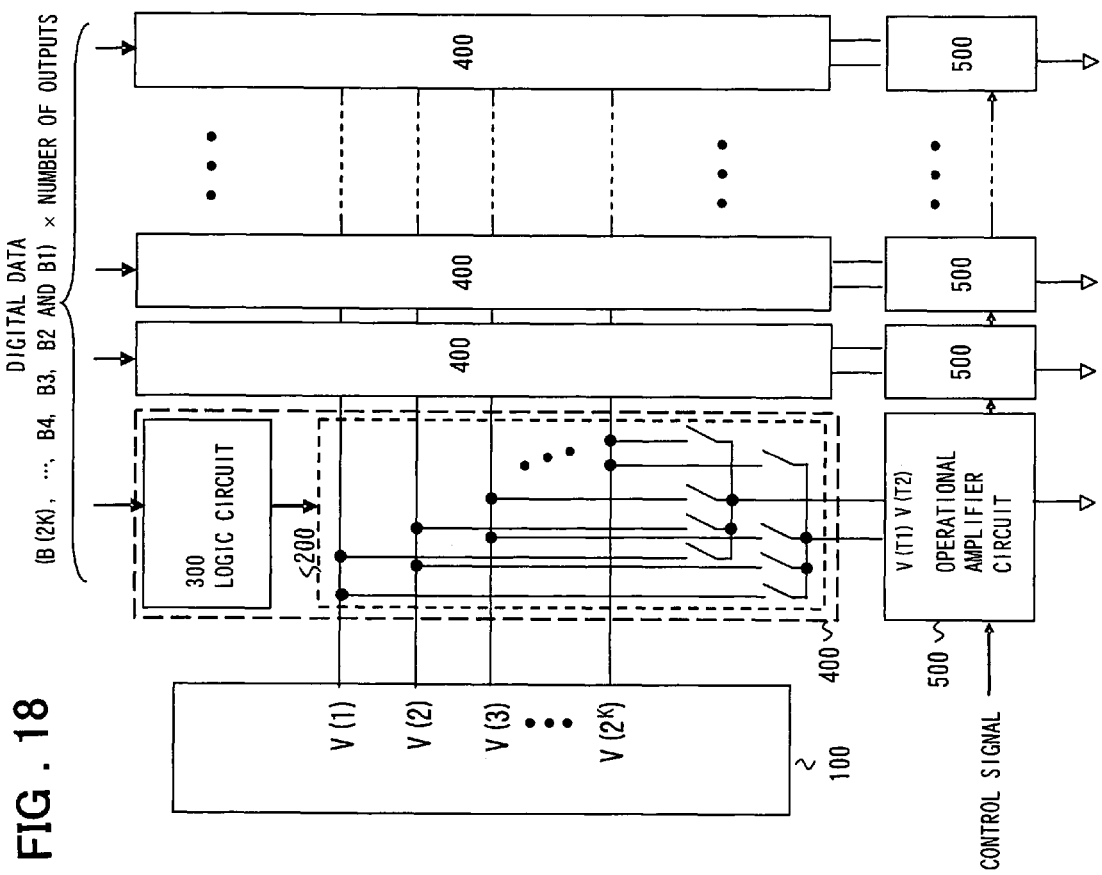
FIG. 18 is a diagram illustrating the structure of a multiple-output DAC according to an embodiment of the present invention.

FIG. 18 is a diagram illustrating the structure of a multiple-output DAC according to an embodiment of the present invention. The reference voltage generating circuit 100 can be shared with regard to a plurality of decoders 400 (comprising the logic circuit 300 and the switch group 200).

Figure 19:
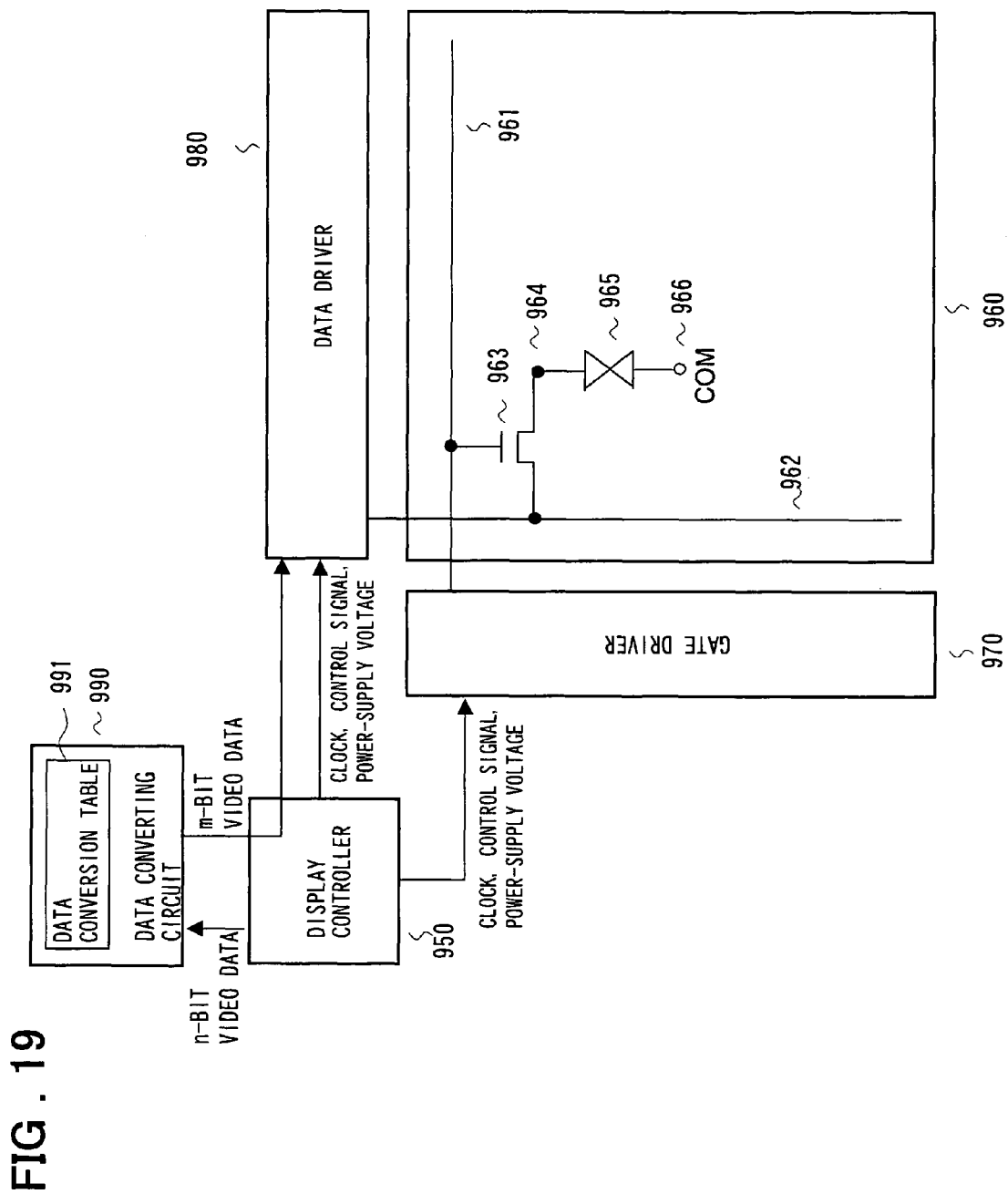
FIG. 19 is a diagram illustrating an embodiment of a display device according to the present invention.

FIG. 19 is a diagram illustrating an embodiment of a display device according to the present invention. The data driver 980 is a data driver of the present invention comprising the arrangement of FIG. 18. Here a linear output is obtained in response to an m (=2K)-bit data input.

The device of FIG. 19 includes a data conversion table 991 for converting n-bit data to m (m>n) bits, and a data converting circuit 990 for performing a data conversion based upon the data conversion table 991.

The data conversion table 991 ideally is one made to conform to the characteristics of each of R, G, B of the gamma curve of a liquid crystal or to those of an organic electroluminescence device. It will suffice if the data conversion table 991 and data converting circuit 990 are such that m (=2K)-bit data is input to the data driver 980, and it is simple to provide these in linkage with the display controller 950, as illustrated in FIG. 19.

Figure 20:
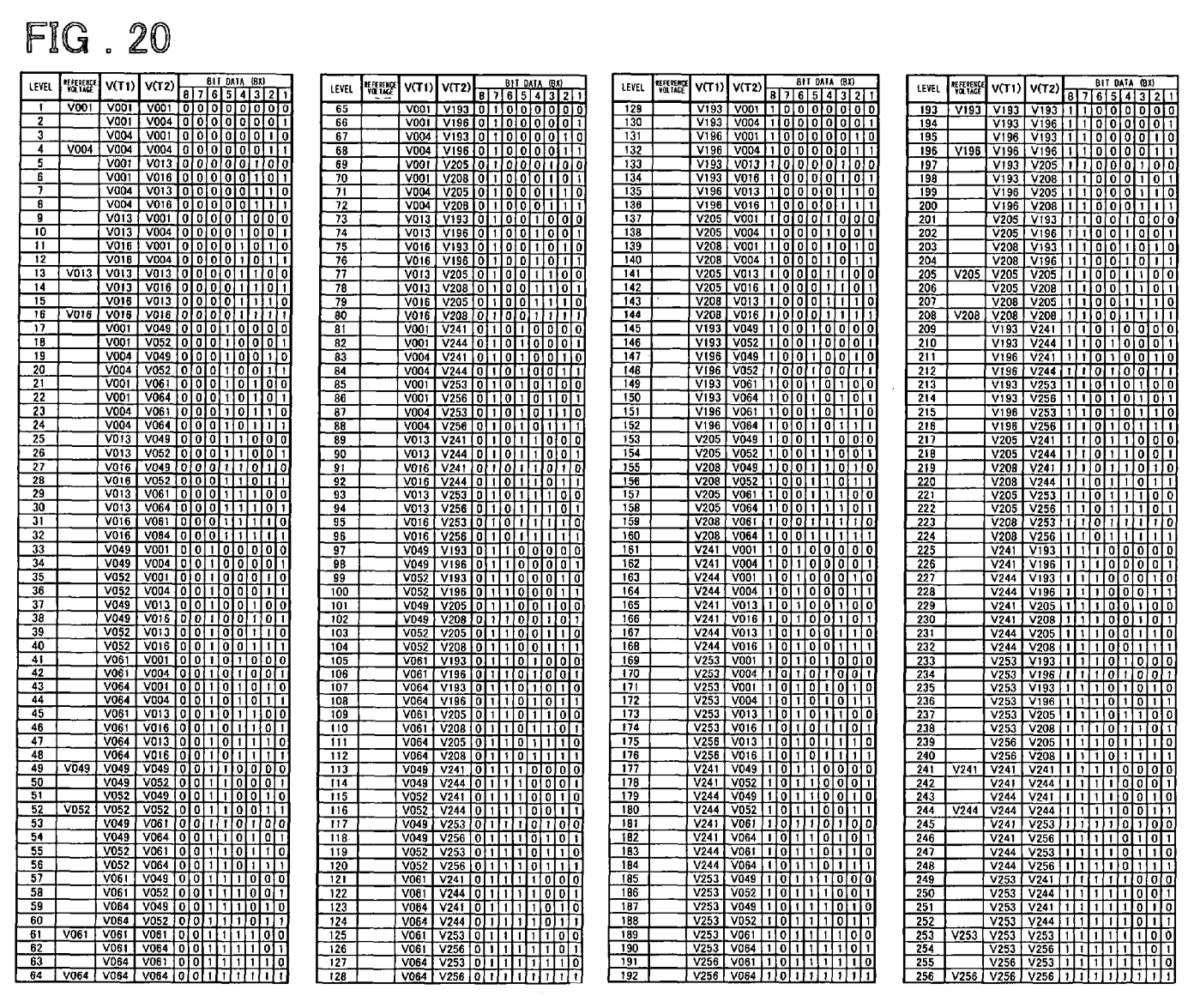

FIG. 20 is a diagram of input/output level correspondence of an 8-bit DAC according to the invention when the operational amplifier circuit 500 internally divides (interpolates) voltages V(T1) and V(T2) at terminals T1 and T2 with a 1:2 ratio and outputs the result.

FIG. 20 is obtained by expanding FIGS. 3A and 3B to eight bits. FIG. 20 is a diagram of input/output level correspondence in a case where 256 voltage levels are selected and output by K=4, i.e., 8-bit data (B8, B7, B6, B5, B4, B3, B2 and B1) in FIGS. 1 and 2. The number of reference voltages is 16 and the setting of levels is performed in accordance with Equation (2). The 16 reference voltages are to first, fourth, $13^{th}$, $16^{th}$, $49^{th}$, $52^{nd}$, $61^{st}$, $64^{th}$, $193^{rd}$, $196^{th}$, $205^{th}$, $208^{th}$, $241^{st}$, $244^{th}$, $253^{rd}$ and $256^{th}$ levels, respectively, and 256 voltage levels can be output linearly.

Figure 21:
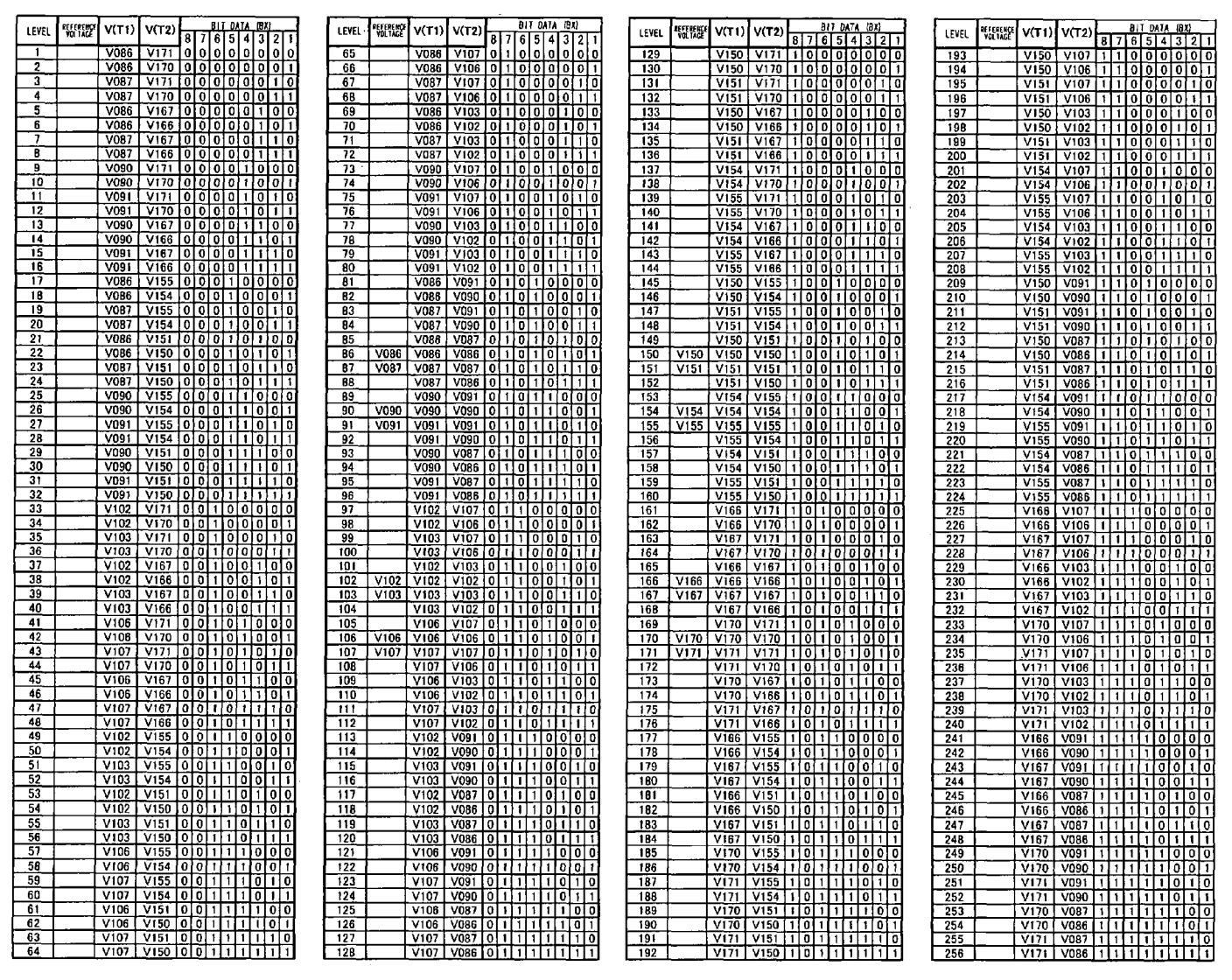

FIG. 21 is a diagram of input/output level correspondence of an 8-bit DAC according to the invention when the operational amplifier circuit 500 externally divides (extrapolates) voltages V(T1) and V(T2) at terminals T1 and T2 with a 1:2 ratio and outputs the result. FIG. 21 is obtained by expanding FIGS. 4A and 4B to eight bits. FIG. 21 is a diagram of input/output level correspondence in a case where 256 voltage levels are selected and output by K=4, i.e., 8-bit data (B8, B7, B6, B5, B4, B3, B2 and B1) in FIGS. 1 and 2. The number of reference voltages is 16 and the setting of levels is performed in accordance with Equation (4). The 16 reference voltages are to $86^{th}$, $87^{th}$, $90^{th}$, $91^{st}$, $102^{nd}$, $103^{rd}$, $106^{th}$, $107^{th}$, $150^{th}$, $151^{st}$, $154^{th}$, $155^{th}$, $166^{th}$, $167^{th}$, $170^{th}$ and $171^{st}$ levels, respectively, and 256 voltage levels can be output linearly.

In FIGS. 5 and 6, the DAC of the present invention is such that selection of reference voltage applied to terminal T1 is performed based upon the even-numbered bit signal, and the selection of reference voltage applied to terminal T2 is performed based upon the odd-numbered bit signal, as described above. FIGS. 22 and 23 are diagrams for selecting bit data when reference voltages corresponding to FIGS. 20 and 21, respectively, are selected and output to terminals T1 and T2.

Figure 24:
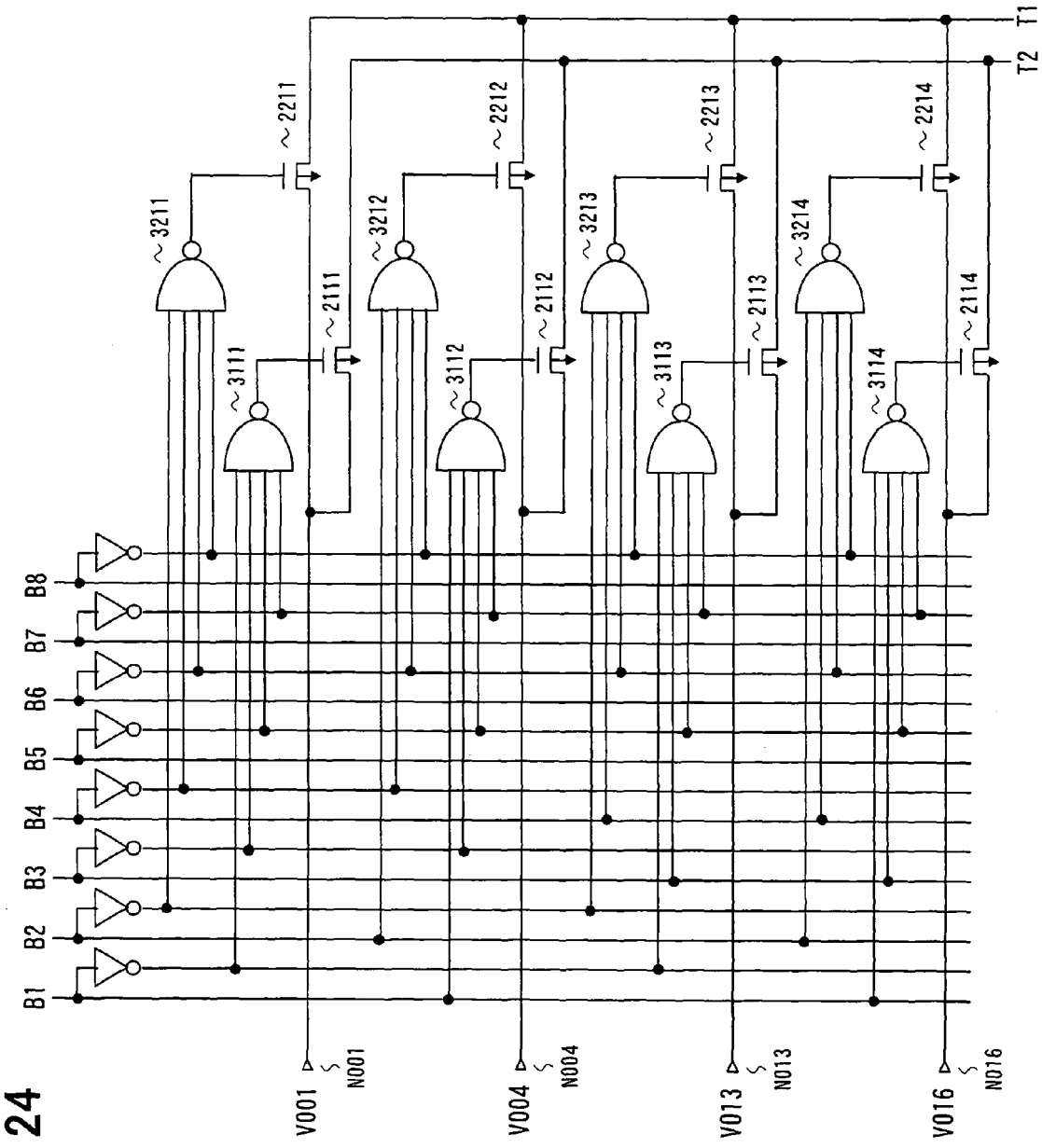
FIG. 24 is a diagram illustrating an example of the arrangement of a switch group and logic circuits for selectively outputting reference voltages V001, V004, V013 and V016, from among 16 reference voltages in FIG. 22, to terminals T1 and T2.

FIG. 24 is a diagram illustrating an example of the arrangement of a switch group and logic circuits for selectively outputting reference voltages V001, V004, V013 and V016, from among the 16 reference voltages in FIG. 22, to terminals T1 and T2. The switch group and logic circuits of FIG. 24 are constructed based upon FIG. 7. A switch 2211 is provided between a terminal N001 and the terminal T1, and a switch 2111 is provided between the terminal N001 and the terminal T2. The switches 2211 and 2111 are turned on and off by NAND gates 3211 and 3111, respectively. Signals that are the inverse of B2, B4, B6 and B8 are input to the NAND gate 3211, and signals that are the inverse of B1, B3, B5 and B7 are input to the NAND gate 3111. A switch 2214 is provided between a terminal N016 and the terminal T1, and a switch 2114 is provided between the terminal N016 and the terminal T2. The switches 2214 and 2114 are turned on and off by NAND gates 3214 and 3114, respectively. The signals of B2 and B4 and the signals that are the inverse of B6 and B8 are input to the NAND gate 3214, and the signals of B1 and B3 and signals that are the inverse of B5 and B7 are input to the NAND gate 3114.

Figure 25:
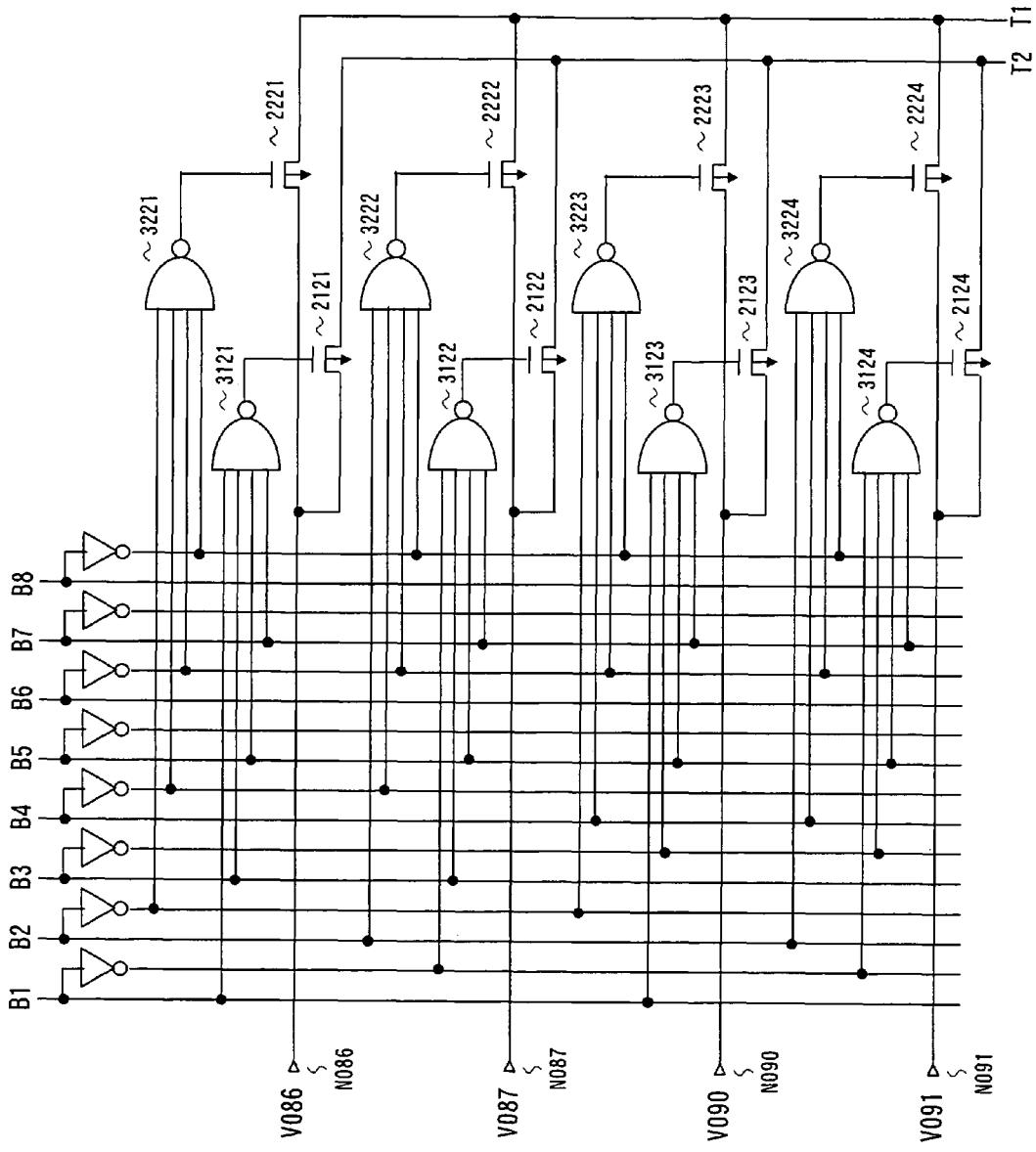
FIG. 25 is a diagram illustrating an example of the arrangement of a switch group and logic circuits for selectively outputting reference voltages V086, V087, V090 and V091, from among 16 reference voltages in FIG. 23, to terminals T1 and T2.

FIG. 25 is a diagram illustrating an example of the arrangement of a switch group and logic circuits for selectively outputting reference voltages V086, V087, V090 and V091, from among the 16 reference voltages in FIG. 23, to terminals T1 and T2. The switch group and logic circuits of FIG. 25 are constructed based upon FIG. 7.

Figure 26:
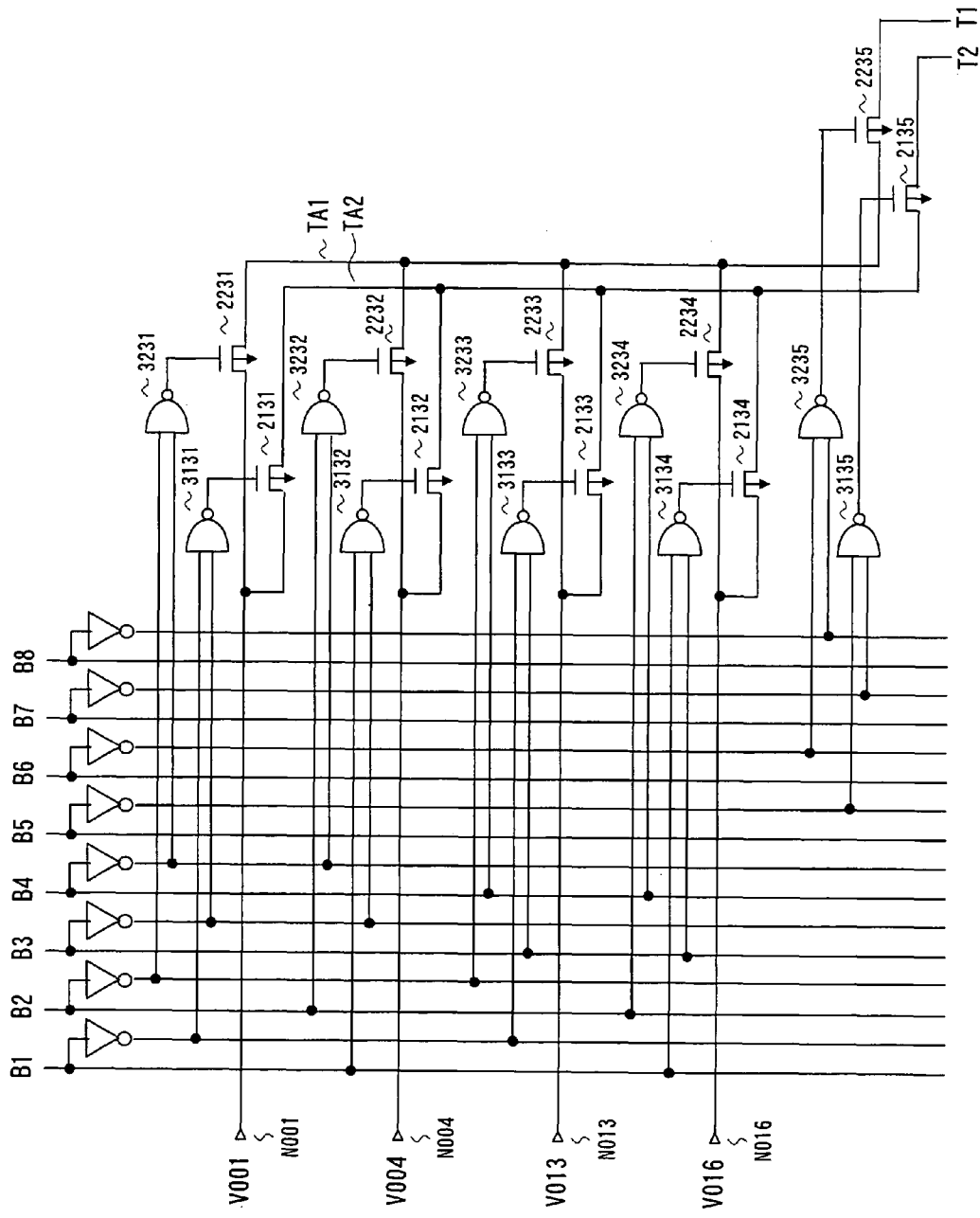
FIG. 26 is a diagram illustrating a modification of the arrangement of the switch group and logic circuits of FIG. 24.

FIG. 26 is a diagram illustrating an example of the arrangement of a switch group and logic circuits for selectively outputting reference voltages V001, V004, V013 and V016 to terminals T1, T2 in a manner similar to that of FIG. 24. The switch group and logic circuits of FIG. 26 are constructed based upon FIG. 10. In FIG. 26, odd-numbered bits (B7,B5, B3 and B1) are divided into lower-order bits (B3 and B1) and higher-order bits (B7,B5), and the even-numbered bits (B8, B6,B4 and B2) are divided into lower-order bits (B4 and B2) and higher-order bits (B8,B6).

Since the condition of the higher-order bits (B7 and B5) and (B8 and B6) for selecting the reference voltages V001, V004, V013 and V016 in FIG. 22 is (0,0) for both, it is possible to adopt an arrangement in which switches 2135 and 2235 and logic circuits 3135 and 3235 are shared with respect to respective ones of the lower-order bits. Such sharing enables a further reduction in number of elements.

Further, with regard to the lower-order bits as well, since (B3, B1) and (B4, B2) for selecting, e.g., the reference voltages V001, V049, V193, and V241 of FIG. 22 are (0,0), it is permissible to adopt an arrangement in which logic circuits 3131 and 3231 are shared and the outputs thereof are input to the control ends of respective ones of the corresponding switches.

Figure 27:
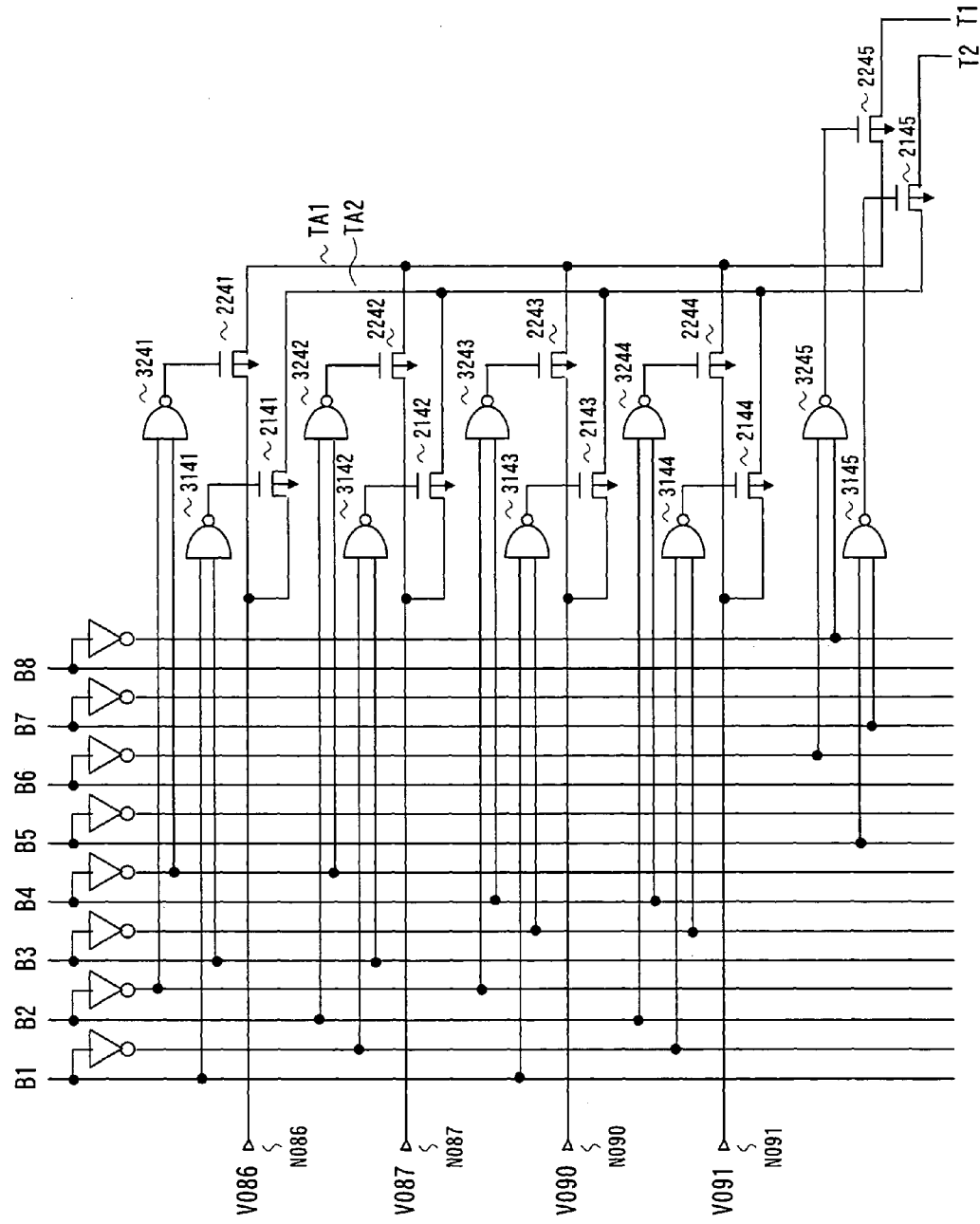
FIG. 27 is a diagram illustrating a modification of the arrangement of the switch group and logic circuits of FIG. 25.

FIG. 27 is a diagram illustrating an example of the arrangement of a switch group and logic circuits for selectively outputting reference voltages V086, V087, V090 and V091 to terminals T1 and T2 in a manner similar to that of FIG. 25. The switch group and logic circuits of FIG. 27 are constructed based upon FIG. 10. In FIG. 27 as well, odd-numbered bits (B7,B5,B3 and B1) are divided into lower-order bits (B3 and B1) and higher-order bits (B7 and B5), and the even-numbered bits (B8,B6,B4 and B2) are divided into lower-order bits (B4 and B2) and higher-order bits (B8 and B6). Since the conditions of the higher-order bits (B7, B5) and (B8, B6) for selecting the reference voltages V086, V087, V090 and V091 in FIG. 23 are (1, 1) and (0, 0) respectively, it is possible to adopt an arrangement in which switches 2145 and 2245 and logic circuits 3145 and 3245 are shared with respect to respective ones of the lower-order bits. Such sharing enables a further reduction in number of elements. Further, with regard to the lower-order bits as well, since (B3, B1) and (B4, B2) for selecting, e.g., the reference voltages V086, V102, V150 and V166 of FIG. 23 are (1,1) and (0,0), it is permissible to adopt an arrangement in which logic circuits 3141 and 3241 are shared and the outputs thereof are input to the control ends of respective ones of the corresponding switches.

The foregoing relates to a DAC in which a plurality of reference voltages are selectively output to the terminals T1 and T2 in parallel and the voltages V(T1) and V(T2) are operationally amplified at a fixed ratio of 1:2 and output. However, it is permissible to adopt an arrangement in which selective output to the terminals T1 and T2 is performed in a time serial. In such case respective ones of intervals for the selective output to the terminals T1 and T2 are provided and therefore real driving time is curtailed correspondingly. However, this curtailment of real driving time is sufficiently small in comparison with the serial DACs of FIGS. 40 and 41.

Further, since the number of elements constituting the logic circuits and switch group can be further reduced by a wide margin, this expedient is effective in reducing area.

Figure 28:
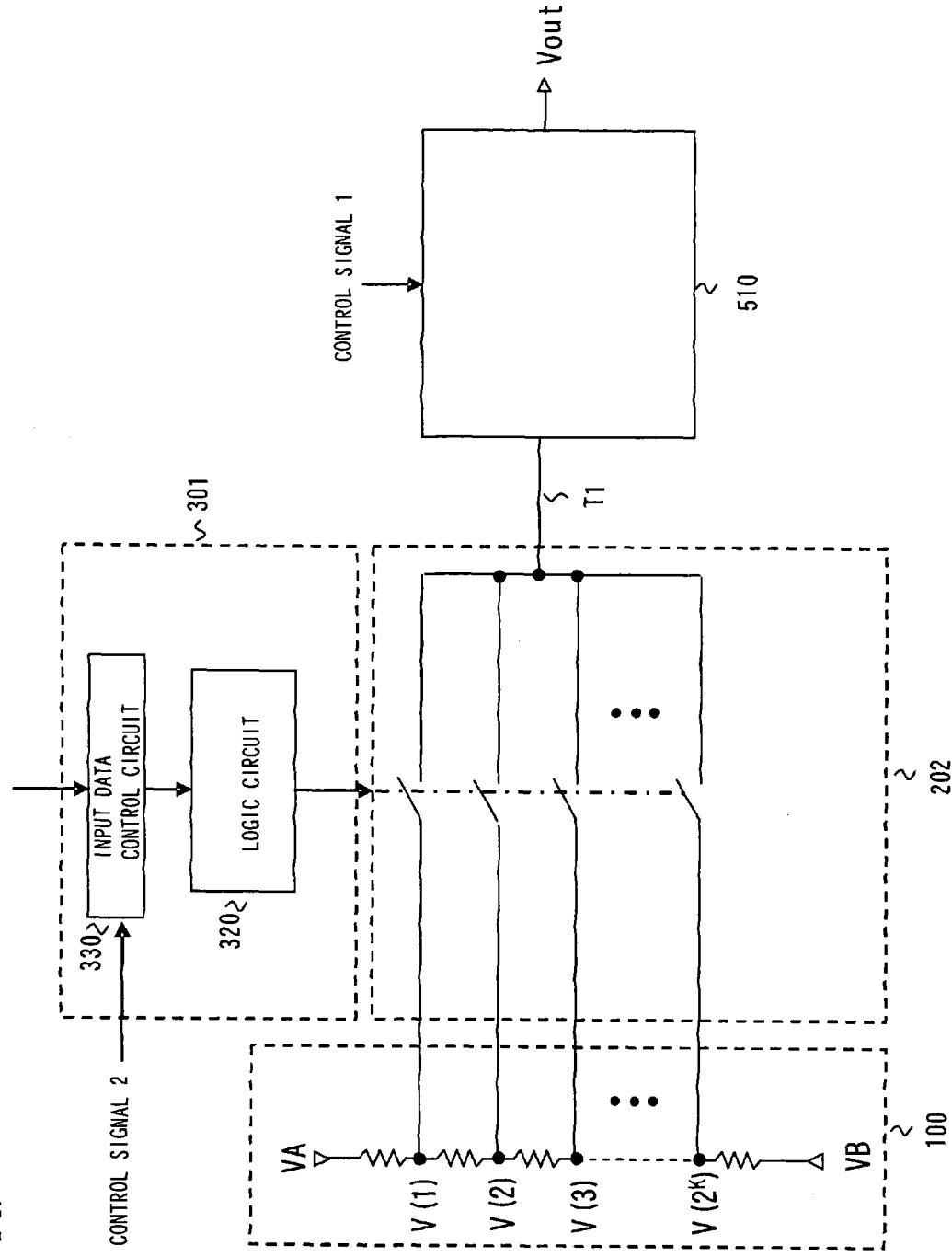
FIG. 28 is a diagram illustrating the structure of a DAC according to another embodiment of the present invention.

A DAC illustrated in FIG. 28 includes the reference voltage generating circuit 100 for generating $2^K$-number of reference voltages [V(1), V(2), ..., and V($2^K$)]; a logic circuit 301, which receives input of the 2K-bit digital signal [B(2K), B(2K–1), ..., B3, B2, and B1], these being divided into a bit group of even-numbered bits [B(2K), ..., B4 and B2] and a bit group of odd-numbered bits [B(2K–1), ..., B3 and B1], the logic circuit 301 outputting logic values serially for each of these bit groups; a switch group 202 for selecting reference voltages one at a time per each of the bit groups from among the $2^K$-number of reference voltages based upon the logic value; and an operational amplifier circuit 510, which includes a capacitor that holds at least one of two voltages that are supplied serially to the terminal T1, for amplifying and outputting a voltage obtained by internally dividing (interpolating) or externally dividing (extrapolating) these two voltages with a 1:2 ratio. The logic circuit 301 is constituted by an input data control circuit 330 and the logic circuit 320. It should be noted that the reference voltage generating circuit 100 has a structure similar to that shown in FIG. 1. A specific example of the operational amplifier circuit 510 will be described later with reference to FIGS. 29A and 29B to FIGS. 33A and 33B.

The arrangement shown in FIG. 28 is obtained by removing the terminal T2 and the first logic circuit 310 and first switch group 201, which participate in the selection of voltage applied to the terminal T2, from the arrangement of FIG. 1 and adding the input data control circuit 330 in front of the logic circuit 320.

The input data control circuit 330 divides the 2K-bit digital signal [B(2K), B(2K–1), ..., B3, B2 and B1] into even-numbered and odd-numbered bit groups and, based upon a control signal 2, outputs the data of respective ones of the bit groups to the logic circuit 320 in K-bit units. The input data control circuit 330 can be constructed in simple fashion as indicated at 330A in FIG. 35 or at 330B in FIG. 36, described later. The increase in number of elements ascribable to the input data control circuit (330A and 330B) is sufficiently small. As a result, the DAC of FIG. 28 is such that the number of elements can be reduced greatly over the arrangement of FIG. 1 and implementation is possible with reduced area.

In a case where the operational amplifier circuit 510 is adapted to output a voltage obtained by internally dividing (interpolating), at the 1:2 ratio, two voltages supplied serially to the terminal T1, the input data control circuit 330 outputs the data of the even- and odd-numbered bit groups as is in K-bit units in accordance with the control signal 2.

On the other hand, in a case where the operational amplifier circuit 510 is adapted to output a voltage obtained by externally dividing (extrapolating), at the 1:2 ratio, two voltages supplied serially to the terminal T1, the input data control circuit 330 inverts the data of either the even-numbered bit group or odd-numbered bit group and outputs data in K-bit units in accordance with the control signal 2.

The reason for constructing the logic circuit 301 from the input data control circuit 330 and the second logic circuit 320 and second switch group 202 of FIG. 1 will be described.

First, the case where the operational amplifier circuit 510 is adapted to output a voltage obtained by internally dividing (interpolating), at the 1:2 ratio, two voltages supplied serially to the terminal T1 will be described. In the description of FIG. 5, it is indicated that in a case where the same reference voltage is selected as the voltages V(T1) and V(T2), an equality relationship exists between each value ($b_X$) of the even-numbered digits in binary notation stipulating V(T1) and each value ($a_X$) of odd-numbered digits stipulating V(T2). That is, in the DAC of FIG. 1, the second logic circuit 320 and the switch group 202 that selectively output a prescribed reference voltage to the terminal T1 based upon the even-numbered bits [B(2K), ..., B4 and B2], and the first logic circuit 310 and switch group 201 that selectively output a prescribed reference voltage to the terminal T2 based upon the odd-numbered bits [B(2K–1), ..., B3 and B1], are identical in terms of operation.

Accordingly, in FIG. 28, even though even-numbered bits [B(2K), ..., B4 and B2] and odd-numbered bits [B(2K–1), ..., B3 and B1] are input from the input data control circuit 330 to the logic circuit 320 in a time serial, respective ones of the correct reference voltages can be selectively output to the terminal T1 as the voltages V(T1) and V(T2). The input order of the even-numbered and odd-numbered bits is interchangeable.

Next, a case where the operational amplifier circuit 510 is adapted to output a voltage obtained by externally dividing (extrapolating), at the 1:2 ratio, two voltages supplied serially to the terminal T1 will be described. In the description of FIG. 6, it is indicated that in a case where the same reference voltage is selected as the voltages V(T1) and V(T2), a complementary (opposing) relationship exists between each value ($b_x$) of the even-numbered digits in binary notation stipulating V(T1) and each value ($a_x$) of odd-numbered digits stipulating V(T2).

That is, in the DAC of FIG. 1, the second logic circuit 320 and the switch group 202 that selectively output a prescribed reference voltage to the terminal T1 based upon the even-numbered bits [B(2K), ..., B4 and B2], and the first logic circuit 310 and switch group 201 that selectively output a prescribed reference voltage to the terminal T2 based upon the odd-numbered bits [B(2K−1), ..., B3 and B1], are complementary in terms of operation. Accordingly, if the even-numbered bits [B(2K), ..., B4 and B2] are input as is to the logic circuit 320 in FIG. 28, the correct reference voltages can be selectively output to the terminal T1.

Further, if the odd-numbered bits [B(2K−1), ..., B3 and B1] are input to the logic circuit 320 upon being inverted, then the correct reference voltages can be selectively output to the terminal T1. Accordingly, the input data control circuit 330 of FIG. 28 is controlled in such a manner that only the bit data of the odd-numbered bits is inverted before being output. If the even-numbered bits [B(2K), ..., B4 and B2] and the inverted odd-numbered bits [B(2K−1), B3 and B1] are input to the logic circuit 320, then respective ones of the correct reference voltages can be selectively output to the terminal T1 as the voltages V(T1) and V(T2). The input order of the even-numbered and odd-numbered bits is interchangeable.

In FIG. 28, the logic circuit 320 and switch group 202 can be formed by the first logic circuit 310 and first switch group 201, respectively, of FIG. 1, and the terminal to which the two reference voltages are input serially can be replaced by the terminal T2. At such time, however, if use is made of the operational amplifier circuit 510 that performs the extrapolation operation, then the input data control circuit 330 is controlled in such a manner that the even-numbered bits are output upon being inverted and the odd-numbered bits are output as is.

Next, reference will be had to FIGS. 29A and 29B to FIGS. 33A and 33B to describe principal examples of structures regarding the operational amplifier circuit 510 ideal for use in the DAC of FIG. 28. In the arrangements set forth in the examples below, selection of reference voltage is performed by odd-numbered bits that follow even-numbered bits.

Figure 29A:
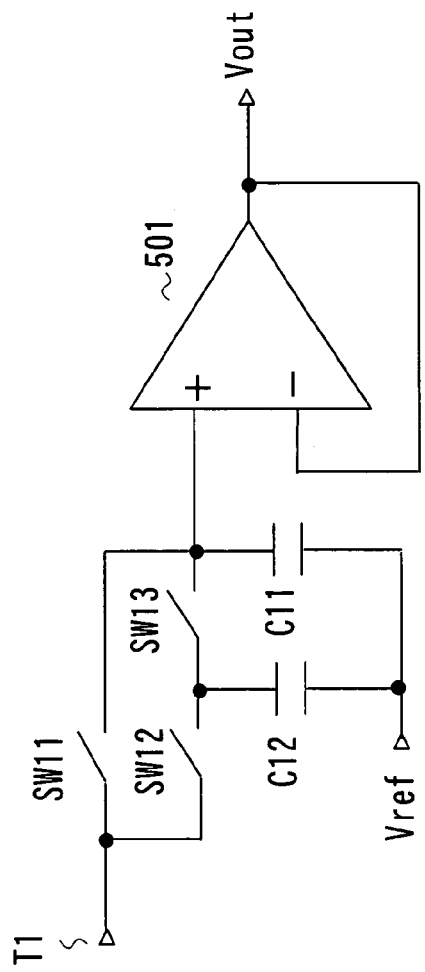
FIG. 29A is a diagram illustrating the structure of an operational amplifier circuit 510, which is included in the DAC of FIG. 28, for outputting a voltage obtained by internally dividing (interpolating), with a 1:2 ratio, two voltages selectively output to terminal T1 in a time serial.
Figure 29B:
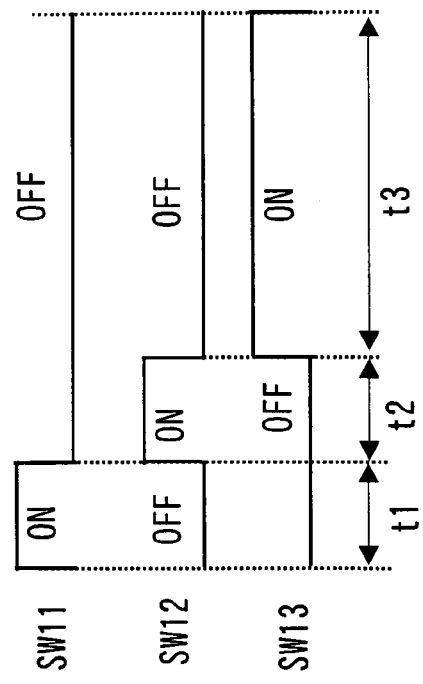
FIG. 29B is a diagram illustrating ON/OFF control of a switch.

FIG. 29A is a diagram illustrating an example of the structure of the operational amplifier circuit 510, which is included in the DAC of FIG. 28, for outputting a voltage obtained by internally dividing (interpolating), with a 1:2 ratio, two voltages selectively output to terminal T1 in a time serial. FIG. 29A is obtained by modifying the operational amplifier circuit of FIG. 11A. FIG. 29A illustrates an arrangement in which the terminal T2 of FIG. 11A is merely connected to the terminal T1. FIG. 29B is a time chart of ON/OFF control of the switches SW11, SW12 and SW13 over one data interval (t1 to t3) in the arrangement of FIG. 29A.

Assume that switch SW11 of FIG. 29A is ON and that switches SW12 and SW13 are OFF over time period t1. At this time the even-numbered bits [B(2K), ..., B4 and B2] are output from the input data control circuit 330 and input to the logic circuit 320 in FIG. 28. A reference voltage (let this be a first selected voltage) selected based upon the even-numbered bit signal is output to the terminal T1, this signal is input to the non-inverting input terminal (+) of the differential amplifier 501, which constitutes a voltage follower, via the closed (ON) switch SW11, and an electric charge is supplied to the capacitor C11, and the potential at the node of connection between the capacitor C11 and the non-inverting input terminal (+) of the differential amplifier 501 is held at the first selected voltage.

Next, in time period t2, switches SW1 and SW13 are turned OFF and switch SW12 is turned ON. At this time the odd-numbered bits [B(2K−1), ..., B3 and B1] are output from the input data control circuit 330 and input to the logic circuit 320 in FIG. 28. A reference voltage (let this be a second selected voltage) selected based upon the odd-numbered bit signal is output to the terminal T1, an electric charge is supplied to the capacitor C12 via the closed (ON) switch SW12, and the potential at the node of connection between the switch SW12 and capacitor C12 is held at the second selected voltage.

Further, the potential at the non-inverting input terminal (+) of the differential amplifier 501 is held at the first selected voltage by the electric charge, which is held in the capacitor C11, even after switch SW11 is turned OFF.

If switches SW11 and SW12 are turned OFF and switch SW13 is turned on in time period t3, the electric charge is redistributed in accordance with the capacitance ratio of capacitor C11 to capacitor C12 in a manner similar to that of FIG. 11. When the capacitance ratio of capacitor C11 to capacitor C12 is 2:1, the terminal voltage at the non-inverting input terminal of differential amplifier 501 becomes a voltage obtained by internally dividing (interpolating) the first and second selected voltages with a 1:2 ratio. This amplified voltage is output to the output terminal as the voltage Vout.

It should be noted that the output voltage Vout is the first selected voltage in time periods t1 and t2, and is a voltage, which is obtained by internally dividing (interpolating) the first and second selected voltages at the 1:2 ratio, in the time period t3.

Further, the first and second selected voltages are equal to V(T1) and V(T2), respectively, in the DAC of FIG. 1, and the DAC of FIG. 28 that employs the arrangement of FIG. 29A is equivalent to the DAC of FIG. 1 that performs the interpolation operation.

FIGS. 29A, 29B illustrate an example in which even- and odd-numbered bits that have been output from the input data control circuit 330 are supplied serially to the logic circuit 320 in sequential fashion in the time periods t1 and t2. However, an arrangement may be adopted in which the order of input of the even- and odd-numbered bits to the logic circuit 320 is interchanged. In such case the order in which the switches SW11 and SW12 are turned ON in the time periods t1, t2 of FIG. 29B would also be interchanged.

Figure 30A:
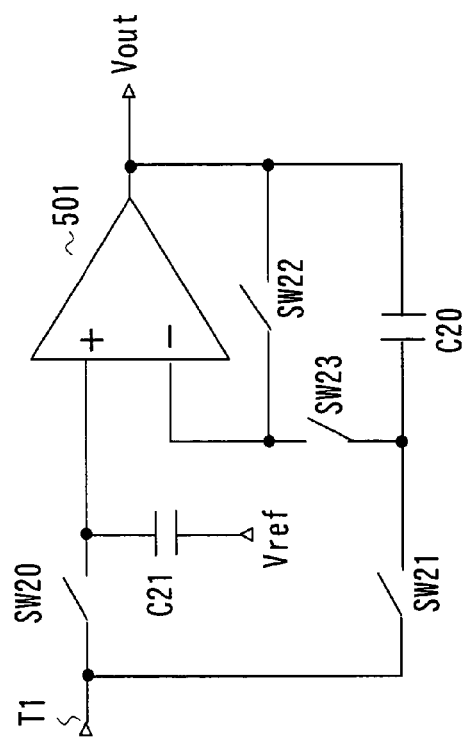
FIG. 30A is a diagram illustrating the structure of an operational amplifier circuit 510, which is included in the DAC of FIG. 28, for outputting a voltage obtained by externally dividing (extrapolating), with a 1:2 ratio, two voltages selectively output to terminal T1 in a time serial.

FIG. 30A is a diagram illustrating an example of the structure of the operational amplifier circuit 510, which is included in the DAC of FIG. 28, for outputting a voltage obtained by externally dividing (extrapolating), with a 1:2 ratio, two voltages selectively output to terminal T1 in a time serial. FIG. 30A is obtained by modifying the operational amplifier circuit of FIG. 12A.

FIG. 30A illustrates an arrangement in which the terminal T2 of FIG. 12A is connected to the terminal T1 and a switch SW20 and capacitor C21 are added on. This arrangement is similar to that of FIG. 12A in other respects.

As shown in FIG. 30A, the switch SW20 is connected between the terminal T1 and the non-inverting input terminal (+) of the differential amplifier 501, and the capacitor C21 is connected between the reference voltage Vref and node of the connection between the non-inverting input terminal (+) of differential amplifier 501 and the switch SW20.

Figure 30B:
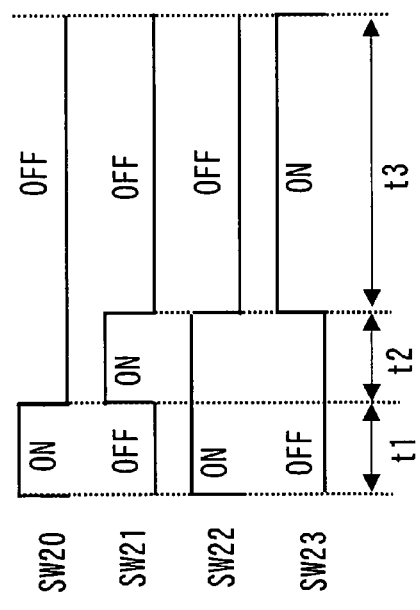
FIG. 30B is a diagram illustrating ON/OFF control of a switch.

FIG. 30B is a time chart of ON/OFF control of the switches SW20, SW21, SW22 and SW23 over one data interval (t1 to t3) in the arrangement of FIG. 30A. In time period t1 in FIG. 30B, switches SW20 and SW22 are turned ON and switches SW21 and SW23 are turned OFF. At this time the even-numbered bits [B(2K), ..., B4 and B2] are output from the input data control circuit 330 and input to the logic circuit 320 in FIG. 28. A reference voltage (let this be a first selected voltage) selected based upon the even-numbered bit signal is output to the terminal T1, this signal is input to the non-inverting input terminal (+) of the differential amplifier 501, which constitutes a voltage follower (switch SW22 is ON), via the switch SW20, an electric charge is supplied to the capacitor C21, and the potential at the node of connection between the capacitor C21 and the non-inverting input terminal (+) of the differential amplifier 501 is held at the first selected voltage. Further, the first selected voltage that has been amplified and output from the differential amplifier 501 is applied upon the capacitor C20 connected to the output terminal.

Next, in time period t2, switches SW20 and SW23 are turned OFF and switches SW21 and SW22 are turned ON. At this time the odd-numbered bits [B(2K−1), . . . , B3 and B1] are output from the input data control circuit 330 and input to the logic circuit 320 in FIG. 28. A reference voltage (let this be a second selected voltage) selected based upon the odd-numbered bit signal is output to the terminal T1, the second selected voltage is applied to the capacitor C20 via the switch SW21, and the potential difference between the first and second selected voltages is held in the capacitor C20. Further, the potential at the non-inverting input terminal (+) of the differential amplifier 501 is held at the first selected voltage by the electric charge, which is held in the capacitor C21, even after switch SW20 is turned OFF.

If switches SW20, SW21 and SW22 are turned OFF and switch SW23 is turned on in time period t3, the output voltage Vout of the differential amplifier 501 becomes a voltage obtained by externally dividing (extrapolating) the first and second selected voltages with a 1:2 ratio in a manner similar to that of FIG. 12.

It should be noted that the output voltage Vout is the first selected voltage in time periods t1 and t2, and is a voltage, which is obtained by externally dividing (extrapolating) the first and second selected voltages at the 1:2 ratio, in the time period t3. Further, the first and second selected voltages are equal to V(T1) and V(T2), respectively, in the DAC of FIG. 1, and the DAC of FIG. 28 that employs the arrangement of FIG. 30A is equivalent to the DAC of FIG. 1 that performs the extrapolation operation.

Figure 31A:
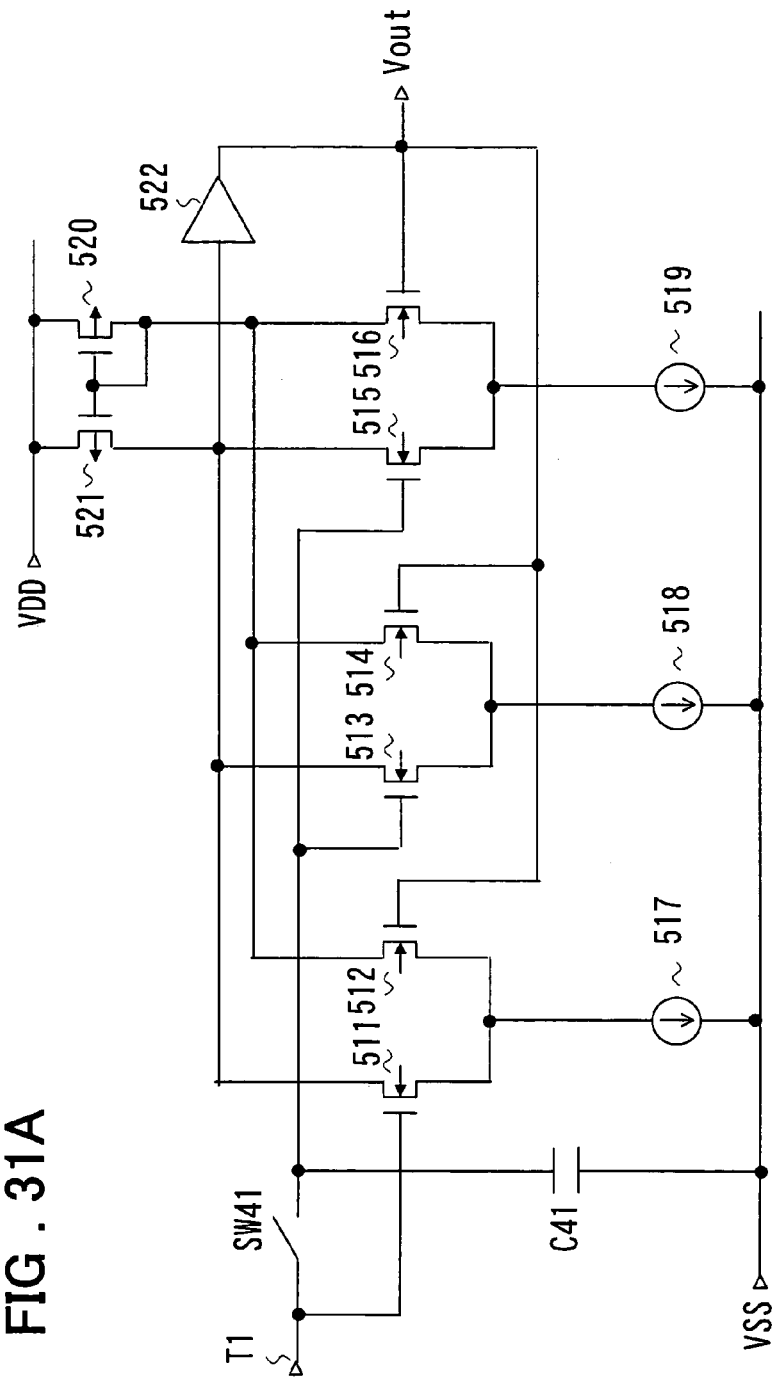
FIG. 31A is a diagram illustrating the structure of the operational amplifier circuit 510, which is included in the DAC of FIG. 28, for outputting a voltage obtained by internally dividing (interpolating), with a 1:2 ratio, two voltages selectively output to terminal T1 in a time serial.

FIG. 31A is a diagram illustrating an example of the structure of the operational amplifier circuit 510, which is included in the DAC of FIG. 28, for outputting a voltage obtained by internally dividing (interpolating), with a 1:2 ratio, two voltages selectively output to terminal T1 in a time serial. FIG. 31A is obtained by modifying the operational amplifier circuit of FIG. 15. FIG. 31A illustrates an arrangement in which the terminal T2 of FIG. 15 is connected to the terminal T1 and a switch SW41 and capacitor C41 are added on. This arrangement is similar to that of FIG. 15 in other respects. As shown in FIG. 31A, the switch SW41 is connected between the terminal T1 and the non-inverting input terminals (the gates of transistors 513 and 515) of differential pair (513, 514) and differential pair (515, 516), and the capacitor C41 is connected between reference voltage VSS and the node of the connection between the same non-inverting input terminals and the switch SW41.

Figure 31B:
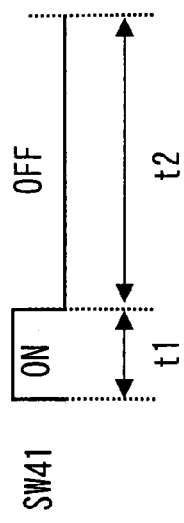
FIG. 31B is a diagram illustrating ON/OFF control of a switch.

FIG. 31B is a time chart of ON/OFF control of the switches SW41 over one data interval (t1 to t2) in the arrangement of FIG. 31A. As shown in FIG. 31B, switch SW41 is turned on in time period t1. At this time the even-numbered bits [B(2K), . . . , B4 and B2] are output from the input data control circuit 330 and input to the logic circuit 320 in FIG. 28. A reference voltage (let this be a first selected voltage) selected based upon the even-numbered bit signal is output to the terminal T1, this signal is input to the non-inverting input terminals (the gates of transistors 511, 513 and 515) of the three differential pairs (511, 512), (513, 514), (515, 516), an electric charge is supplied to the capacitor C41, and the potential at the node of connection between the capacitor C41 and the gates of transistors 513 and 515 is held at the first selected voltage. At this time the arrangement of FIG. 31A becomes a voltage follower and the output voltage Vout becomes the first selected voltage.

Next, in time period t2, switch SW41 is turned OFF. At this time the odd-numbered bits [B(2K−1), . . . , B3 and B1] are output from the input data control circuit 330 and input to the logic circuit 320 in FIG. 28. A reference voltage (let this be a second selected voltage) selected based upon the odd-numbered bit signal is output to the terminal T1, and the second selected voltage is applied to the non-inverting input terminal (transistor 511) of the differential pair 511, 512. Further, the potential at the gates of the transistors 513 and 515 is held at the first selected voltage by the electric charge, which is held in the capacitor C41, even after switch SW41 is turned OFF. Accordingly, the output voltage Vout becomes a voltage obtained by internally dividing (interpolating) the first and second selected voltages with a 1:2 ratio in a manner similar to that of FIG. 15.

It should be noted that the first and second selected voltages are equal to V(T1) and V(T2), respectively, in the DAC of FIG. 1, and the DAC of FIG. 28 that employs the arrangement of FIG. 31A is equivalent to the DAC of FIG. 1 that performs the interpolation operation.

FIGS. 31A, 31B illustrate an example in which even- and odd-numbered bits that have been output from the input data control circuit 330 are supplied serially to the logic circuit 320 in sequential fashion in the time periods t1 and t2. However, in a case where the order of input of the even- and odd-numbered bits to the logic circuit 320 is interchanged, it will suffice to modify the circuitry in such a manner that the switch SW41 and capacitor C41 of FIG. 31A are connected between the terminal T1 and the gate of transistor 511 (this modification is not shown).

Figure 32A:
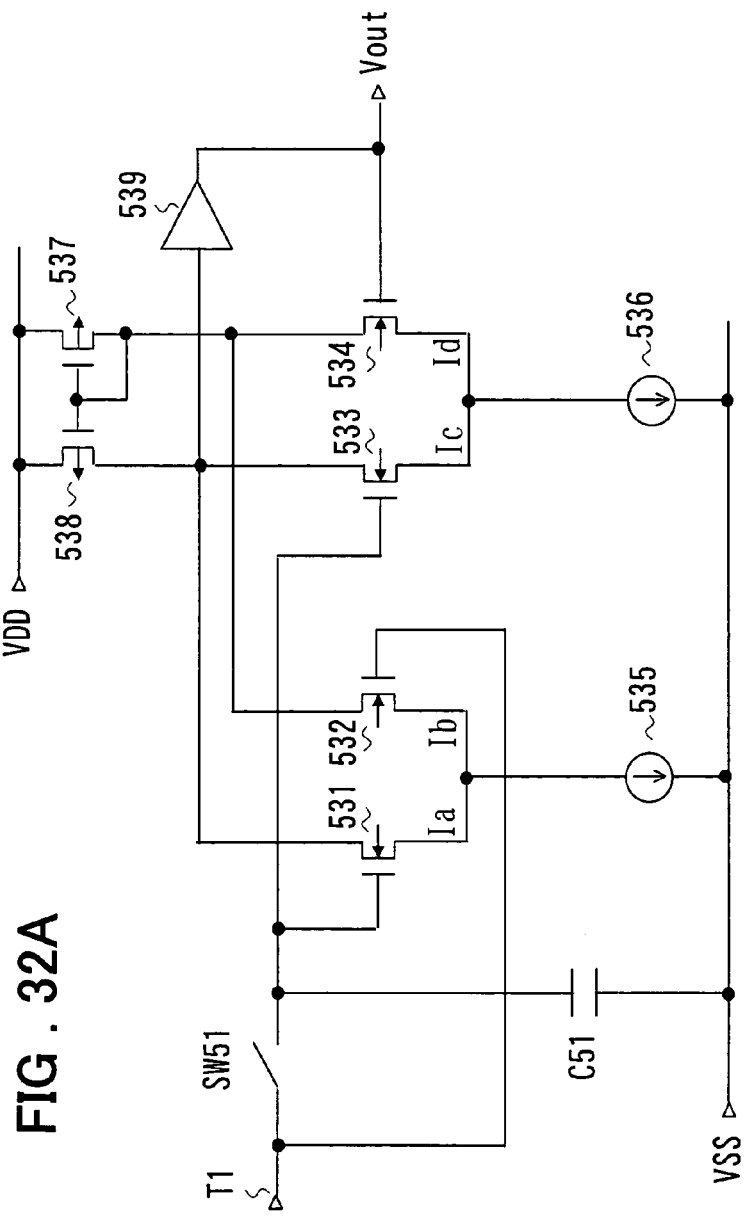
FIG. 32A is a diagram illustrating the structure of an operational amplifier circuit 510, which is included in the DAC of FIG. 28, for outputting a voltage obtained by externally dividing (extrapolating), with a 1:2 ratio, two voltages selectively output to terminal T1 in a time serial.

FIG. 32A is a diagram illustrating an example of the structure of the operational amplifier circuit 510, which is included in the DAC of FIG. 28, for outputting a voltage obtained by externally dividing (extrapolating), with a 1:2 ratio, two voltages selectively output to terminal T1 in a time series. FIG. 32A is obtained by modifying the operational amplifier circuit of FIG. 16. FIG. 32A illustrates an arrangement in which the terminal T2 of FIG. 16 is connected to the terminal T1 and a switch SW51 and capacitor C51 are added on. This arrangement is similar to that of FIG. 16 in other respects. As shown in FIG. 32A, the switch SW51 is connected between the terminal T1 and the non-inverting input terminals (the gates of transistors 531 and 533) of differential pair (531, 532) and differential pair (533, 534), and the capacitor C51 is connected between reference voltage VSS and the node of the same non-inverting input terminals and switch SW51.

Figure 32B:
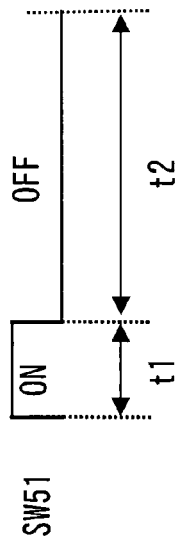
FIG. 32B is a diagram illustrating ON/OFF control of a switch.

FIG. 32B is a time chart of ON/OFF control of the switches SW51 over one data interval (t1 to t2) in the arrangement of FIG. 32A.

As shown in FIG. 32B, switch SW51 is turned on in time period t1. At this time the even-numbered bits [B(2K), . . . , B4 and B2] are output from the input data control circuit 330 and input to the logic circuit 320 in FIG. 28. A reference voltage (let this be a first selected voltage) selected based upon the even-numbered bit signal is output to the terminal T1, this signal is input to both ends of the input pair of the differential pair (531, 532) and to the non-inverting input terminal (the gate of transistor 533) of the differential pair (533, 534), an electric charge is supplied to the capacitor C51, and the potential at the node at which the capacitor C51 and the gates of transistors 531 and 533 are connected is held at the first selected voltage. At this time the arrangement of FIG. 32A becomes a voltage follower and the output voltage Vout becomes the first selected voltage.

Next, in time period t2, switch SW51 is turned OFF. At this time the odd-numbered bits [B(2K−1), . . . , B3 and B1] are output from the input data control circuit 330 and input to the logic circuit 320 in FIG. 28. A reference voltage (let this be a second selected voltage) selected based upon the odd-numbered bit signal is output to the terminal T1, and the second selected voltage is applied to the inverting input terminal (transistor 532) of the differential pair (531, 532). Further, the potential at the gates of transistors 531 and 533 is held at the first selected voltage by the electric charge, which is held in the capacitor C51, even after switch SW51 is turned OFF. Accordingly, the output voltage Vout becomes a voltage obtained by externally dividing (extrapolating) the first and second selected voltages with a 1:2 ratio in a manner similar to that of FIG. 16.

It should be noted that the first and second selected voltages are equal to V(T1) and V(T2), respectively, in the DAC of FIG. 1, and the DAC of FIG. 28 that employs the arrangement of FIG. 32A is equivalent to the DAC of FIG. 1 that performs the extrapolation operation.

FIGS. 32A and 32B illustrate an example in which even- and odd-numbered bits that have been output from the input data control circuit 330 are supplied serially to the logic circuit 320 in sequential fashion in the time periods t1 and t2. However, in a case where the order of input of the even- and odd-numbered bits to the logic circuit 320 is interchanged, it will suffice to modify the circuitry in such a manner that the switch SW51 and capacitor C51 of FIG. 32A are connected between the terminal T1 and the gate of transistor 532 (this modification is not shown).

Figure 33A:
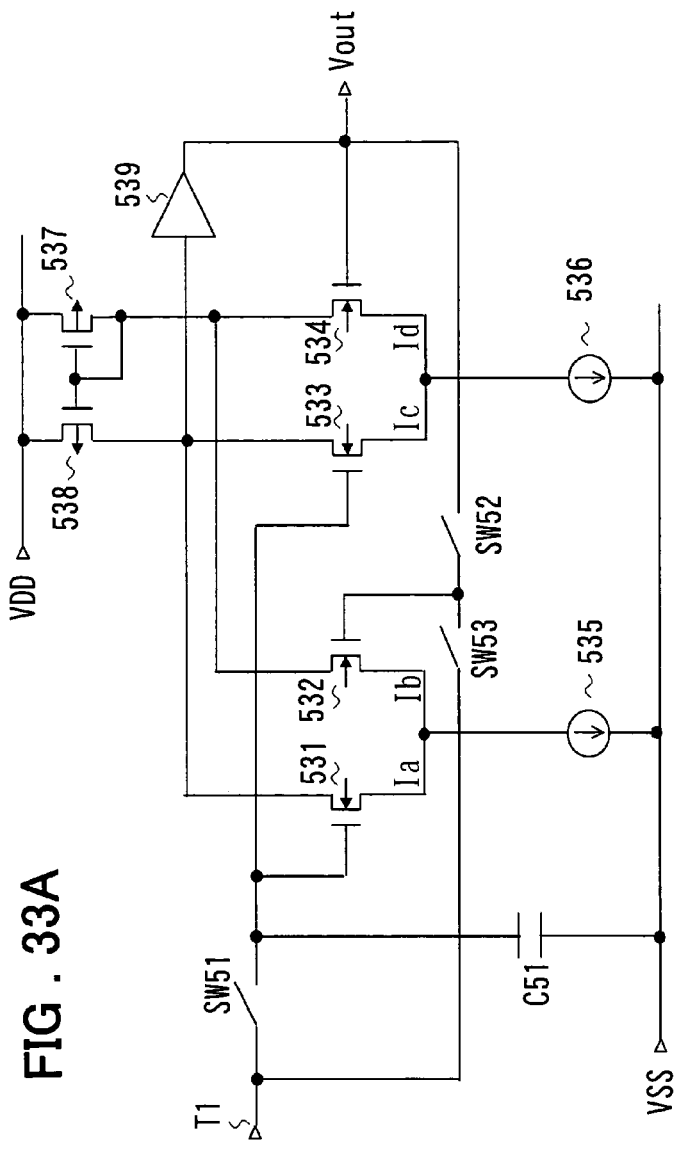
FIGS. 33A and 33B are diagrams illustrating a modification of FIGS. 32A, 32B.
Figure 33B:
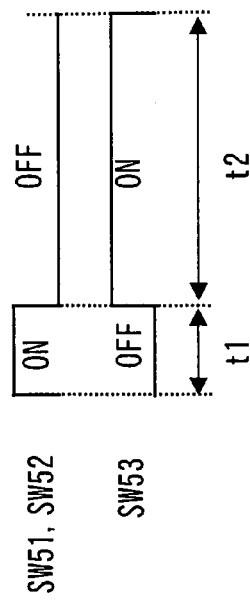

FIGS. 33A and 33B are diagrams illustrating a modification of FIGS. 32A and 32B. In the example shown in FIGS. 32A, 32B, the differential pair 533 and 534 operates as a voltage follower in time period t1 but the differential pair (531, 532) does not. On the other hand, in the example shown in FIGS. 33A and 33B, the two differential pairs (531, 532) and (533, 534) operate as voltage followers in time period t1. As a result, driving performance in time period t1 for outputting the first selected voltage is enhanced.

Figure 34:
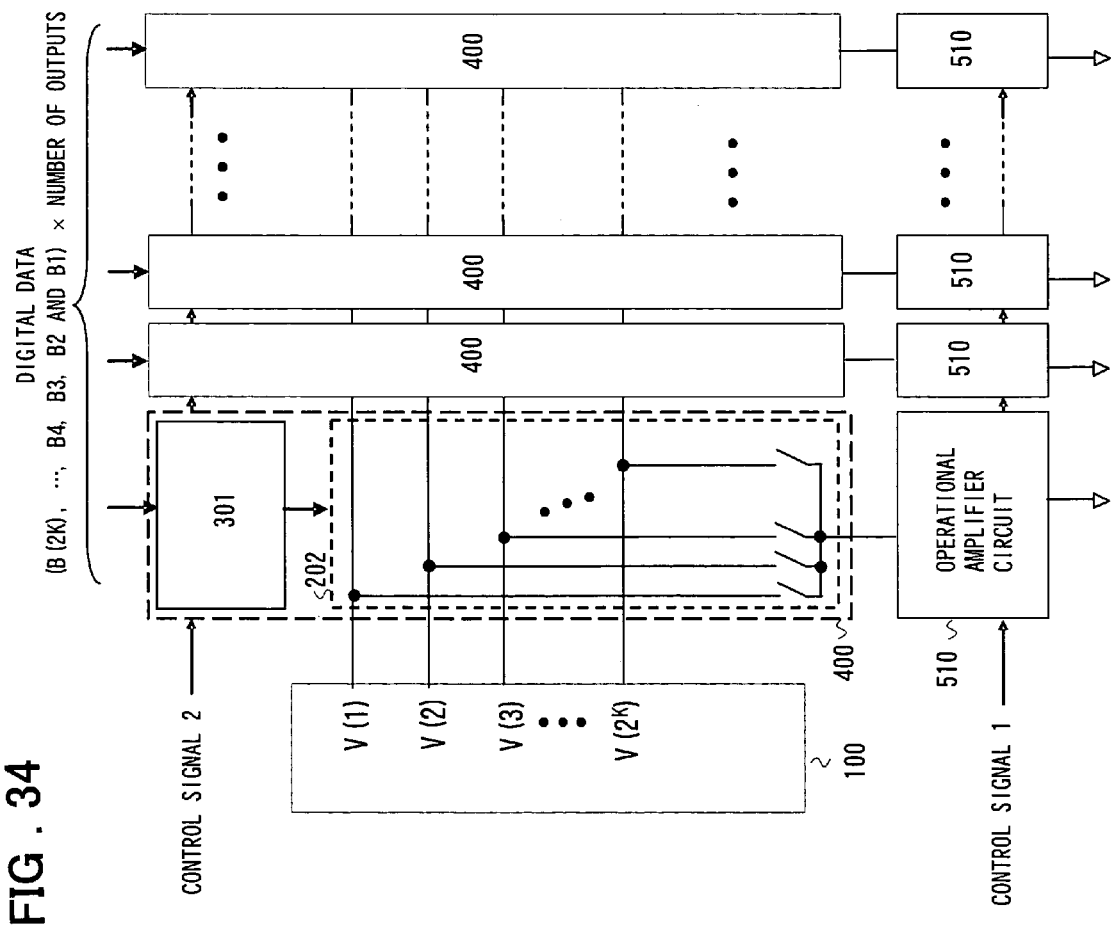
FIG. 34 is a diagram illustrating the structure of a multiple-output DAC according to another embodiment of the present invention.

FIG. 34 illustrates a multiple-output DAC obtained by adopting a multiple-output configuration for FIG. 28. The reference voltages of the reference voltage generating circuit 100 and the control signals 1, 2 are made common to a plurality of operational amplifier circuits 510 and a plurality of decoders 400 each comprising the logic circuit 301 and switch group 202. The decoder 400 delivers its output signal to the operational amplifier circuit 510 (see FIG. 28) from a single output terminal in a time serial.

Figure 35:
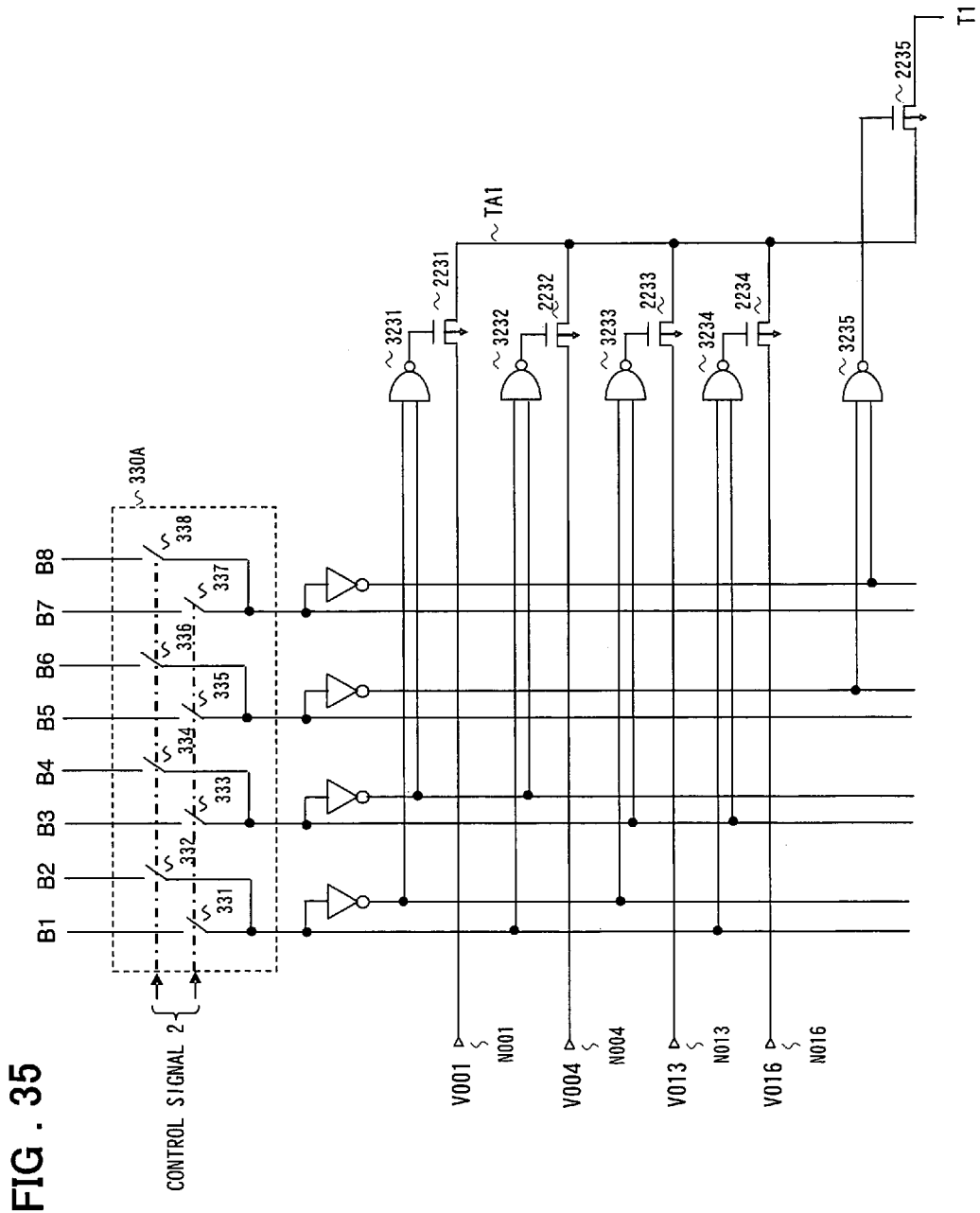
FIG. 35 is a diagram illustrating an example of the arrangement of a switch group and logic circuits for selectively outputting reference voltages V001, V004, V013 and V016, from among 16 reference voltages in FIG. 22, to terminal T1 in a time serial.
Figure 36:
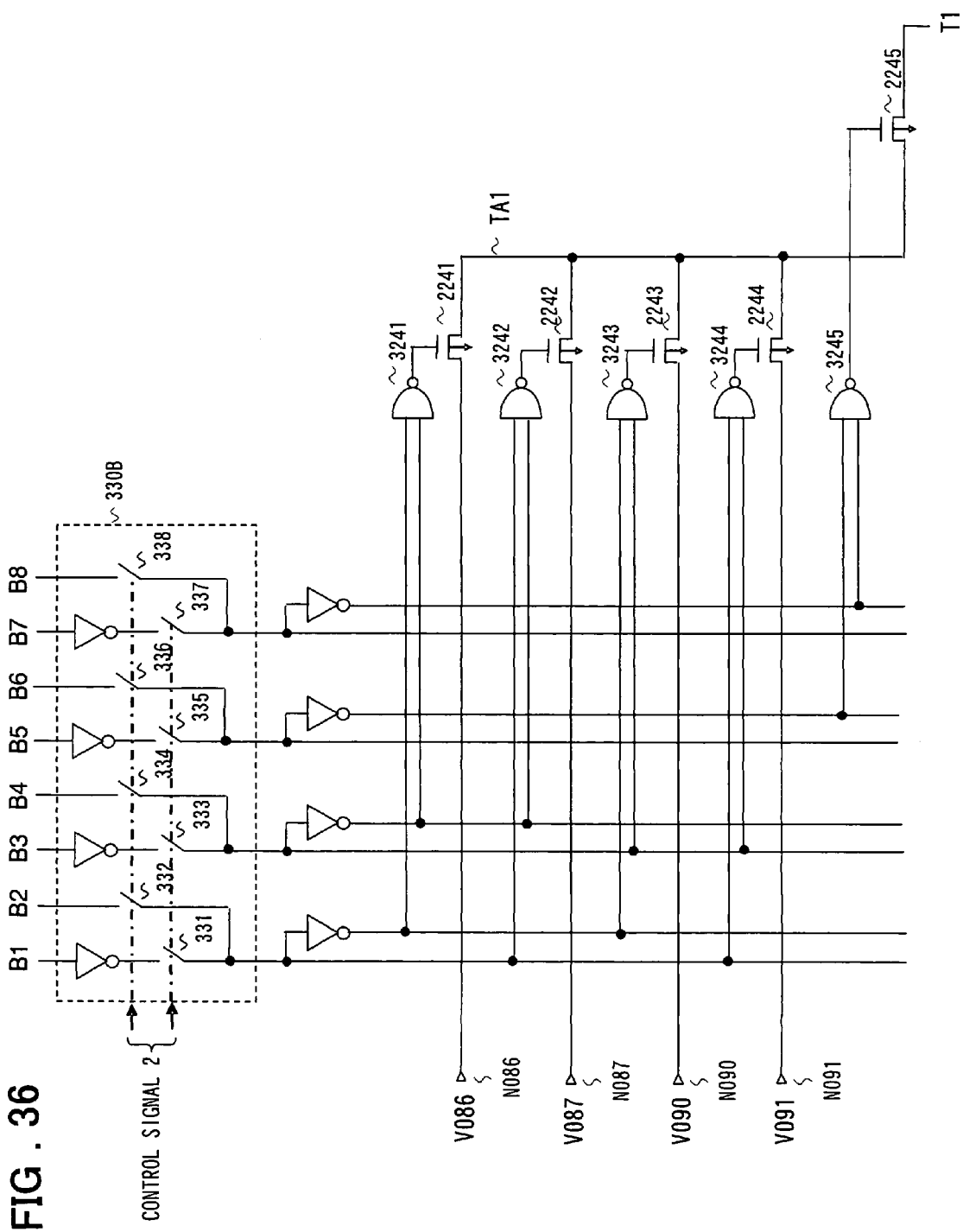
FIG. 36 is a diagram illustrating an example of the arrangement of a switch group and logic circuits for selectively outputting reference voltages V086, V087, V090 and V091, from among 16 reference voltages in FIG. 23, to terminal T1 in a time serial.
Figure 37:
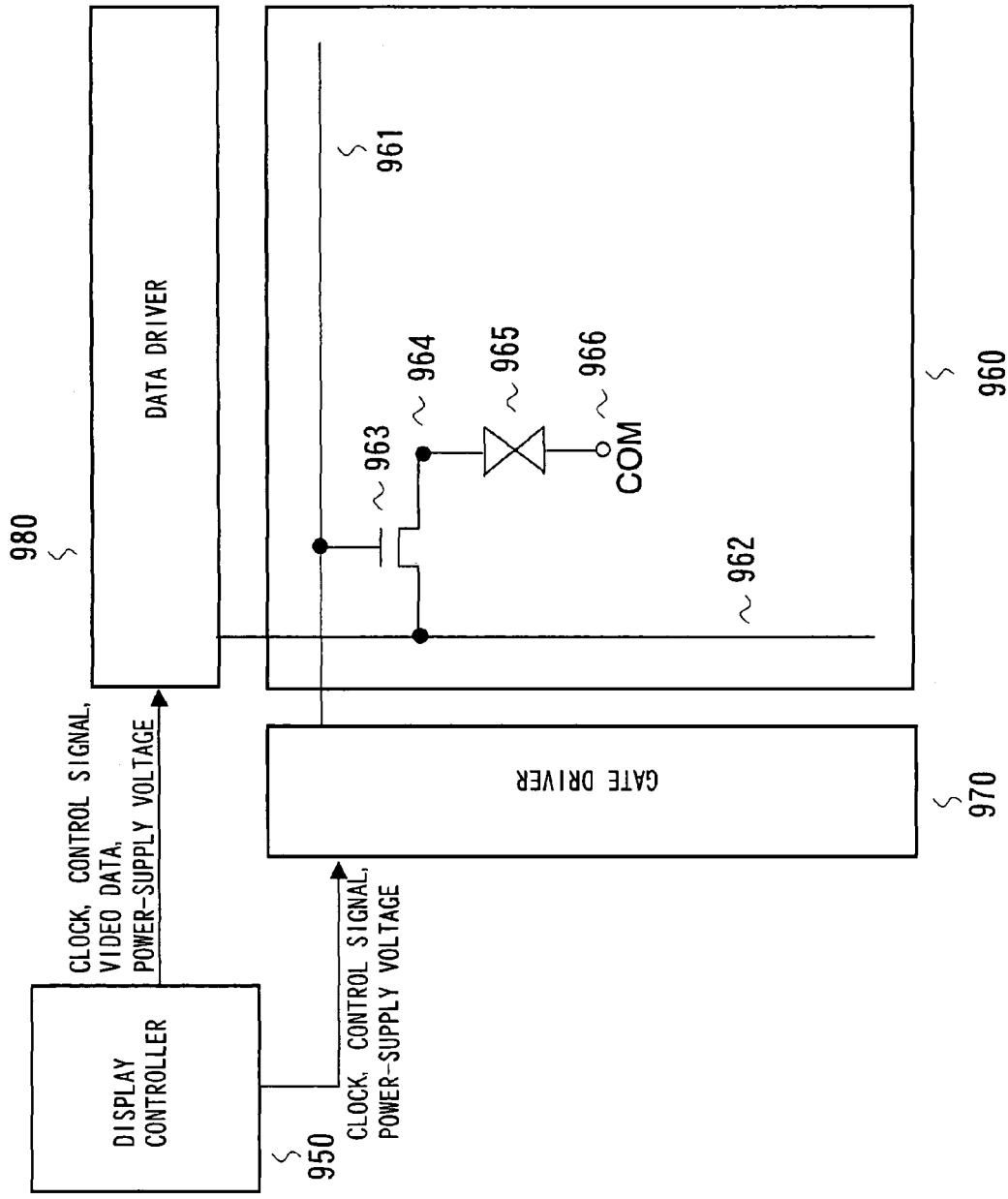
FIG. 37 is a diagram illustrating the typical structure of an active-matrix liquid crystal display device.
Figure 38B:
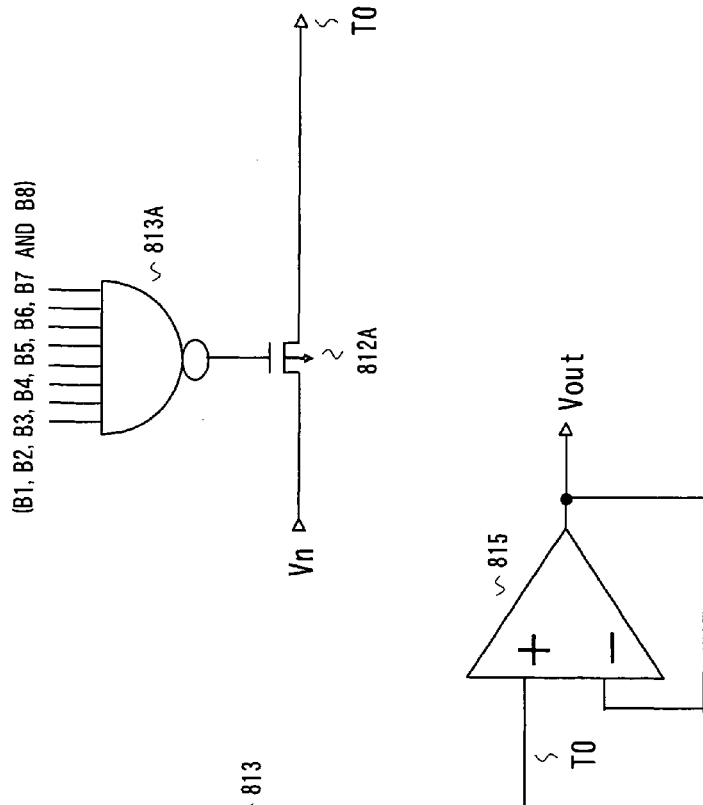
FIGS. 38A and 38B are diagrams illustrating an example of the structure of a conventional DAC used broadly and generally in liquid crystal display devices.
Figure 38A:
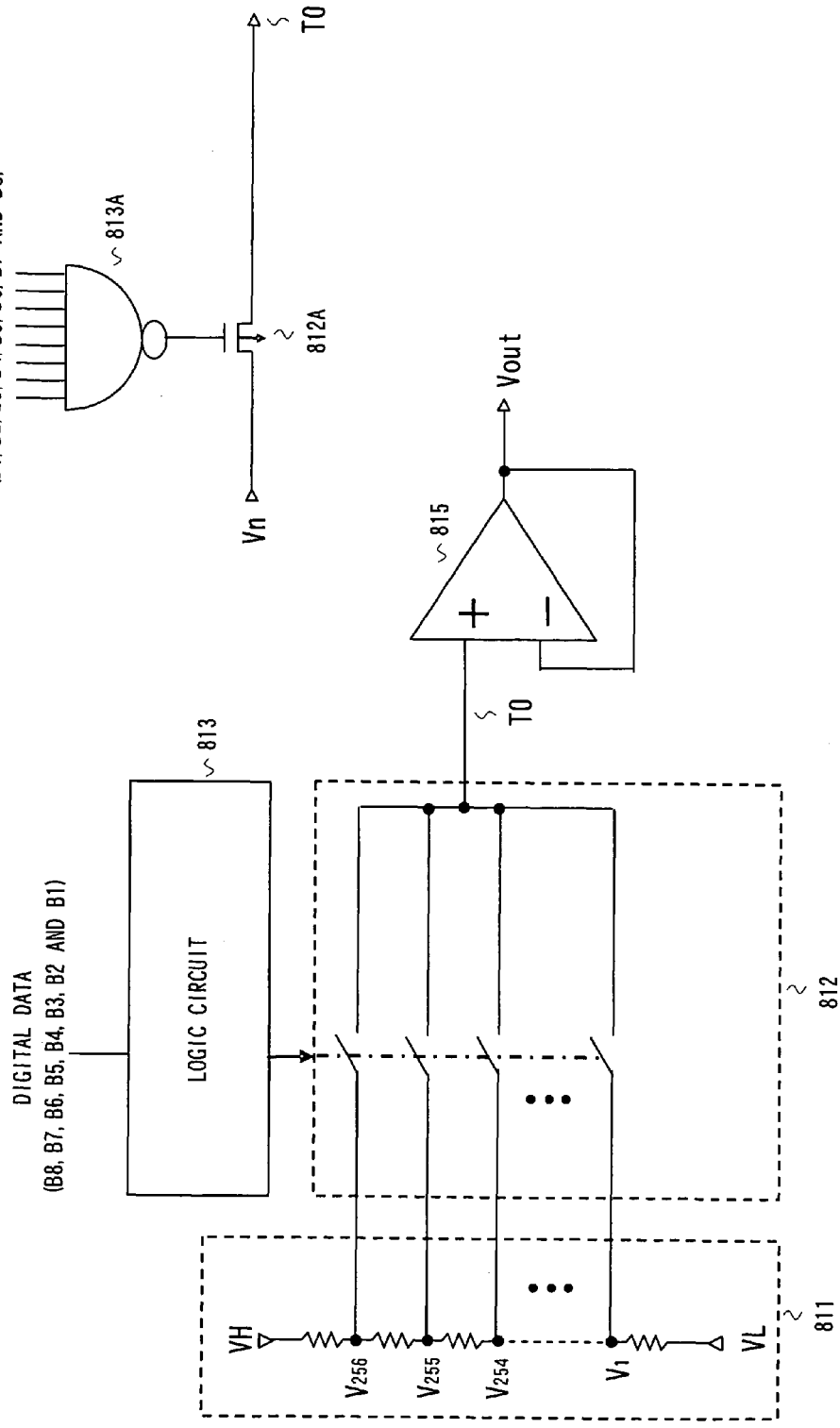

FIGS. 35 and 36 illustrate the results of modifying the arrangements of the switch group and logic circuits, which selectively output the four reference voltages in FIGS. 26 and 27, respectively, to arrangements that are suited to the DAC of FIG. 28.

FIG. 35 illustrates the arrangement of an input data control circuit, switch group and logic circuits for selectively outputting four reference voltages V001, V004, V013 and V016 to the terminal T1 sequentially in accordance with even-numbered bits (B8,B6,B4 and B2) and odd-numbered bits (B7, B5,B3 and B1) that are output from the input data control circuit in a bit serial in the 8-bit DAC that performs the interpolation operation in FIG. 28.

The arrangement shown in FIG. 35 is obtained by removing the terminal T2 and the logic circuits and switch group, which participate in the selection of voltage applied to the terminal T2, from the arrangement of FIG. 26 and adding an input data control circuit 330A (see FIG. 28).

The input data control circuit 330A comprises a plurality of switches. When the input data control circuit 330A outputs the even-numbered bits (B8,B6,B4 and B2) in accordance with the control signal 2, switches 332, 334, 336 and 338 are turned ON and switches 331, 333, 335 and 337 are turned OFF so that these bit signals are output to the logic circuits 3231 to 3235, etc.

On the other hand, when the odd-numbered bits (B7,B5,B3 and B1) are output, the switches 332, 334, 336 and 338 are turned OFF and the switches 331, 333, 335 and 337 are turned ON so that these bit signals are similarly output to the logic circuits 3231 to 3235, etc. As a result, the number of elements that construct the logic circuits and switch group can be halved in comparison with the arrangement of FIG. 26. It should be noted that the structure of the input data control circuit 330A is simple so that the increase in number of elements ascribable to this arrangement is sufficiently small.

FIG. 36 illustrates the arrangement of an input data control circuit, switch group and logic circuits for selectively outputting four reference voltages V086, V087, V090 and V091 to the terminal T1 sequentially in accordance with even-numbered bits (B8,B6,B4 and B2) and odd-numbered bits (B7, B5,B3 and B1) that are output from the input data control circuit in a bit serial in the 8-bit DAC that performs the extrapolation operation in FIG. 28.

The arrangement shown in FIG. 36 is obtained by removing the terminal T2 and the logic circuits and switch group, which participate in the selection of voltage applied to the terminal T2, from the arrangement of FIG. 27 and adding an input data control circuit 330B. The latter is obtained by adding inverters to the input data control circuit 330A. When the input data control circuit 330B outputs the even-numbered bits (B8,B6,B4 and B2) in accordance with the control signal 2, the switches 332, 334, 336 and 338 are turned ON and the switches 331, 333, 335 and 337 are turned OFF so that these bit signals are output to the logic circuits 3241 to 3245, etc. On the other hand, when the odd-numbered bits (B7,B5, B3 and B1) are output, the switches the 332, 334, 336 and 338 are turned OFF and the switches 331, 333, 335 and 337 are turned ON so that these bit signals inverted by the inverters are similarly output to the logic circuits 3231 to 3235, etc. As a result, the number of elements that construct the logic circuits and switch group can be halved in comparison with the arrangement of FIG. 27. It should be noted that the structure of the input data control circuit 330B is simple so that the increase in number of elements ascribable to this arrangement is sufficiently small.

Though the present invention has been described in accordance with the foregoing embodiments, the invention is not limited to this embodiment and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A digital-to-analog converter comprising:
   a reference voltage generating circuit for generating and outputting a plurality of reference voltages having voltage values that differ from one another;
   a first logic circuit for outputting result of a logical operation on a first bit group composed of a plurality of bits comprising either even-numbered bits or odd-numbered bits of an input digital data signal composed of a plurality of bits;
   a second logic circuit for outputting result of a logical operation on a second bit group composed of a plurality of bits comprising the other of the even-numbered bits or odd-numbered bits of the input digital data signal composed of the plurality of bits;
   a switch group circuit for receiving the plurality of reference voltages output from said reference voltage generating circuit and respective outputs from said first and second logic circuits, and from among the plurality of reference voltages received, selecting a first voltage in accordance with an output of said first logic circuits, and selecting a second voltage in accordance with an output of said second logic circuit, said switch group circuit having first and second terminals and supplying the first and second voltages selected to the first and second terminals, respectively;
   an amplifier circuit for receiving the first and second voltages at first and second terminals, respectively and applying a predetermined operation to the first and second received voltages, respectively to output an output voltage that is the result of the operation from an output terminal.

2. The digital-to-analog converter according to claim 1, wherein said switch group circuit includes first and second switches with regard to at least one reference voltage, said first and second switches being connected between a supply terminal of the reference voltage and respective ones of the first and second terminals for being turned on and off by results of logical operations by said first and second logic circuits, respectively.

3. The digital-to-analog converter according to claim 1, wherein the first and second bit groups that are input to said first and second logic circuits, respectively, are each divided into a higher-order bit group and a lower-order bit group; and
   said first and second logic circuits output results of logical operations on each higher-order bit group and on each lower-order bit group.

4. The digital-to-analog converter according to claim 3, wherein with regard to at least one reference voltage, said switch group circuit includes two switches connected in series between a supply terminal of the reference voltage and the first terminal and two switches connected in series between the supply terminal of the reference voltage and the second terminal;
   the two switches between the supply terminal of the reference voltage and the first terminal being turned on and off by result of the logical operation on the higher-order bit group and result of the logical operation on the lower-order bit group, respectively, by said first logic circuit; and
   the two switches between the supply terminal of the reference voltage and the second terminal being turned on and off by result of the logical operation on the higher-order bit group and result of the logical operation on the lower-order bit group, respectively, by said second logic circuit.

5. The digital-to-analog converter according to claim 3, wherein said switch group circuit includes:
   a first switch having one end connected to the first terminal and a second switch having one end connected to the second terminal; and
   with regard to at least one reference voltage, a third switch connected between a supply terminal of the reference voltage and the other end of said first switch and a fourth switch connected between a supply terminal of the reference voltage and the other end of said second switch;
   said first and second switches being turned on and off by results of the logical operations on the higher-order bit group by said first and second logic circuits, respectively; and
   said third and fourth switches being turned on and off by results of the logical operations on the lower-order bit group by said first and second logic circuits, respectively.

6. The digital-to-analog converter according to claim 1, wherein said amplifier circuit outputs from said output terminal a voltage obtained by internally dividing the two voltages at the first and second terminals, with a predetermined internal division ratio.

7. The digital-to-analog converter according to claim 1, wherein said amplifier circuit outputs from said output terminal a voltage obtained by externally dividing the voltages, at the first and second terminals, with a predetermined external division ratio.

8. The digital-to-analog converter according to claim 1, wherein said amplifier circuit includes:
   a plurality of differential pairs in which output pairs are connected in common with a load circuit, said plurality of differential pairs being driven by respective ones of current sources corresponding thereto; and
   an amplifying stage having an input end connected to at least one common node of the load circuit and the output pairs of said plurality of differential pairs, and an output end connected to the output terminal;
   one member of input pairs of a prescribed number of differential pairs of said plurality of differential pairs being connected to the first terminal, and one member of input pairs of the remaining differential pairs being connected to the second terminal; and
   the other member of the input pairs of said plurality of differential pairs being connected in common with the output terminal.

9. A digital-to-analog converter comprising:
   a reference voltage generating circuit for generating and outputting a plurality of reference voltages having voltage values that differ from one another;
   a logic circuit for sequentially outputting a first operational result of a logical operation on a first bit group composed of a plurality of bits comprising either even-numbered bits or odd-numbered bits of an input digital data signal composed of a plurality of bits, and a second operational result of a logical operation on a second bit group composed of a plurality of bits comprising the other of the even-numbered bits or odd-numbered bits;
   a switch group circuit for receiving the plurality of reference voltages output from said reference voltage generating circuit and first and second operational results sequentially output from said logic circuit, and from among the plurality of reference voltages received, selecting a first voltage in accordance with the first operational results, subsequently selecting a second voltage in accordance with the second operational result, said switch group circuit having a single terminal and serially supplying the selected first and second voltages to the single terminal;

an amplifier circuit for serially receiving the first and second voltages at the single terminal, and applying a predetermined operation to the first and second voltages serially received to output an output voltage that is the result of the operation from an output terminal.

10. The digital-to-analog converter according to claim 9, wherein said amplifier circuit outputs, from said output terminal, a voltage obtained by internally dividing the serially received first and second voltages with a predetermined internal division ratio.

11. The digital-to-analog converter according to claim 9, wherein said amplifier circuit outputs, from said output terminal, a voltage obtained by externally dividing the serially received first and second voltages with a predetermined external division ratio.

12. The digital-to-analog converter according to claim 9, further comprising an input data control circuit for exercising control based upon a control signal so as to output the first bit group and then the second bit group of the input digital data signal composed of the plurality of bits;

an output of said input data control circuit being supplied to said logic circuit.

13. The digital-to-analog converter according to claim 12 wherein in a case where said amplifier circuit is adapted to output a voltage obtained by internally dividing the sequentially received first and second voltages, said input data control circuit sequentially outputs bit data of the first and second bit groups in accordance with the control signal; and in a case where said amplifier circuit is adapted to output a voltage obtained by externally dividing the sequentially received first and second voltages, said input data control circuit sequentially outputs bit data of the first and second bit groups in accordance with the control signal upon inverting one of the first and second bit groups.

14. The digital-to-analog converter according to claim 9, wherein said switch group circuit includes:

a first switch having one end connected to the single terminal; and with regard to at least one reference voltage, a second switch connected between a supply terminal of the reference voltage and the other end of said first switch;

said first switch being turned on and off by result of a logical operation on higher-order bit groups of the first and second bit groups by said logic circuit; and said second switch being turned on and off by result of a logical operation on lower-order bit groups of the first and second bit groups by said logic circuit.

15. The digital-to-analog converter according to claim 9, wherein said amplifier circuit includes:

a plurality of differential pairs in which output pairs are connected in common with a load circuit, said plurality of differential pairs being driven by respective ones of current sources corresponding thereto;

an amplifying stage having an input end connected to at least one common node of the load circuit and the output pairs of said plurality of differential pairs, and an output end connected to the output terminal;

a switch having a first end connected to the single terminal; and a capacitor connected between a second end of said switch and a reference voltage terminal;

one member of input pairs of a prescribed number of differential pairs of said plurality of differential pairs being connected to the single terminal, and one member of input pairs of the remaining differential pairs being connected in common with the second end of said switch; and the other member of the input pairs of said plurality of differential pairs being connected in common with the output terminal.

16. The digital-to-analog converter according to claim 1, wherein said switch group circuit includes:

a first switch group circuit comprising a plurality of switches connected between voltage supply terminals of said reference voltage generating circuit that outputs the plurality of reference voltages and the first terminal, said switches being turned on and off based upon an output value from said first logic circuit; and a second switch group circuit comprising a plurality of switches connected between the voltage supply terminals of said reference voltage generating circuit and the second terminal, said switches being turned on and off based upon an output value from said second logic circuit.

17. The digital-to-analog converter according to claim 3, wherein said switch group circuit includes:

a first switch group circuit having at least two switches connected in series between each voltage supply terminal of said reference voltage generating circuit that outputs the plurality of reference voltages and the first terminal, at least one of these switches being controlled based upon an output value of the lower-order bit data of said first logic circuit, and the other of these switches being controlled based upon an output value of the higher-order bit data of said first logic circuit; and a second switch group circuit having at least two switches connected in series between each voltage supply terminal of said reference voltage generating circuit and the second terminal, at least one of these switches being controlled based upon an output value of the lower-order bit data of said second logic circuit, and the other of these switches being controlled based upon an output value of the higher-order bit data of said second logic circuit.

18. A data driver for driving data lines based upon a digital data signal input thereto, said data driver having the digital-to-analog converter set forth in claim 1.

19. A data driver for driving data lines based upon a digital data signal input thereto, said data driver having the digital-to-analog converter set forth in claim 9.

20. A display device comprising:
a data driver, which includes the digital-to-analog converter set forth in claim 1; and
a display panel;
data lines of said display panel being driven based upon an output signal from said data driver.

21. A display device comprising:
a data driver, which includes the digital-to-analog converter set forth in claim 9; and
a display panel;
data lines of said display panel being driven based upon an output signal from said data driver.

* * * * *